US012719474B2

(12) United States Patent
Archambault et al.

(10) Patent No.: US 12,719,474 B2
(45) Date of Patent: Aug. 25, 2026

(54) PIEZOELECTRIC BUTTON SYSTEM

(71) Applicant: Boréas Technologies Inc., Bromont (CA)

(72) Inventors: LouisDavid Archambault, Bromont (CA); Pascal-Frédéric St-Laurent, Bromont (CA); Jean-Martin Duhamel, Bromont (CA); Gabriel Lemieux, Bromont (CA); Mathilde Charmeau, Bromont (CA); Cédric Leclerc, Bromont (CA)

(73) Assignee: Boréas Technologies Inc., Bromont (CA)

( * ) Notice: Subject to any disclaimer, the term of this patent is extended or adjusted under 35 U.S.C. 154(b) by 0 days.

(21) Appl. No.: 18/961,595

(22) Filed: Nov. 27, 2024

(65) Prior Publication Data

US 2025/0211229 A1 Jun. 26, 2025

Related U.S. Application Data

(60) Provisional application No. 63/640,368, filed on Apr. 30, 2024, provisional application No. 63/613,908, filed on Dec. 22, 2023.

(51) Int. Cl.
*H03K 17/96* (2006.01)
*G06F 3/01* (2006.01)
(Continued)

(52) U.S. Cl.
CPC ......... *H03K 17/9643* (2013.01); *G06F 3/016* (2013.01); *H03K 17/005* (2013.01);
(Continued)

(58) Field of Classification Search
CPC .. H03K 17/9643; H03K 17/005; H03K 17/14; H03K 17/18; H03K 17/964;
(Continued)

(56) References Cited

U.S. PATENT DOCUMENTS 8,432,368 B2 * 4/2013 Momeyer ............... G06F 3/038 345/173
10,338,719 B2 * 7/2019 Li .......................... G06F 21/32
(Continued)

FOREIGN PATENT DOCUMENTS

WO 20230115209 A1 6/2023

OTHER PUBLICATIONS

Written Opinion for corresponding application PCT/CA2024/051575 dated Mar. 30, 2025.
(Continued)

*Primary Examiner* — Franklin D Balseca
(74) *Attorney, Agent, or Firm* — Stratford Group Ltd.

(57) ABSTRACT

A push button system for an electronic device, e.g. smart device, comprises a piezoelectric element; a first sensor configured for measuring a first force or strain on one side of the piezoelectric element; and a second sensor for measuring a second force or strain on an opposite side of the piezoelectric element. A button configured to pivot and reciprocate in an outer frame of the electronic device, includes one or more contact points, such as a first pedestal for contacting the piezoelectric element on one side, and/or a second pedestal for contacting the piezoelectric element on an opposite side. By utilizing, e.g. comparing, a first electrical signal generated by the first force or strain and a second electrical signal generated by the second force or strain, a location of the force application by a user on the button can be determined and a corresponding response can be activated.

20 Claims, 33 Drawing Sheets

(51) Int. Cl.
*H03K 17/00* (2006.01)
*H03K 17/14* (2006.01)
*H03K 17/18* (2006.01)

(52) U.S. Cl.
CPC ............. *H03K 17/14* (2013.01); *H03K 17/18* (2013.01); *H03K 2217/96023* (2013.01); *H03K 2217/96066* (2013.01)

(58) Field of Classification Search
CPC .......... H03K 2217/96023; H03K 2217/96066; H03K 2217/96015; G06F 3/016; G06F 3/02; G06F 3/0202; G06F 3/0219
See application file for complete search history.

(56) References Cited

U.S. PATENT DOCUMENTS

| | | | | |
|---|---|---|---|---|
| 2019/0094967 | A1 | 3/2019 | Bisbee et al. | |
| 2022/0365603 | A1* | 11/2022 | Chaput | G06F 1/1626 |

OTHER PUBLICATIONS

International Search report for corresponding application PCT/CA2024/051575 dated Mar. 30, 2025.

* cited by examiner

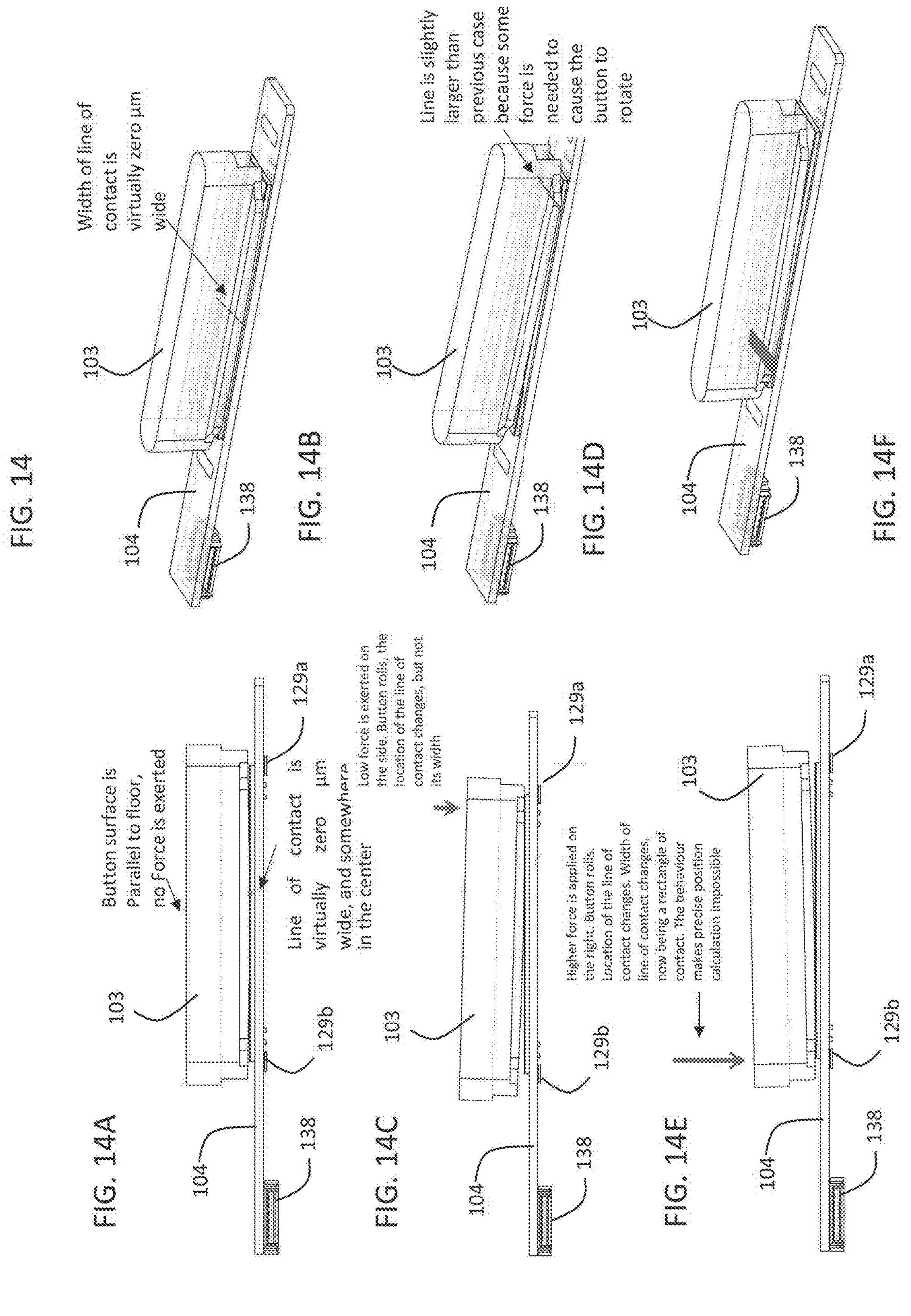
FIG. 14
FIG. 14A
FIG. 14B
FIG. 14C
FIG. 14D
FIG. 14E
FIG. 14F
103
104
138
129a
129b
Button surface is Parallel to floor, no Force is exerted
Line of contact is virtually zero µm wide, and somewhere in the center
Low force is exerted on the side. Button rolls, the location of the line of contact changes, but not its width
Higher force is applied on the right. Button rolls. Location of the line of contact changes. Width of line of contact changes, now being a rectangle of contact. The behaviour makes precise position calculation impossible
Width of line of contact is virtually zero µm wide
Line is slightly larger than previous case because some force is needed to cause the button to rotate

PIEZOELECTRIC BUTTON SYSTEM

TECHNICAL FIELD

The present disclosure relates to a piezoelectric button system, and in particular to a pivoting piezoelectric button system that provides pivoting and reciprocation, e.g. up/down or in/out, with a single button.

BACKGROUND

Mechanical buttons are electrical switches connected to the internal systems of electronic devices, such as smart phones, tablets, laptop computers steering wheels, providing a user interface. Typically, smart phones have between three and four mechanical buttons, such as the power key, the volume up key, the volume down key and a customizable key.

An object of the present disclosure is to provide buttons for electronic devices that replace conventional buttons by covering the same features with less buttons, while providing potentially more features, including haptic responses.

SUMMARY

Accordingly, a first apparatus includes a push button system for an electronic device comprising:

- a piezoelectric assembly comprising: a piezoelectric element configured to produce a haptic response when an electric activation signal is applied thereto; a support substrate configured for supporting the piezoelectric element forming a composite beam, including a transverse central axis, mounted in a cavity in an outer frame of the electronic device; a first sensor configured for measuring a first force or strain on one side of the transverse central axis in response to a force application by a user, and for generating a first electrical response signal in response thereto; and a second sensor for measuring a second force or strain on an opposite side of the transverse central axis in response to the force application, and for generating a second electrical response signal in response thereto;
- a button configured to pivot and reciprocate in an outer frame of the electronic device, the button including a lateral central axis, a first pedestal extending from a lower surface on one side of the lateral central lateral axis for contacting the piezoelectric assembly, and a second pedestal extending from the lower surface on an opposite side of the lateral central lateral axis for contacting the piezoelectric assembly;
- a controller; and
- memory for storing computer software, which when executed by the controller utilizes the first electrical response signal and the second electrical response signal to determine a location of the force application by the user on the button.

In any of the above embodiments the piezoelectric assembly may further comprise a flexible printed circuit board mounted on the support substrate configured for transmitting electrical signals between the controller and the first and second sensors.

In any of the above embodiments the support substrate may comprise a printed circuit board further configured for transmitting electrical signals between the controller and the first sensor and the second sensor.

In any of the above embodiments a hard stop may be mounted in the cavity below the piezoelectric assembly with a gap therebetween configured for contacting the piezoelectric assembly when the piezoelectric assembly bends beyond the gap.

In any of the above embodiments when the first force or strain is greater than the second force or strain, the controller may be configured to determine that the location of the force application is at an end of the button closest to the first sensor.

In any of the above embodiments, when the first force or strain is substantially equal to the second force or strain, the controller may be configured to determine that the location of the force application was at a middle of the button.

In any of the above embodiments, when the first sensor measures a first force or strain that decreases over time, while the second sensor measures a second force or strain that increases over the same time, the controller may be configured to determine that a swipe motion has been initiated.

In any of the above embodiments in response to the swipe motion the controller may be configured to generate a predetermined response selected from a haptic response, an up or down, and a scrolling.

In any of the above embodiments when the electronic device is powered down, the controller may be configured to deactivate the first sensor and the second sensor, and wherein when a small force is detected on the piezoelectric assembly the controller is configured to activate the first sensor and the second sensor.

In any of the above embodiments the first pedestal and the second pedestal may be positioned at opposite ends of the piezoelectric assembly.

In any of the above embodiments, a mount for supporting the piezoelectric assembly may be provided in the electronic device proximate a middle of the piezoelectric assembly configured for cantilevering the piezoelectric assembly at the opposite ends thereof.

In any of the above embodiments the opening may comprise two holes extending through the outer frame into the cavity for receiving the first pedestal and the second pedestals, and a recessed section for receiving a body of the button with a gap between the button and a bottom of the recessed section.

In any of the above embodiments the piezoelectric element may comprise a first piezoelectric section on one side of the mount; a second piezoelectric section on an opposite side of the mount separate from the first piezoelectric section; and a central bracket supported over the mount with the first piezoelectric section and the second piezoelectric extending therefrom.

In any of the above embodiments a preload force applicator may be provided comprising a resilient element extending between a first support on the electronic device, and a second support on the button, the preload force applicator configured to bias the button into contact with the piezoelectric assembly.

In any of the above embodiments the piezoelectric element may comprise a multi-layer stack, comprising:

- a sensing piezoelectric-material layer configured as the first sensor for generating the first electric response signal and as the second sensor for generating the second electrical response signal and for not receiving the electric activation signal;
- one or more haptic piezoelectric-material layers configured for receiving the electric activation signal;
- a first contact mounted on one side of the sensing piezoelectric-material layer configured for transmitting the first electrical response signal; and a second contact mounted on an opposite side of the sensing piezoelectric-material layer configured for transmitting the second electrical response signal.

In any of the above embodiments the first pedestal and the second pedestal may be positioned beyond the ends of the piezoelectric element between the respective end of the piezoelectric element and the respective first and second sensor.

In any of the above embodiments the first and second pedestals may be positioned substantially half-way between the central lateral axis and the respective opposite ends of the piezoelectric element.

In any of the above embodiments, clamps for clamping ends of the piezoelectric assembly may be configured to frictionally fit into recesses formed in the outer frame of the electronic device.

In another example apparatus a push button system for an electronic device comprises:

a piezoelectric assembly comprising: a piezoelectric element configured to produce a haptic response when an electric haptic activation signal is applied thereto; a support substrate configured for supporting the piezoelectric element forming a composite beam, including a transverse central axis, mounted in a cavity in an outer frame of the electronic device; a first sensor configured for measuring a first force or strain on one side of the transverse central axis in response to a force application by a user, and for generating a first electrical response signal in response thereto; and a second sensor for measuring a second force or strain on an opposite side of the transverse central axis in response to the force application, and for generating a second electrical response signal in response thereto;

a button configured to pivot and reciprocate in the outer frame of the electronic device, wherein a lower surface of the button is arcuate for contacting the piezoelectric element along a line of contact;

a controller; and memory for storing computer software, which when executed by the controller utilizes the first electrical response signal and the second electrical response signal to determine a location of the force application by the user on the button.

In any of the above embodiments the arcuate lower surface of the button has a radius of curvature of between 200 mm and 500 mm.

BRIEF DESCRIPTION OF THE DRAWINGS

Some example embodiments will be described in greater detail with reference to the accompanying drawings, wherein:

FIG. 14A is a side view of the push button of FIGS. 13A and 13B in a rest position;

FIG. 14B is an isometric view of the push button of FIGS. 13A and 13B in the rest position;

FIG. 14C is a side view of the push button of FIGS. 13A and 13B in a partial contact position;

FIG. 14D is an isometric view of the push button of FIGS. 13A and 13B in the partial contact position;

FIG. 14E is a side view of the push button of FIGS. 13A and 13B in a full contact position;

FIG. 14F is an isometric view of the push button of FIGS. 13A and 13B in the full contact position;

DETAILED DESCRIPTION

Figure 1A:
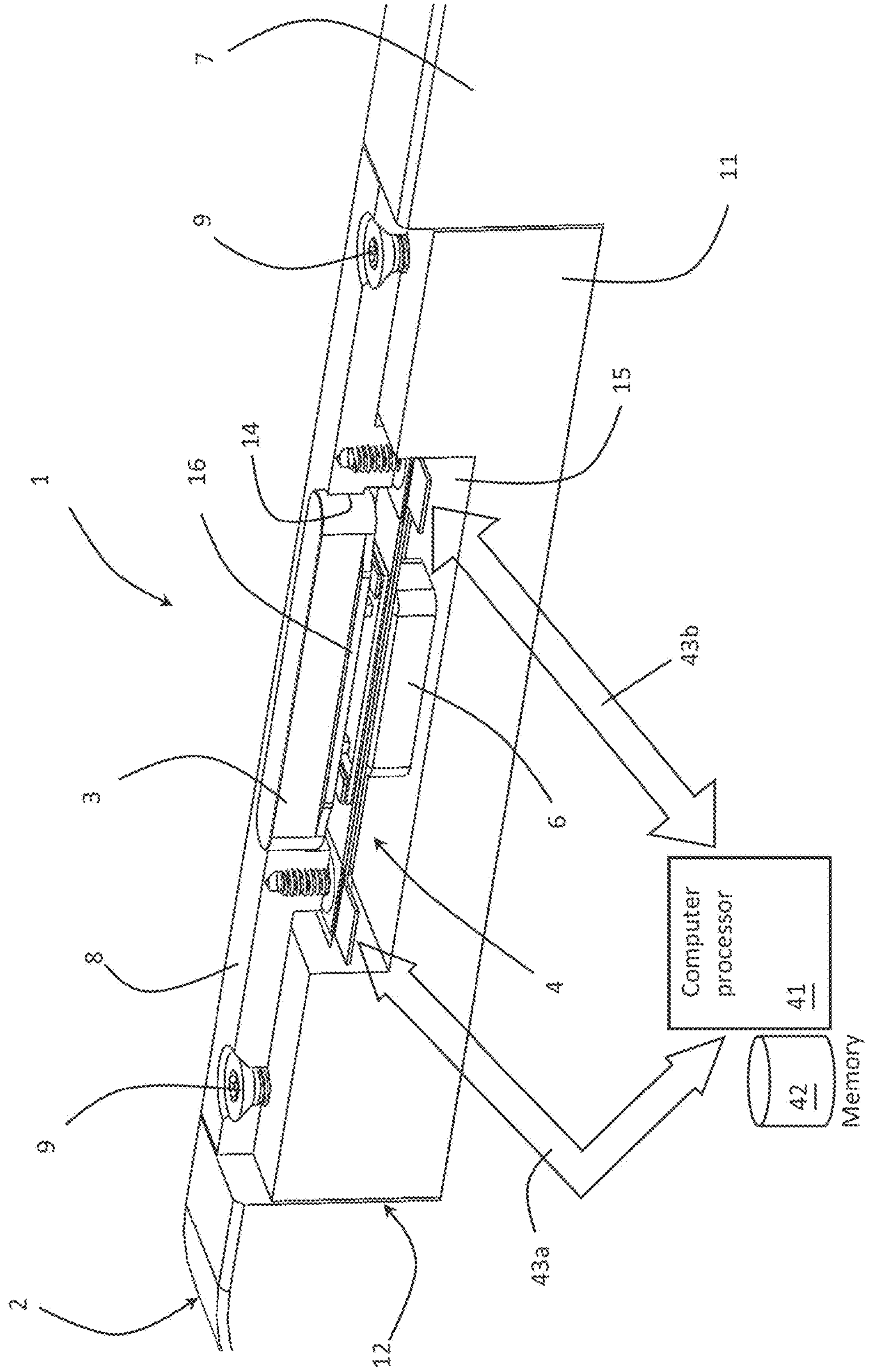
FIG. 1A is a partially sectioned isometric view in accordance with an example of a push button system of the present disclosure.
Figure 1B:
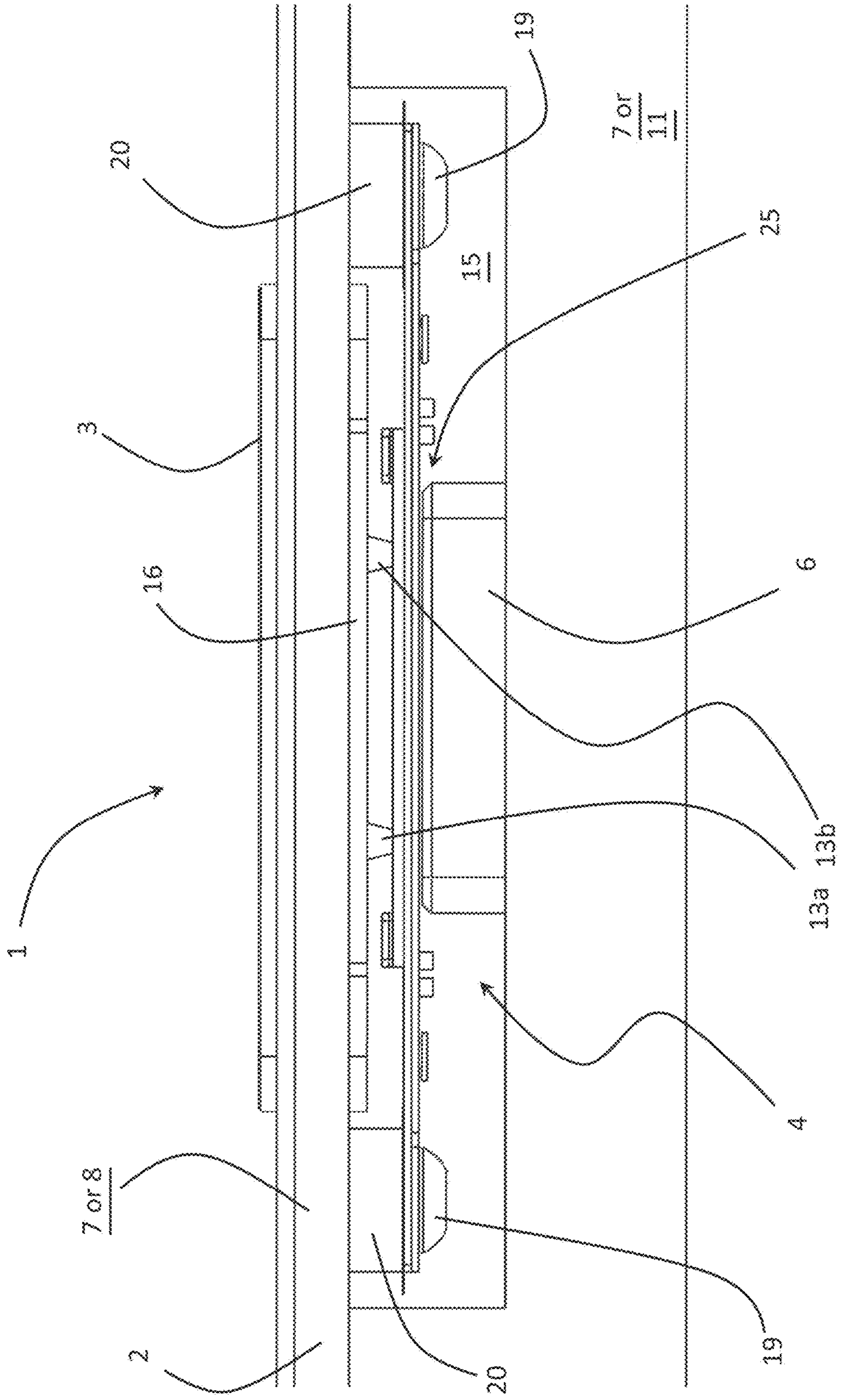
FIG. 1B is a cross-sectional view of the push button system of FIG. 1A.
Figure 2:
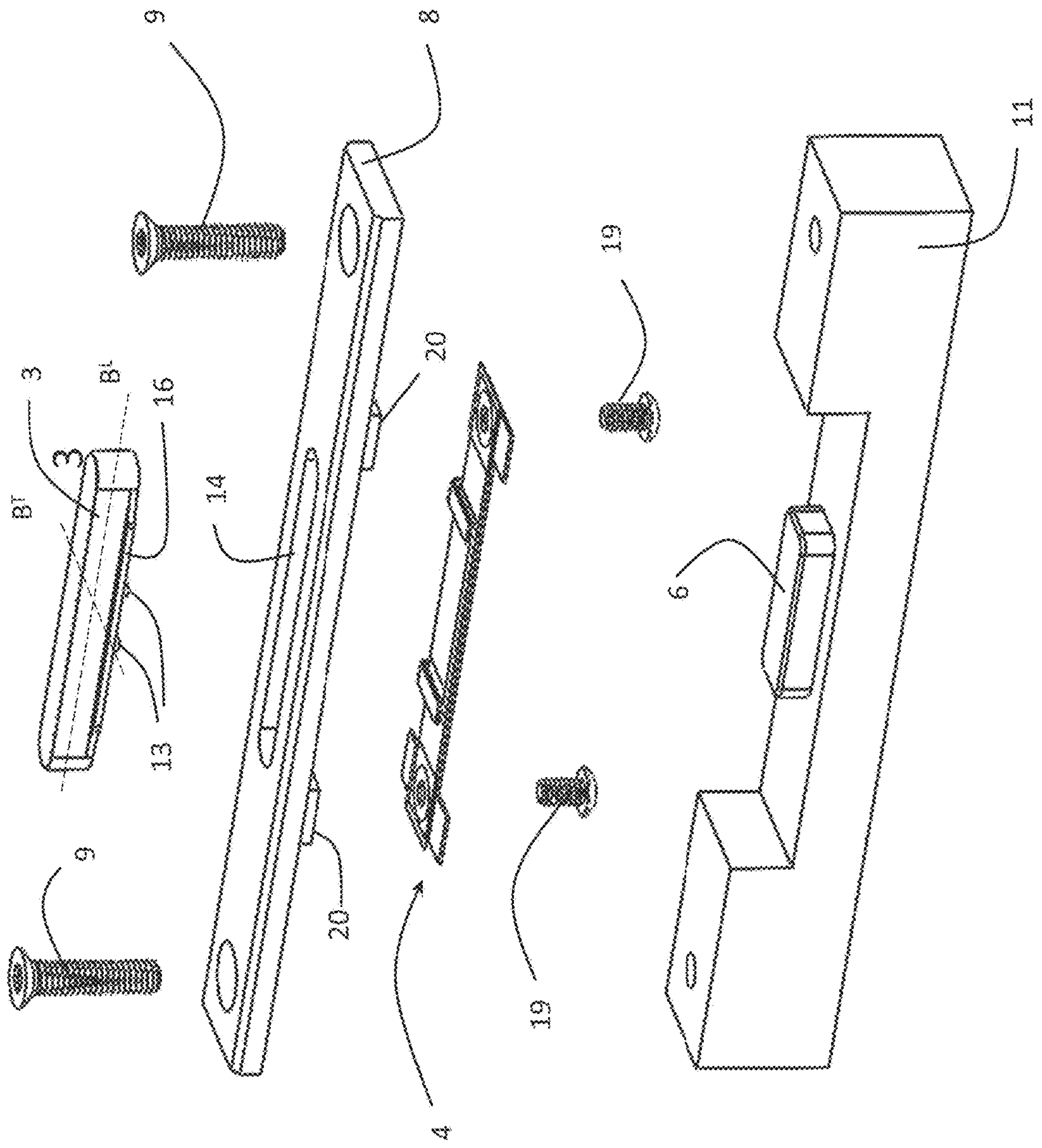
FIG. 2 is an exploded view of the push button system of FIG. 1A.

While the present teachings are described in conjunction with various embodiments and examples, it is not intended that the present teachings be limited to such embodiments. On the contrary, the present teachings encompass various alternatives and equivalents, as will be appreciated by those of skill in the art.

With reference to FIGS. 1 to 3B, a push button system 1 for an electronic device 2, such as a smart phone or tablet, or any electronic device providing input and a haptic response, which includes a pivoting button 3 configured to tilt clockwise when a user applies a force, e.g. with a finger, to one end thereof, tilt counterclockwise when a user applies force to an opposite end thereof, as well as reciprocate when a user's applies force in the middle thereof. The push button system 1 also includes a piezoelectric assembly 4 and a hard stop 6 configured for limiting the maximal stroke of the button 3, therefore preventing damage to the components.

In an exemplary embodiment, the button 3 is pivotally mounted in the outer frame 7 of the electronic device 2 using a faceplate 8. The faceplate 8 can be connected to the outer frame 7 using mechanical fasteners 9, e.g. threaded fastener, or some other attachment means, such as adhesive. Alternatively, the faceplate 8 may be mounted on a base 11 (FIG. 2), which is mounted in a recess 12 in the outer frame 7. Alternatively, the button 3 can be mounted within the outer frame 7 of the electronic device 2, thereby eliminating the need for the faceplate 8 and/or the base 11.

The hard stop 6 is mounted on the base 11 or on the outer frame 7. The button 3 includes a first pedestal 13*a* and a second pedestal 13*b* extending outwardly from a bottom surface thereof spaced apart along a longitudinal central axis $B_L$ thereof, and preferably space equidistant on either side of a lateral or transverse central axis $B_T$, configured for contacting the piezoelectric assembly 4. The lateral or transverse central axis Br could also be known as the pivoting axis, about which the button 3 substantially pivots, e.g. up to 10 μm. The button 3 extends through an opening 14 in the faceplate 8 (or the outer frame 7), into a cavity 15 in the outer frame 7 and into contact with the piezoelectric assembly 4 at two contact points defined by the first and second pedestals 13*a* and 13*b*. In some embodiments, the button 3 is loosely held in the opening 14, i.e. able to rotate and reciprocate, e.g. up and down or in and out of the faceplate 8 and/or outer frame 7, but prevented from falling out, using flanges 16 extending outwardly from along each side thereof. The flanges 16 extend wider than the width of the opening 14 and therefore abut against the inner surface of the faceplate 8 (or outer frame 7).

The piezoelectric assembly 4 may be fastened at opposite ends thereof to the inner surface of the faceplate 8 (or the outer frame 7) using mechanical fasteners 19, e.g. threaded fasteners, or by some other suitable means, e.g. adhesive. The piezoelectric assembly 4 is suspended by each end thereof in the cavity 15 enabling a slight deflection thereof, with a maximum deflection in the middle, as per standard composite beam deflection equations. Raised pedestals 20 extending into the cavity 15 configured to receive the mechanical fasteners 19 may be provided for positioning the piezoelectric assembly 4 in the cavity 15 between the button 3 and the hard stop 6. The piezoelectric assembly 4 is suspended above the hard stop 6 with a gap 25 therebetween, e.g. 50 μm to 500 μm, preferably 100 μm to 300 μm, to prevent the piezoelectric assembly 4 from deforming beyond a safe limit, i.e. before damaging the piezoelectric assembly 4. If, for example, a user drops the device 2 and all of the force goes through the button 3, once the piezoelectric assembly 4 bends beyond the distance of the gap, the piezoelectric assembly 4 then contacts the hard stop 6, whereby any force increase will not result in a strain increase, thereby protecting the piezoelectric assembly 4 from damage. The gap 25 is determined by how much the piezoelectric element can be deformed. The maximum deformation is the result of the machining tolerances+the gap. Accordingly, the gap 25 is sized and configured to: 1) allow haptics, i.e. too small of a gap 25 will hinder haptics, and 2) prevent damage to the piezoelectric assembly 4, i.e. too big of a gap 25 will allow damage to occur.

Alternate embodiments for connecting the ends of the piezoelectric assembly 4 to the faceplate 8 (or the outer frame 7), instead of mechanical fasteners 19, which may generate more displacement, include: squeezing the piezoelectric assembly 4 between jaws, e.g. knife edges, clamping between two jaws, e.g. knife edges, with a thin layer of rubber to allow for even more compliance. Accordingly, the piezoelectric assembly 4 may change length, but have restricted motion in all the other axes.

Figure 3A:
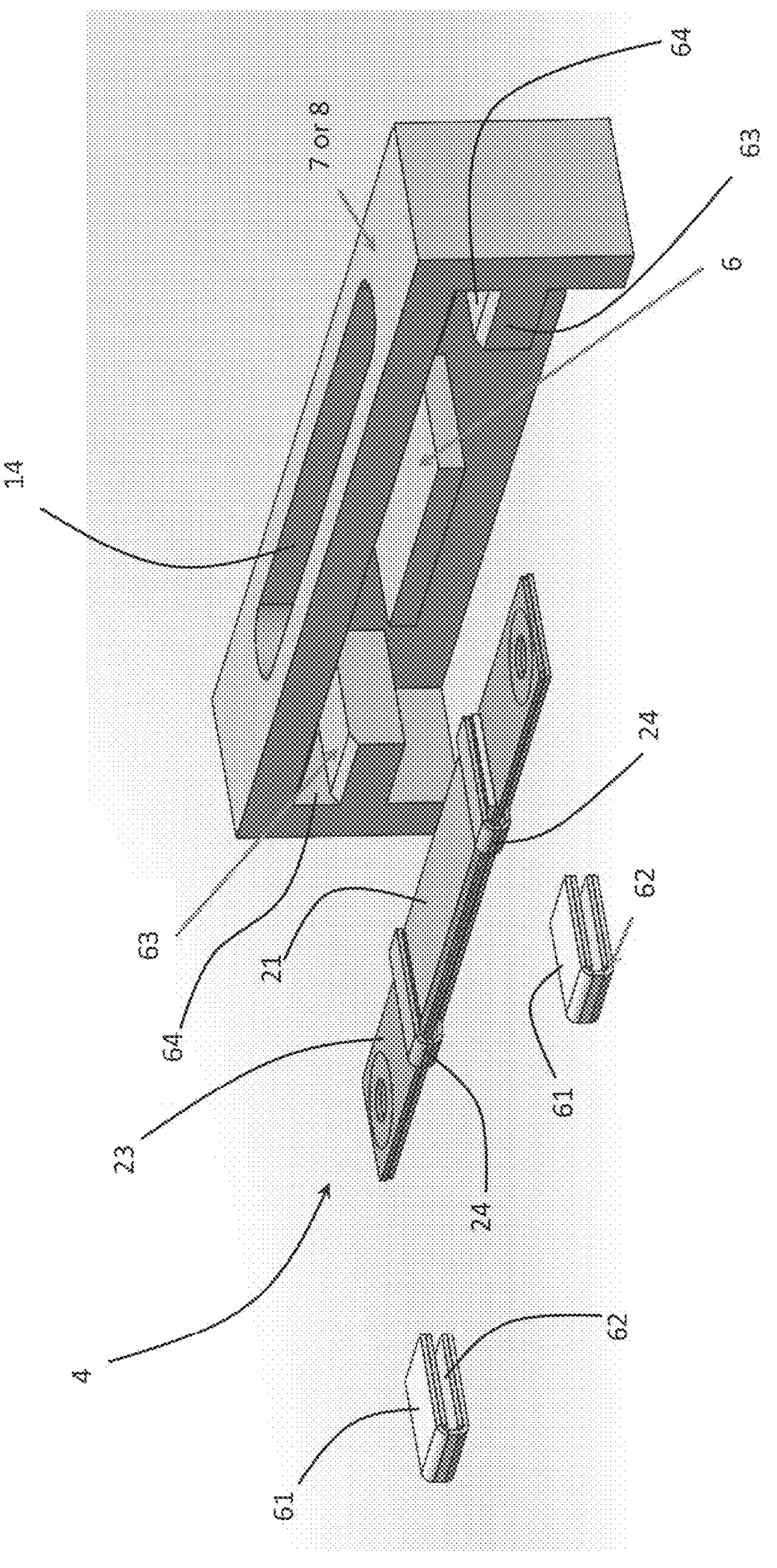
FIG. 3A is an exploded view of an alternative embodiment of a push button system.
Figure 3B:
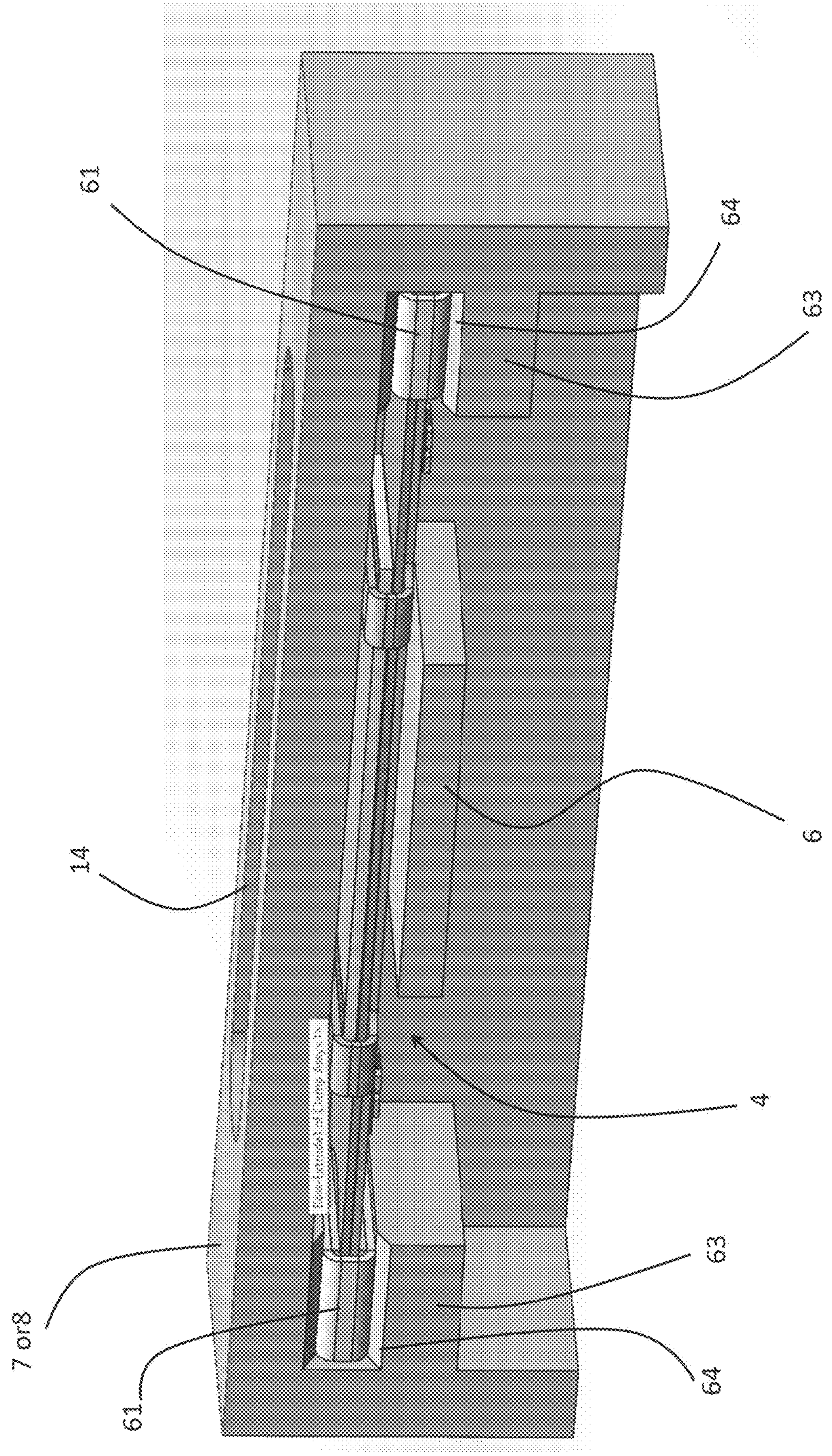
FIG. 3B is an isometric view of the push button system of FIG. 3A.

With reference to FIGS. 3A and 3B, another exemplary embodiment includes an alternative means of attaching the piezoelectric assembly 4 to the faceplate 8 (or the outer frame 7), which utilizes a pair of clamps 61, e.g. resilient C-shaped clamps, one on each end of the piezoelectric assembly 4. The clamps 61 are configured to clamp or squeeze the ends of the piezoelectric assembly 4 between resilient arms thereof. A layer of resilient material 62, e.g. rubber, may be provided between the clamps 61 and the piezoelectric assembly 4, to provide added resilience to the connection. Brackets 63 may be provided on the faceplate 8 or the outer frame 7, which extend parallel to the outer wall of the faceplate 8 and/or the outer frame 7. The brackets 63 form a recess 64 in the outer frame 7 into which the clamps 61 with the ends of the piezoelectric assembly 4 are frictionally fit for securing ends of the piezoelectric assembly 4 in place.

Figure 4:
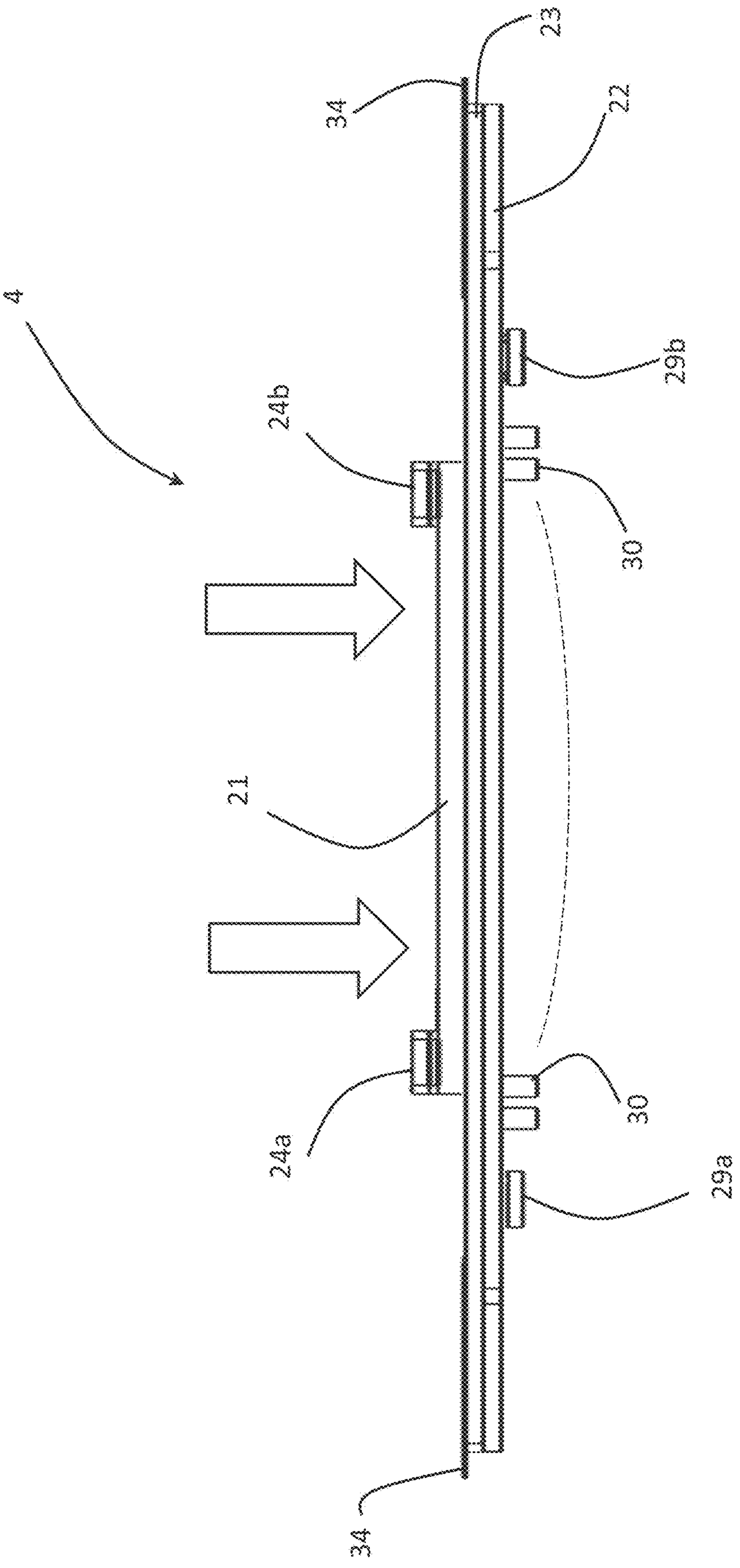
FIG. 4 is a side view of a piezoelectric assembly of FIG. 1.
Figure 5:
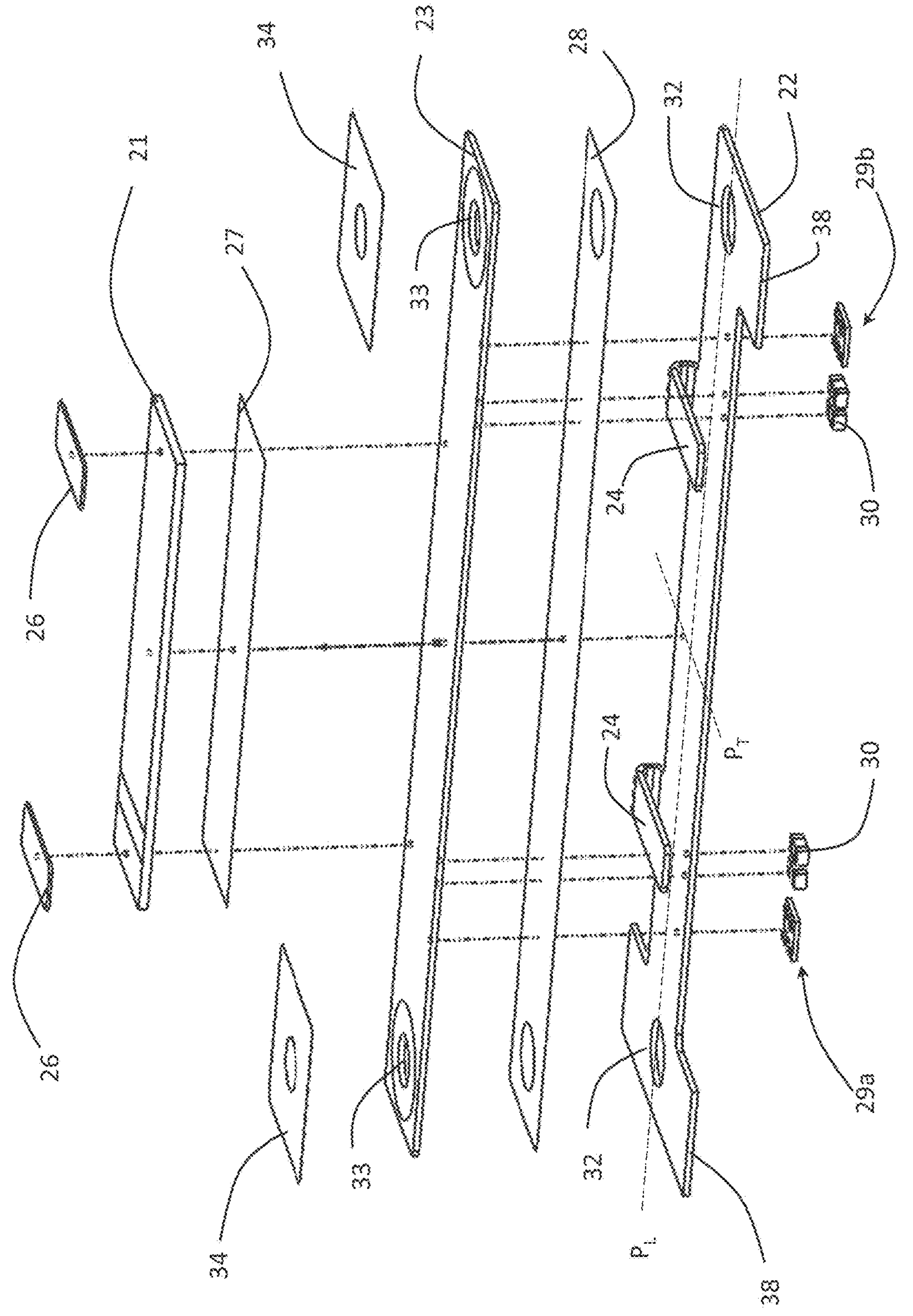
FIG. 5 is an exploded view of the piezoelectric assembly FIG. 4.

With reference to FIGS. 4 and 5, the piezoelectric assembly 4 includes a piezoelectric element 21, e.g. an elongated piece of piezo-ceramic material, which generates an electrical response signal when force is applied thereto, and produces a haptic response, e.g. vibration, when an electric haptic activation signal 44 is applied thereto. The piezoelectric assembly 4 also includes a flexible printed circuit board (FPCB) 22 and a support, e.g. metallic and/or conductive, substrate 23, all mounted in a superposed arrangement with the piezoelectric element 21, therebetween. The support substrate 23, which is fixed at opposite ends thereof, extends longer, e.g. 1.5×-3× longer, than the piezoelectric element 21 beyond each end thereof for suspending the piezoelectric element 21. The FPCB 22 includes a first tab 24*a* and a second tab 24*b*, which extend upwardly from a main section of the FPCB 22, beside the support substrate 23, and over top of and into contact with the piezoelectric element 21, i.e. parallel with the main section FPCB 22. A conductive material 26, e.g. adhesive or anisotropic conductive film (ACF), is used to connect the first and second tabs 24*a* and 24*b* of the piezoelectric element 21 to the FPCB 22.

The support substrate 23 forms a composite beam with the piezoelectric element 21, and is configured to enable the uniaxial movement of the piezoelectric element 21 to be translated to biaxial movement. The support substrate 23 can comprise a single material or also comprise a composite beam, such as a bi-metallic material, e.g. 0.2/0.3 mm of brass/stainless, configured to provide the desired structural characteristics, e.g. strength, flexibility, Young's modulus, etc. In some embodiments, the support substrate 23 and the FPCB 22 are the same element, i.e. a FPCB 22 configured to provide enough strength and support for the piezoelectric element 21 without need of an extra support substrate 23.

The purpose of the support substrate 23 is to react against the piezoelectric element 21, i.e. the ceramic, in order to create a beam deflection, i.e. arcuate beam deflection, lower in the middle ("smiley" face) or higher in the middle ("sad" face), see hatched line in FIG. 4, therefore creating a movement amplification of the piezoelectric element 21. If it was only for the piezoelectric element 21, the movement would be the ceramic shortening, i.e. in the horizontal axis. By introducing a multi-material support substrate 23, the difference between the contraction of the piezoelectric element 21 and the deflection of the support substrate 23: (1) creates movement amplification of the piezoelectric element 21, and (2) enables the usable movement to be along the vertical axis (vs. the horizontal axis of the piezoelectric element 21 alone).

The support substrate 23 has the responsibility of converting the axial shrinkage of the piezoelectric element 21 to a transverse movement. In the same operation, the support substrate 23 also acts as a mechanical movement amplification device. A bare ceramic piezo electric element 21 can shrink about 0.1% when subjected to voltage. When bonded to a suitable support substrate 23, the deflection can be multiplied, e.g. to ~50 μm, which is now a usable value for haptics. By changing the properties of the support substrate 23, the piezoelectric assembly 4 can accept higher forces or greater displacement or accept more deformation before being damaged.

The parameters of the piezoelectric element 21 and, in particular, the support substrate 23 have an impact when making such a composite beam. The difference in Young's moduli will change the position of the neutral fiber of the beam, therefore impacting how much the beam can be deformed before the piezoelectric element 21, e.g. the ceramic, sees detrimental tensile strains. Accordingly, the support substrate 23 is configured to ensure that the neutral axis (neutral plane or fiber) is at a location that ensures that the brittle ceramic never sees damaging tensile loads when the button 3 is pressed to its maximal stroke.

The differences in Young's moduli will also impact the amount of displacement of the piezoelectric assembly 4 before something bad happens, e.g. the piezoelectric element 21 breaks, the support substrate 23 deforms beyond elastic limit, some adhesive 27 or 28 gives up, the sensors **29*a* and 29*b* break because of overload. When the support substrate 23 has a much smaller Young's modulus than the piezoelectric element 21, a greater deflection of the beam for the same force results, but when the support substrate 23 has a much larger Young's modulus, a smaller deflection will result, or a much larger force will be required to generate the same deflection. The thicknesses of both materials will have a similar influence; however, changing the thickness of the piezoelectric element 21, e.g. the ceramic, will also change the electrical parameters, e.g. the threshold force of piezoelectric element 21**, i.e. how hard you need to push on the button before the software makes the decision to activate the haptic response. A composite beam with a lower Young's modulus than another will require less force to reach the same displacement.

A ceramic-to metal adhesive 27 is used to connect the piezoelectric element 21 to an upper surface of the support substrate 23, while a metal to FBCB adhesive 28 is used to connect the FPCB 22 to a lower surface of the support substrate 23. A first sensor **29*a* is mounted, e.g. soldered, on the lower surface of the FPCB 22 between an end of the piezoelectric element 21 and an end of the support substrate 23 (or the end of the FPCB 22), i.e. remote from the piezoelectric element 21, but still able to measure deflection of the piezoelectric element 21 and the support substrate 23. A second sensor 29*b* is mounted, e.g. soldered, on the lower surface of the FPCB 22 between an opposite end of the piezoelectric element 21 and an opposite end of the support substrate 23 (or an opposite end of the FPCB 22), i.e. remote from the piezoelectric element 21, but still able to measure deflection of the piezoelectric element 21 and the support substrate 23. The first sensor 29*a* and the second sensor 29*b* are spaced along the longitudinal central axis $P_L$ of the FPCB 22 one on each side of the transverse or lateral central axis $P_T$ thereof, ideally equidistant from the transverse axis Pr. In general, the first sensor 29*a* is configured to measure a force application, e.g. strain, on one side the central transverse or lateral axes of the piezoelectric element 21 and the support substrate 23 below the first pedestal 13*a*, and the second sensor 29*b* is configured to measure a force application, e.g. strain, on the opposite side of the transverse or lateral axes of the piezoelectric element 21 and the support substrate 23 below the second pedestal 13*b*. In some preferred embodiments, the longitudinal central axis $B_L$ of the button 3 is parallel to the longitudinal central axis $P_L$ of the FPCB 22. In some preferred embodiments, the lateral or transvers central axis $B_T$ of the button 3 is parallel to and/or superposed and/or aligned with the lateral or transverse central axis Prof the FPCB 22. In the illustrated exemplary embodiment, capacitors 30 are provided to the FPCB 22 for proper function of first and second sensors 29*a* and 29*b*, but other examples of the first and second sensors 29*a* and 29*b* may not require them. The first and second sensors 29*a* and 29*b* can be strain sensors, e.g. piezoelectric sensors, or simple strain gauges that would be glued on to the support substrate 23 or the FPCB 22. The first and second sensors 29*a* and 29*b* may be any form of sensor enabling the measurement or calculation of a quantity, e.g. force or strain, indicating the application of a force on the button 3. By calibrating each of the first and second strain sensors 29*a* and 29*b* individually, the measured strain can be correlated by the computer processor controller 41** with a known force applied at a known location.

Opposite ends of the FPCB 22 include holes 32, and opposite ends of the conductive substrate 23 include holes 33 for receiving the mechanical fasteners 19, which extend through the FPCB 22 and the support substrate 23 into the faceplate 8 (or the outer frame 7). An electrically insulating material 34 is provided between the conductive substrate 23 and the faceplate 8 (or the outer frame 7), if necessary to electrically insulate the conductive substrate 23, i.e. the piezoelectric assembly 4, from the faceplate 8 or the outer frame 7 of the electronic device 2. The push button system 1 is adaptable to different manufacturing tolerances, e.g. button size, deflection, etc., commonly seen in a mass production environment, because when a specific manufacturer requires larger tolerances to suit their equipment, the tolerances can be met by increasing the distance between the holes 32 and 33, i.e. one or more of the lengths of the piezoelectric element 21, the FPCB 22, and the conductive substrate 23.

Electrical communication leads 38 extend from each end of the FPCB 22 for transmission of electrical signals between a computer processor controller 41, e.g. a driver chip, in the electronic device 2 and the FPCB 22, which in turn transmits electrical signals to and from the piezoelectric element 21.

When a user applies a force above an activation threshold, e.g. 300 mN, somewhere on the button 3, the force is transferred from the button 3 to the piezoelectric element 21 and/or the support substrate 23 via the first and second pedestals 13*a* and 13*b*. The first and second sensors 29*a* and 29*b* enable the resultant first and second forces, respectively, to be calculated from the resultant first and second strains, respectively, on the piezoelectric element 21 and/or the conductive substrate 23, at or near the two points of contact. Accordingly, the computer processor controller 41, e.g. a driver chip, in the electronic device 2 executing computer software stored on non-transitory memory 42 in the electronic device 2 receives first and second electrical signals 43*a* and 43*b* from the first and second sensors 29*a* and 29*b*, respectively, corresponding to the first and second resultant force or strain, and then determines the location of the original force application on the button 3 by comparing the first resultant force or strain and the second resultant force or strain. For example, when the first force or strain, i.e. the first electrical signal 43*a*, is greater than the second force or strain, i.e. the second electrical signal 43*b*, then the location of the original force application was at the end of the button 3 closest to the first sensor 29*a*, but when the first force or strain, i.e. the first electrical signal 43*a*, is less than the second force or strain, i.e. the second electrical signal 43*b*, then the location of the original force application was at the end of the button closest to the second sensor 29*b*, and when the first force or strain, i.e. the first electrical signal 43*a*, is substantially equal to the second force or strain, i.e. the second electrical signal 43*b*, then the location of the original force application was at the middle of the button 3. The computer processor controller 41 is then configured to translate the location of the original force application into a resultant action for the electronic device 2, e.g. pushing on one end or the other on the button 3 results in volume up or down, scroll up or down, etc., and pushing in the middle results in on or off, select etc. Accordingly, the push button system 1 offers precision force sensing leading to accurate position calculation of the finger's position and haptic feedback. In use, the computer processor controller 41 is electrically connected with the device controller 51, e.g. system on chip (soc), of the electronic device 2 for exchanging electrical signals therebetween relating to the specific activation activity of the button 3 and any haptic response.

When desired, an electrical haptic activation signal 44, e.g. voltage, may be sent from the computer processor controller 41 to the piezoelectric element 21, which generates a haptic sensation to the user's finger via the button 3. The force activation threshold can be adjusted to trigger different haptic sensations according to different forces and different force locations applied on the button 3. For example: a localized haptic response can be sent from the computer processor controller 41 to the button 3 via the piezoelectric element 21 even at a minimal force, e.g. substantially zero force, from the user's finger. The "zero-force" capability makes the button 3 able to deliver a haptic response to the finger even when the finger is exerting a low force, analog to a swipe on a trackpad. Accordingly, when the first sensor 29*a* measures a first resultant force or strain that decreases over time, while the second sensor 29*a* measures a second resultant force or strain that increase over the same time, the computer processor controller 41 determines that a "swipe" motion has been initiated, and a predetermined response can be initiated, e.g. to a system in the electronic device 2, such as the volume or a scroll feature and/or a haptic response.

A first lighter force threshold for the button 3, e.g. about 300 mN, can be configured for gestures, such as a scroll wheel. A second variable middle force threshold, e.g. between about IN to about 3N, can be used to emulate multi-level clicking, for example to copy the sensation provided by the multi-level clicks of the button of a DSLR camera. A third higher force threshold, e.g. more than 3 N, can be used to emulate a mechanical switch. A variable threshold can be used, for example, to scroll faster/slower depending on the force on the button 3.

With reference to FIGS. 6-9, the use of various geometries of the button 3, e.g. different locations of the first and second pedestals 13*a* and 13*b*, enables a tradeoff between the size of the haptic response and the sensitivity of the sensing of the first and second sensors 29*a* and 29*b*. For example: the further the first and second pedestals 13*a* and 13*b* are from the central lateral axis $B_T$ of the button 3, the better the sensitivity, because the first and second pedestals 13*a* and 13*b* are closer to the first and second sensors 29*a* and 29*b*, and undergo less deflection from the piezoelectric element 21 and the support substrate 23; however, the closer the first and second pedestals 13*a* and 13*b* are to the central lateral axis $B_T$, the stronger the haptic response because of a greater deflection of the piezoelectric element 21 and support substrate 23.

Figure 6:
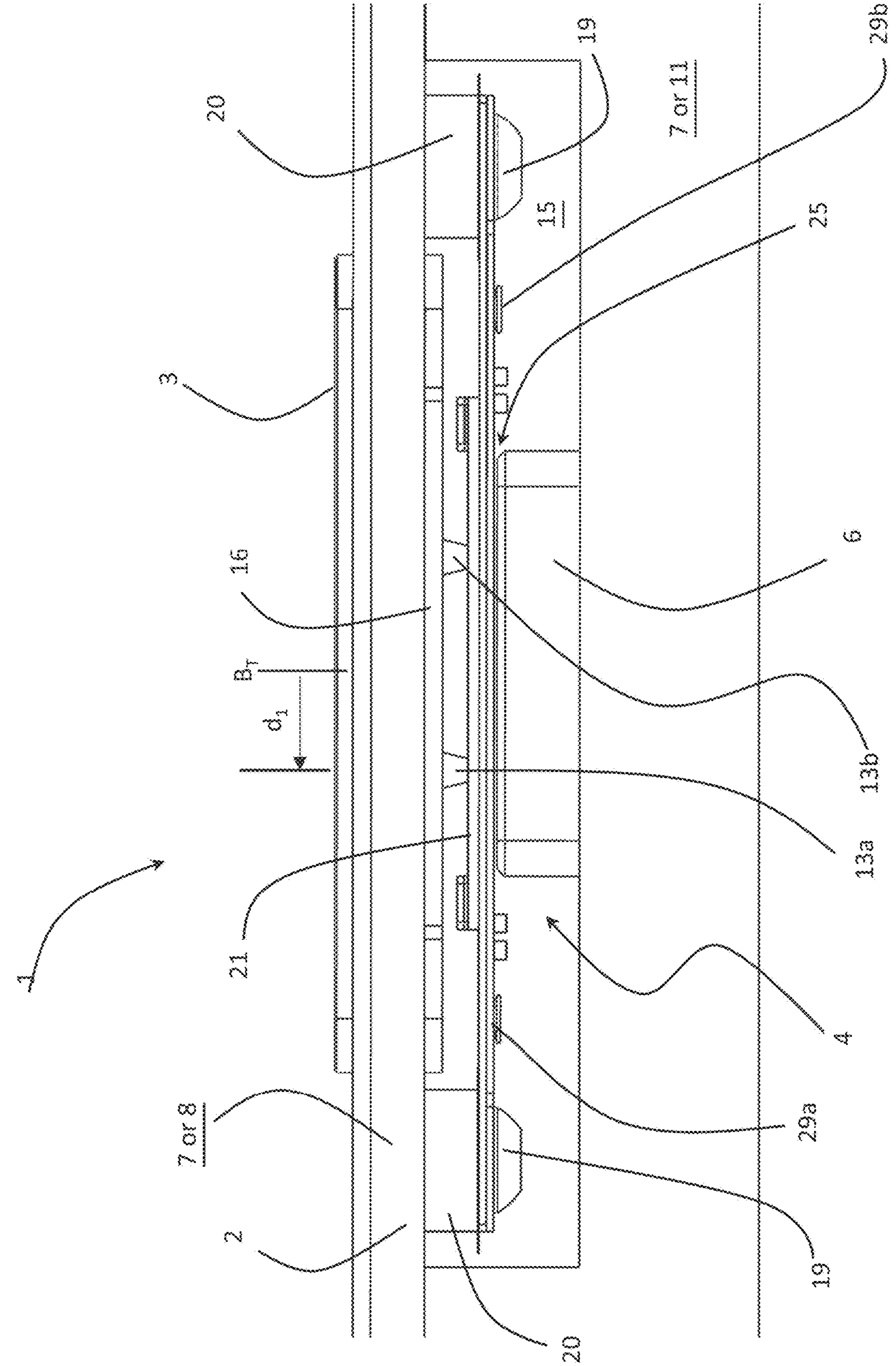
FIG. 6 is a cross-sectional view of the push button system of FIG. 1 with an alternative button structure.
Figure 7:
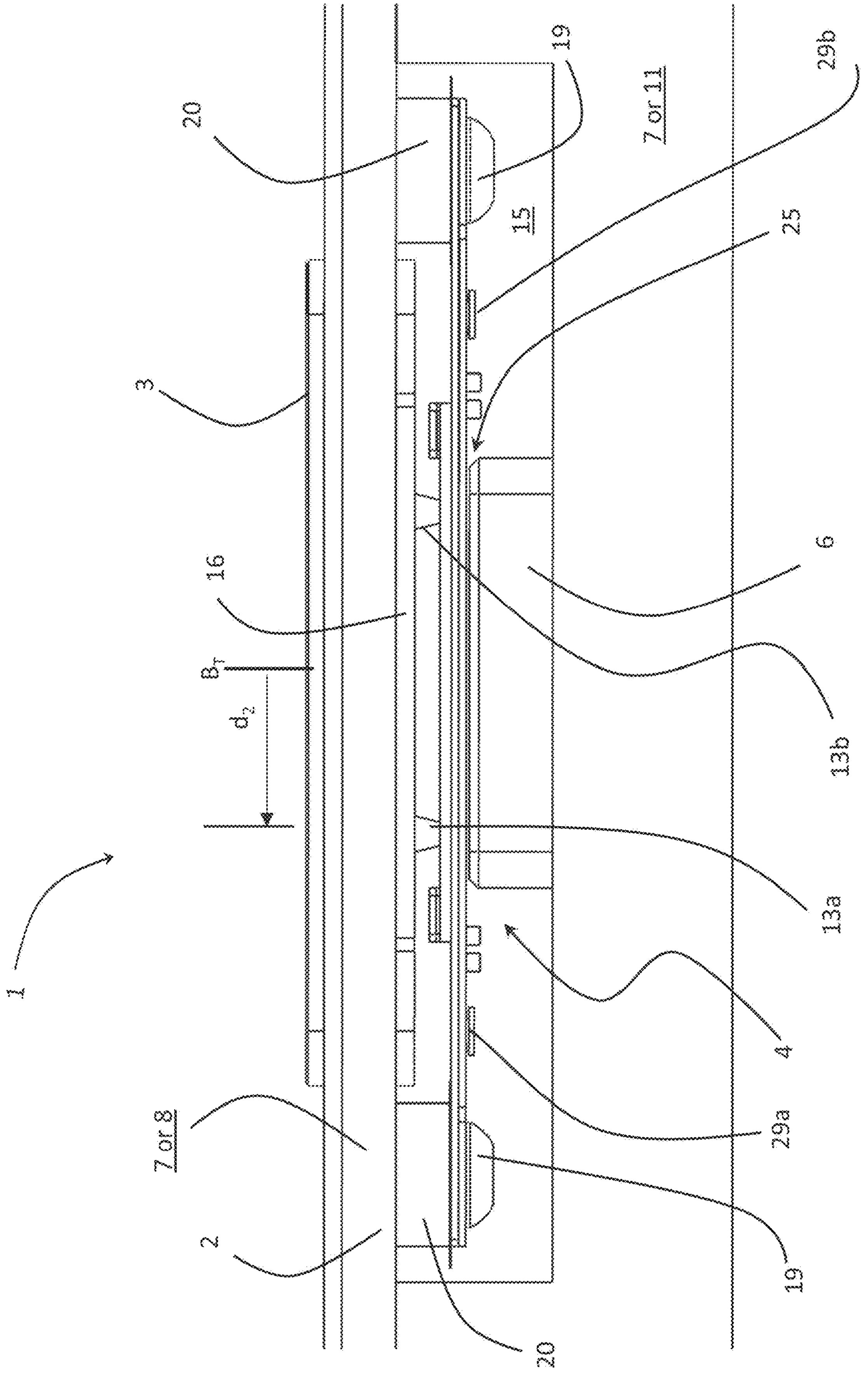
FIG. 7 is a cross-sectional view of the push button system of FIG. 1 with an alternative button structure.
Figure 8:
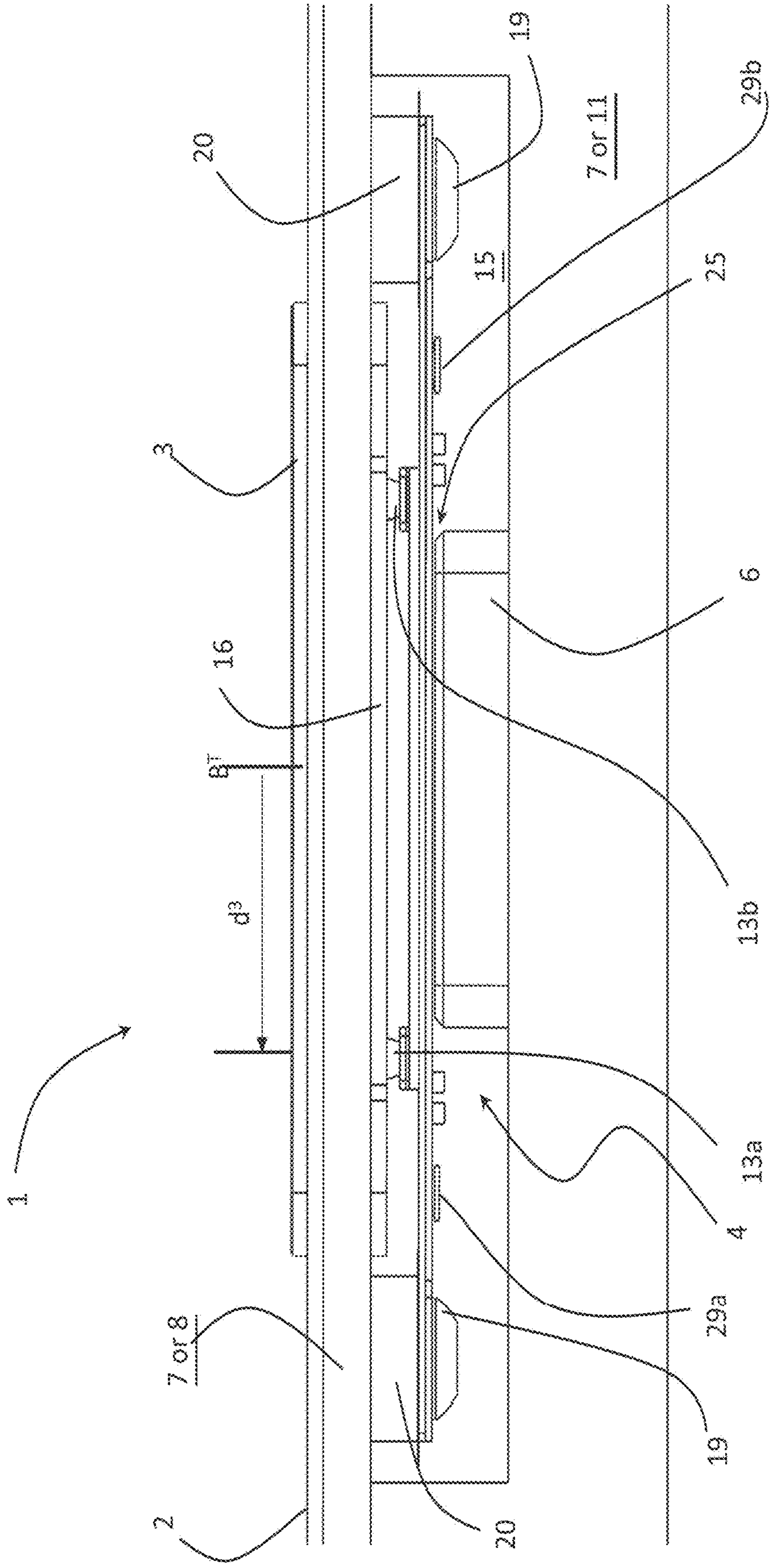
FIG. 8 is a cross-sectional view of the push button system of FIG. 1 with an alternative button structure.
Figure 9:
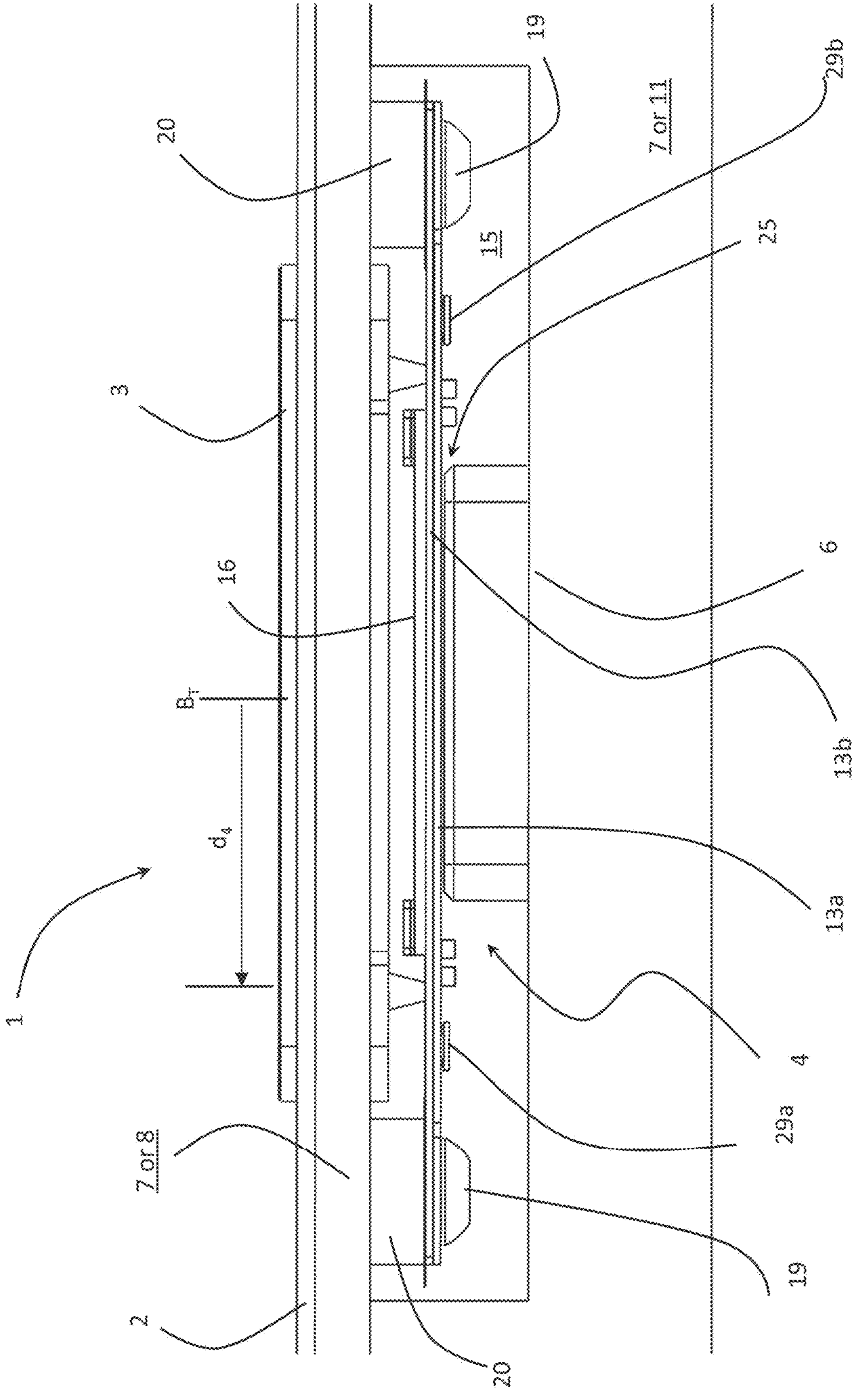
FIG. 9 is a cross-sectional view of the push button system of FIG. 1 with an alternative button structure.

With reference to FIG. 6, the first and second pedestals 13*a* and 13*b* are positioned substantially halfway between the central lateral axis $B_T$ and the respective opposite ends of the piezoelectric element 21 or substantially one third of the way towards the first and second sensors 29*a* and 29*b*, respectively, from the central lateral axis $B_T$. With reference to FIG. 7, the first and second pedestals 13*a* and 13*b* are positioned substantially three quarters of the way to the ends of the piezoelectric element 21, between the central lateral axis Brand the ends of the piezoelectric element 21 or substantially one half of the way towards the first and second sensors 29*a* and 29*b*, respectively, from the central lateral axis $B_T$. With reference to FIG. 8, the first and second pedestals 13*a* and 13*b* are positioned at the ends of the piezoelectric element 21 or substantially two thirds of the way towards the first and second sensors 29*a* and 29*b*, respectively, from the central lateral axis $B_T$. With reference to FIG. 9, the first and second pedestals 13*a* and 13*b* are positioned beyond the ends of the piezoelectric element 21 between the respective end of the piezoelectric element 21 and the respective first and second sensor 29*a* and 29*b* or substantially four fifths of the way towards the first and second sensors 29*a* and 29*b*, respectively, from the central lateral axis $B_T$.

Accordingly, a substitution for different buttons with different distances between the first and second pedestals 13*a* and 13*b* enables a wide range of sensitivities and haptic responses. Alternatively, a button 3 with adjustable or repositionable first and second pedestals 13*a* and 13*b* enables the manufacturer or the user to adjust the haptic response and sensitivity, as they wish. The first tab 24*a* and the second tab 24*b* are configured in length to make sure that the strain from the fold gets dissipated in the material to minimize the influence of the fold on the first and second sensors 29*a* and 29*b*.

Figure 10:
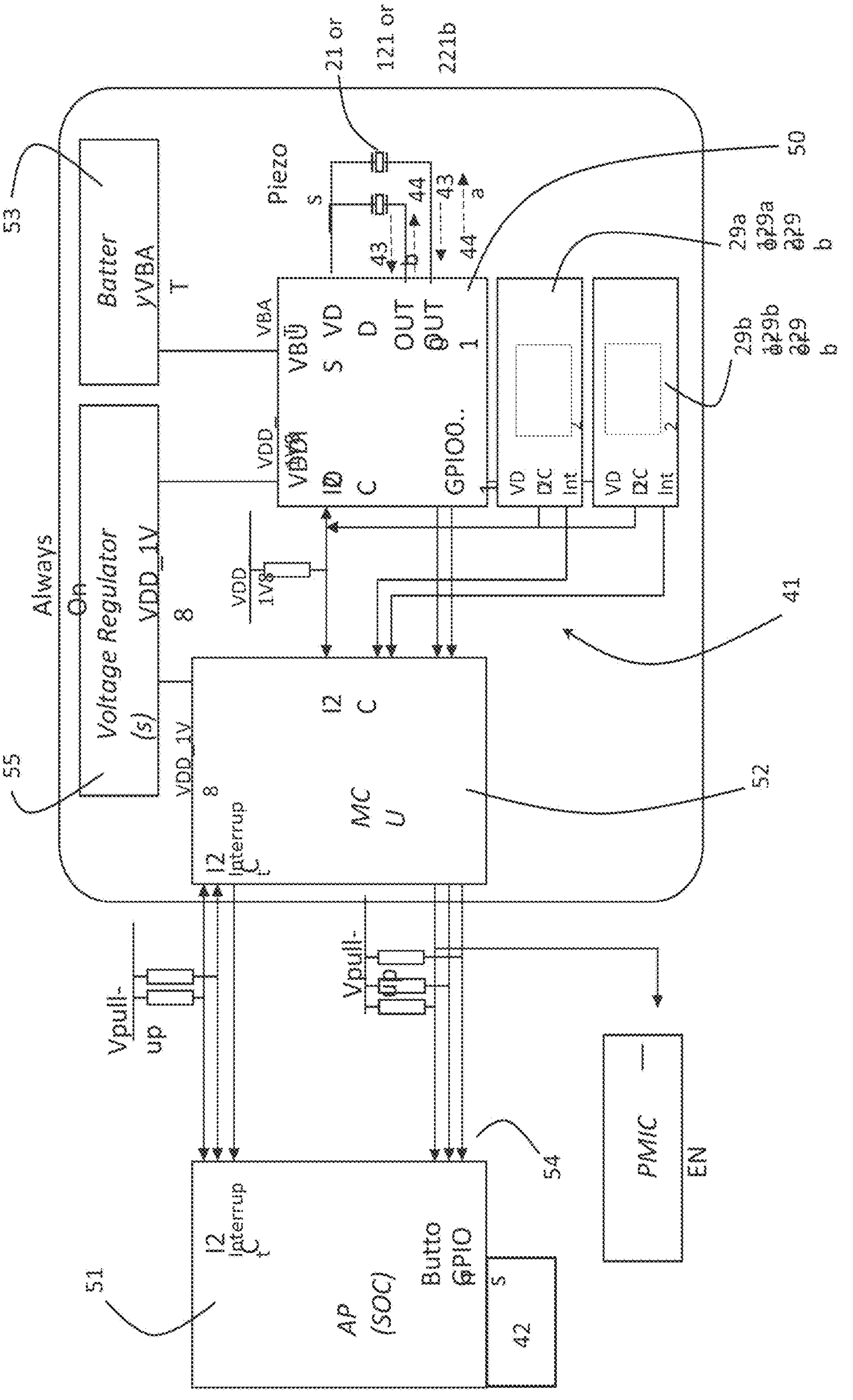
FIG. 10 is a schematic diagram of a control system for the push button system of FIG. 1.
Figure 11:
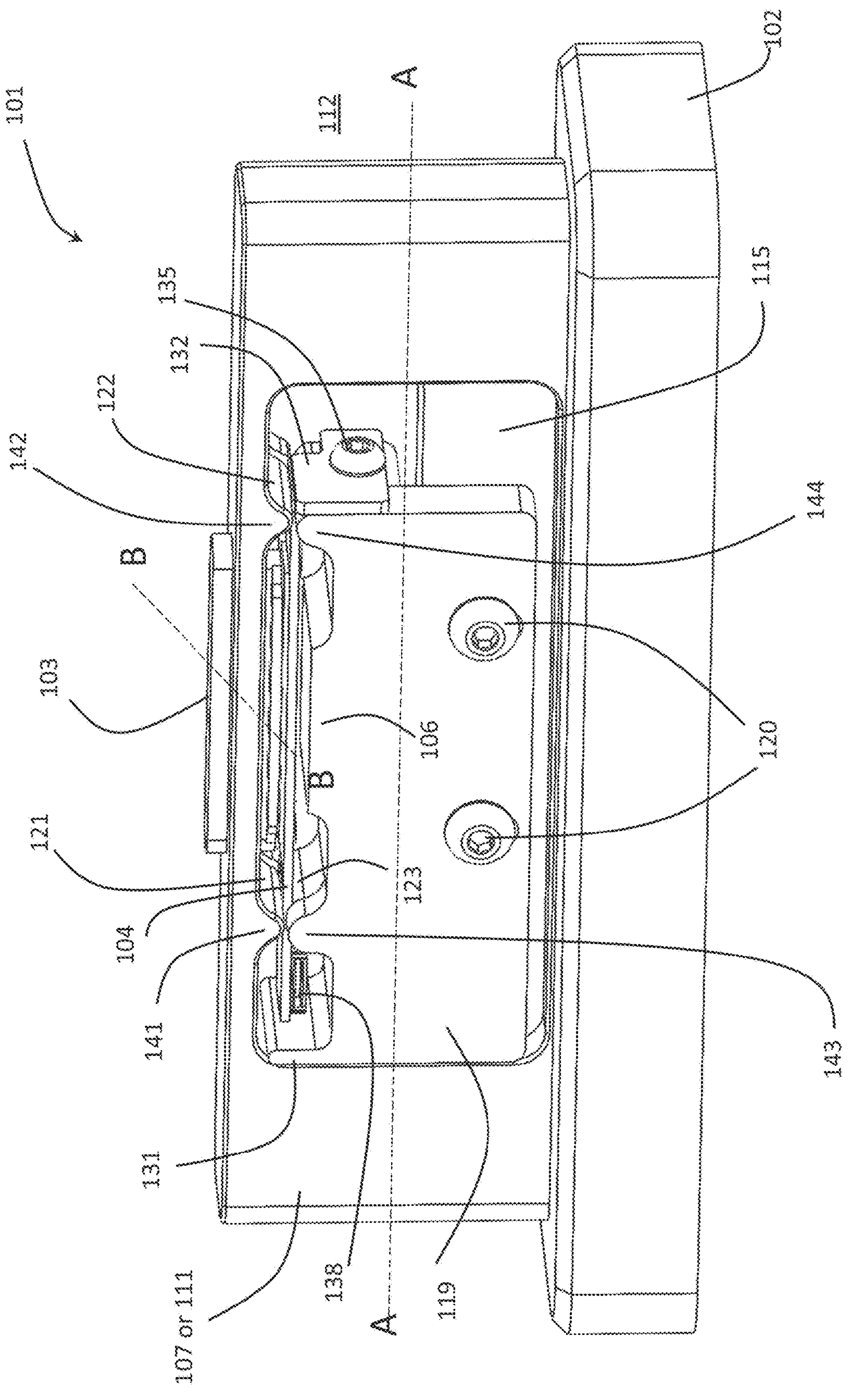
FIG. 11 is an isometric view of another example of a push button system.
Figure 12:
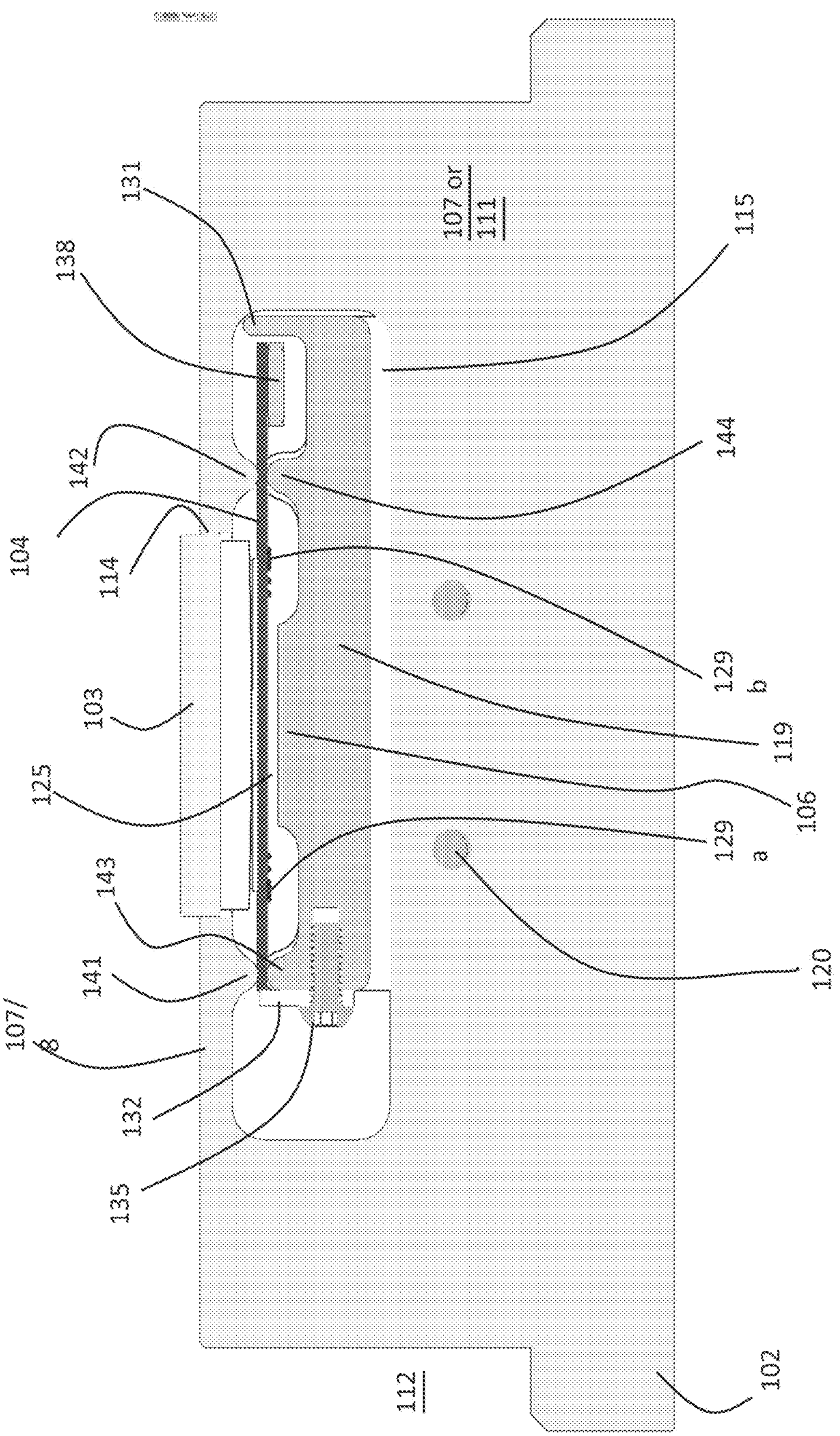
FIG. 12 is a longitudinal cross-sectional view along section A-A of the push button system of FIG. 11.
Figure 13A:
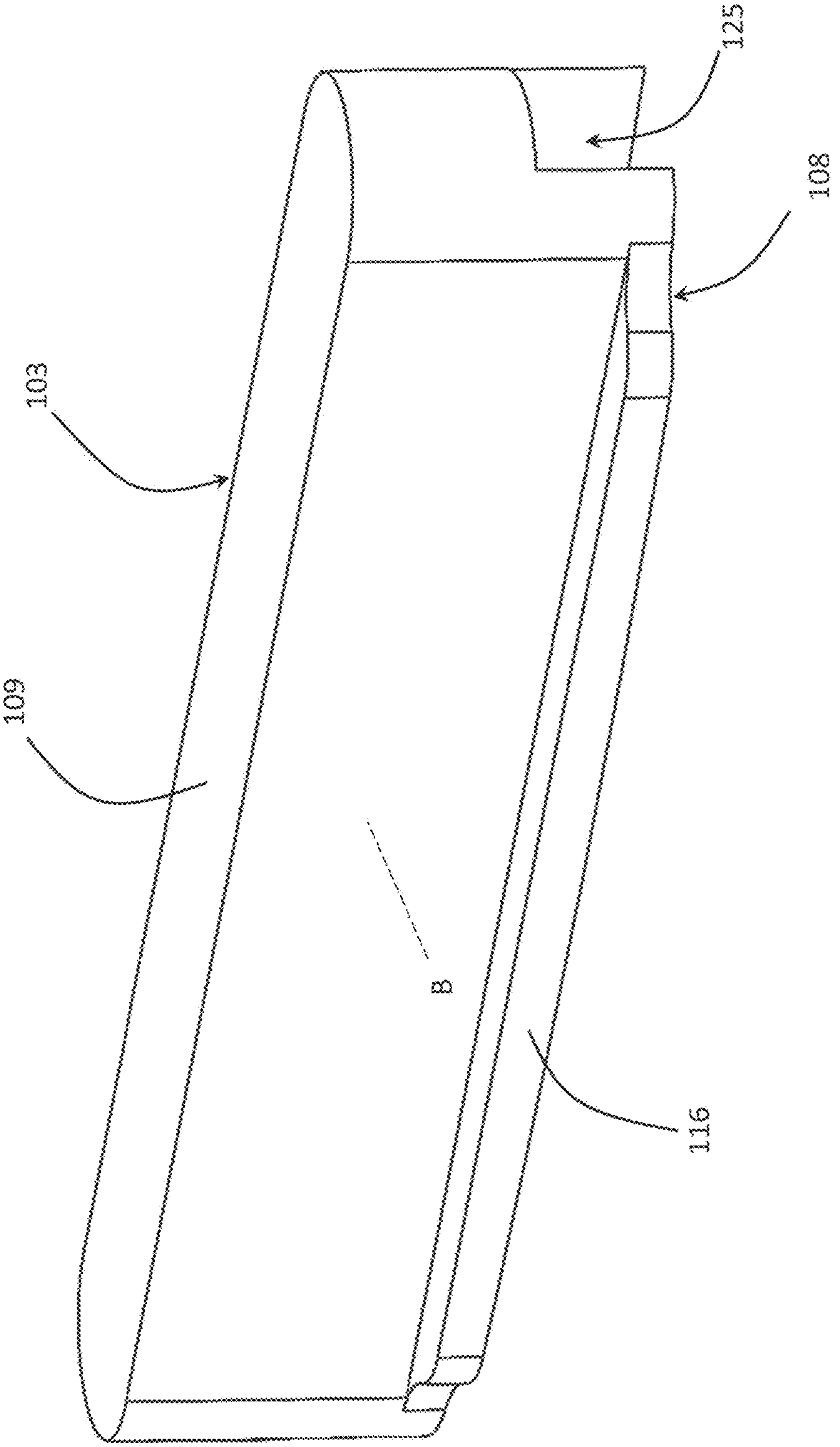
FIG. 13A is an isometric view of the push button of the push button system of FIG. 11.
Figure 13B:
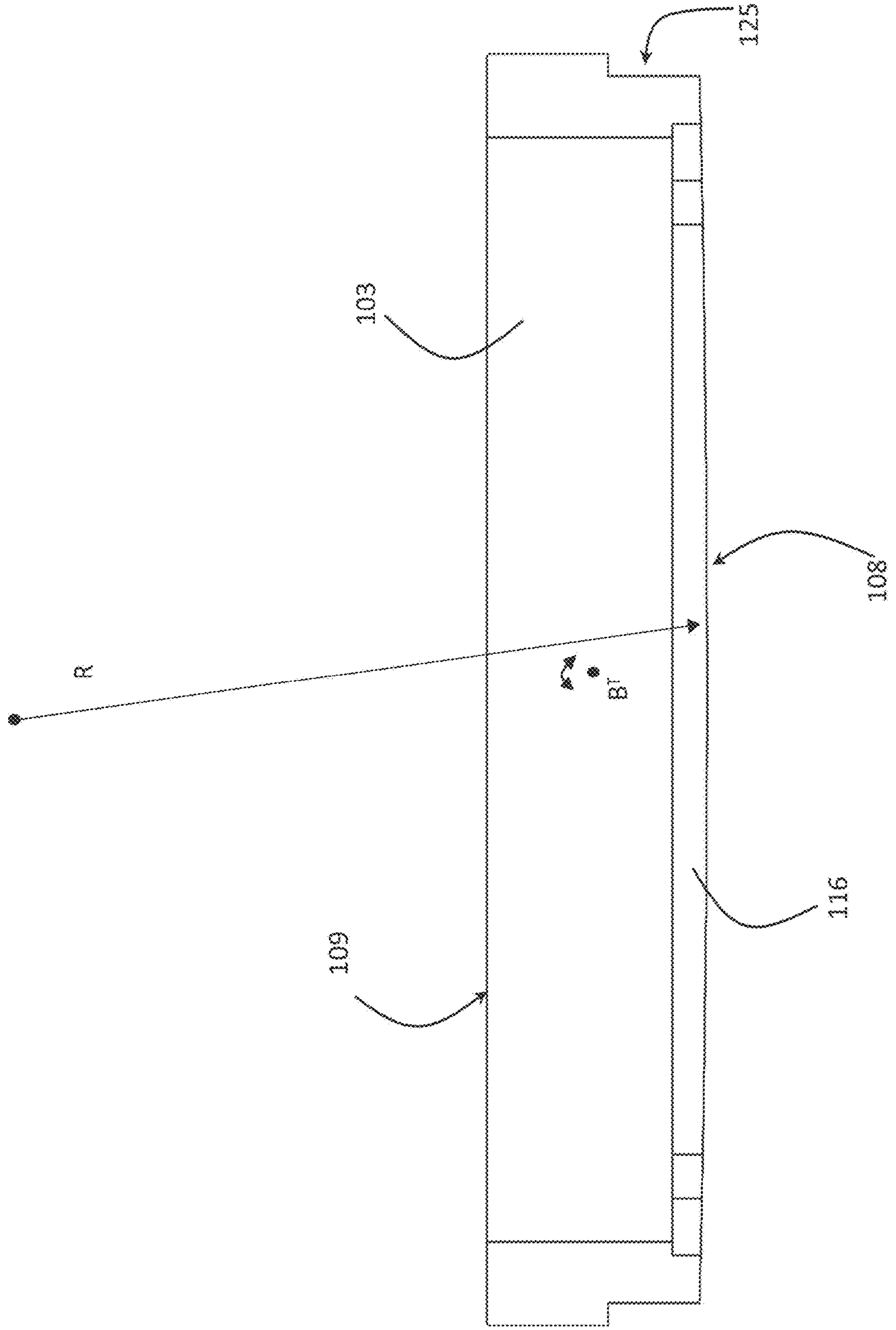
FIG. 13B is a side view of the push button of FIG. 13.
Figure 15:
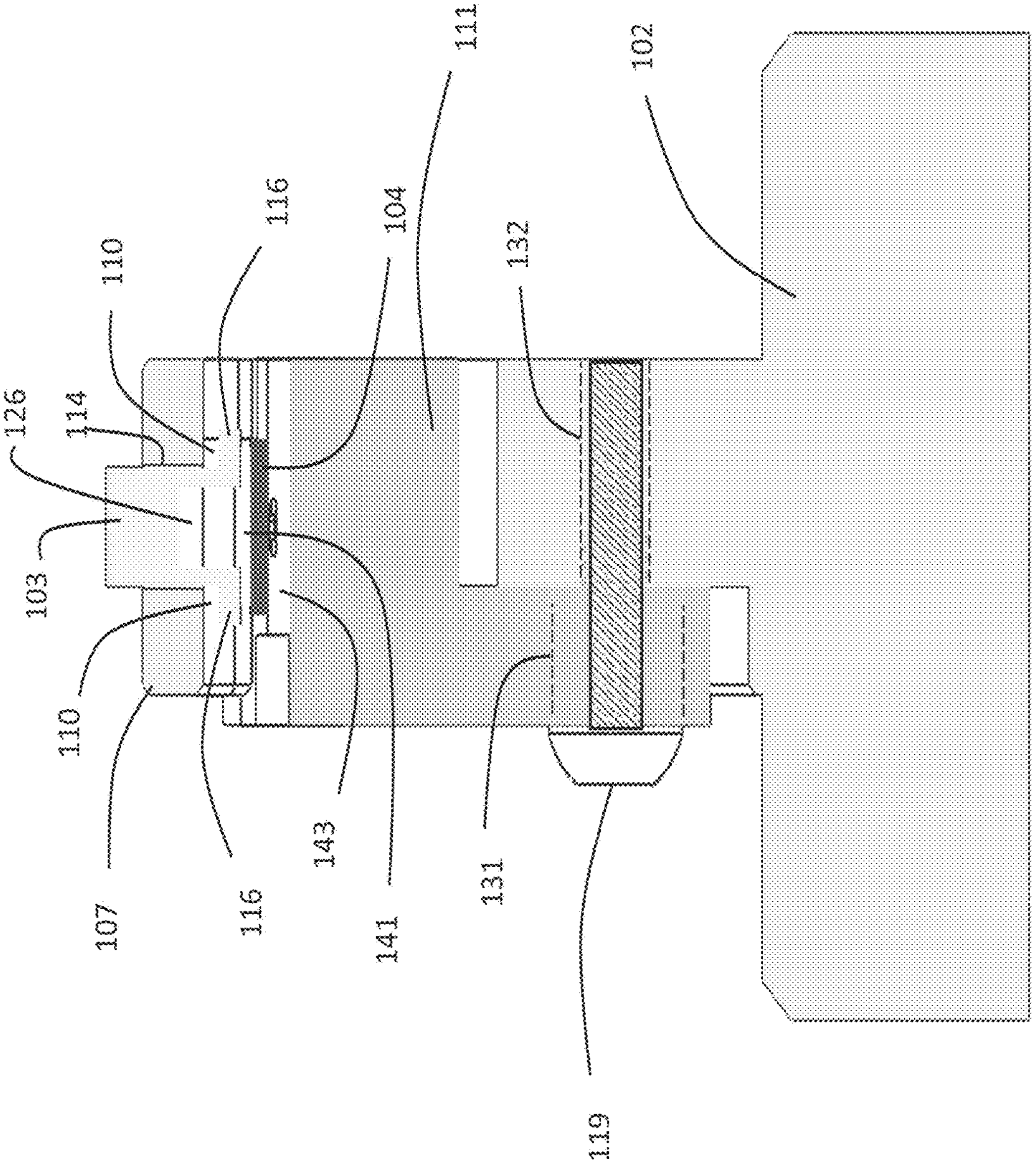
FIG. 15 is a lateral cross-sectional view along section B-B of the push button system of FIG. 11.

With reference to FIG. 10, the present disclosure also relates to a haptic button operation using computer hardware and software separate from the device controller 51, e.g. system on chip (SOC), provided in the electronic device 2 by utilizing the computer processor controller 41 comprising a main piezoelectric driver chip 50 and a micro-controller unit (MCU) companion 52, along with the button 3.

The button 3 aims to replace the conventional phone buttons by providing the same features with less buttons or by providing additional features with the same number of buttons. Mechanical buttons 3 are electrical switches connected to the device controller 51. The buttons 3 are electrically wired to be operational even when the electronic device 2 is turned off or frozen. Typically, electronic devices 2 have between three and four mechanical buttons, such the power key, the volume up key, the volume down key and customizable key. Over the fundamental functions, some critical key combinations are used for unfreezing the system 1 or setting the system 1 in bootloader mode. These features are critical and are generated by the user when the electronic device 2 is down or frozen for the device health management purpose.

Another requirement that is desirable, is the capability to turn on the electronic device 2 after a long period of time, e.g. in a box between the manufacturing line and the end customer purchase. The battery 53 should remain in an acceptable range of charge to operate the electronic device 2, and provide the user with an immediate start up, which means the MCU 52 should spend a very small amount of energy and stay operational.

An object of the present disclosure is to provide the system architecture necessary for supporting the device health management using a haptic button solution with a MCU 52. The system architecture covers the software stored on non-transitory memory and the MCU 52 for use with the button 3.

The MCU 52 emulates the state of the button 3 via a general purpose input/output (GPIO) 54 between the device controller 51 and the main piezoelectric driver chip 50. When the voltage of the GPIO 54 corresponds to the input voltage VDDIO from the voltage regulator 55, the button 3 is released and when the voltage corresponds to the ground, the button 3 is pressed. The MCU 52 adapts the sensing strategy according to the state of the electronic device 2. The MCU 52 sleeps when the electronic device 2 is off, and is awakened when the electronic device 2 is on. The electronic device 2 can be powered on or unfrozen because the MCU 52 is configured to send a voltage on the GPIO 54.

The push button system 1 may include a pivoting button 3 and a conventional power button. The sensing solution for the pivoting button 3 comprises the first and second independent sensors 29*a* and 29*b* beneath the button 3 and one piezoelectric element 21. On the other hand, the conventional power button may have only one piezoelectric element and no other force sensor.

When the electronic device 2 is powered up, the sensing for the pivoting button 3 is provided by the first and second sensors 29*a* and 29*b*, e.g. the first and second electrical signals 43*a* and 43*b* from the first and second sensors 29*a* and 29*b*, respectively, are polled or fetched by the MCU 52. The haptic click feedback is generated by the piezoelectric element 21 coupled to the pivoting button 3. The power button is emulated by the sensing from the computer processor controller 41 directly contrary to the pivoting button architecture.

When the electronic device 2 is powered down, the first and second sensors 29*a* and 29*b* are deactivated until a small amount of pressure, e.g. 100 mN to 500 mN, preferably 200 mN to 400 mN, is detected on the piezoelectric element 21. The small amount of pressure reading may be performed by a zero-power sensing (ZPS) feature of the main piezoelectric driver chip 50. The main piezoelectric driver chip 50 detects the small amount of pressure and grounds the GPIO 54 between the MCU 52 and main piezoelectric driver chip 50. The GPIO 54 is grounded after the MCU 52 decides to generate a press. The MCU 52 first needs to wake up on this initial pressure signal and wait for the right amount of force for a full press to be detected. This signal wakes up the MCU 52, which wakes up the sensing function of the first and second sensors 29*a* and 29*b*. The MCU 52 can then discriminate which key of the pivoting button 3 is pressed between the volume up and down. For the specific case of the power button, the sensing remains performed by the main piezoelectric driver chip 50 entirely. Accordingly, the light force pressure detection is performed by main piezoelectric driver chip 50; however, the decision to fire the haptic in case of an actual force application detection is performed by the MCU 52.

With reference to FIGS. 11 to 19, a push button system 101 for an electronic device 102, such as a smart phone, tablet, laptop computer or steering wheel, includes a pivoting push button 103 configured to tilt clockwise when a user applies a force, e.g. with a finger, to one end thereof, tilt counterclockwise when a user applies force to an opposite end thereof, as well as reciprocate (down/up) when a user's applies force in the middle thereof. The push button system 101 also includes a piezoelectric assembly 104 and a hard stop 106 configured for limiting the maximal stroke of the pivoting push button 103, therefore preventing damage to the components, but embodiments without the hard stop 106 are possible.

In an exemplary embodiment, the button 103 is pivotally mounted in an opening 114 in the outer frame 107 of the electronic device 102. Alternatively, a faceplate 8 (as in FIG. 1) can be connected to the outer frame 107 using mechanical fasteners 9, e.g. threaded fastener, or some other attachment means, such as adhesive. Alternatively, the button 103 and/or the faceplate 8 may be mounted on a base 111, which is mounted in a recess 112 in the outer frame 107.

The pivoting push button 103 includes an arcuate, curved or rounded bottom surface 108, configured for contacting the piezoelectric assembly 104 over a line of contact, which moves as the pivoting push button 103 is rotated. The radius of curvature of the arcuate bottom surface 108 around the pivoting axis B-B of the button 103 is between 200 mm and 500 mm, more preferably between 375 mm and 425 mm, and most preferably about 400 mm, or twice as large as the radius of curvature of the piezoelectric assembly 104, e.g. 215 mm, under a typical threshold force of 4 N. The pivoting push button 103 also includes a substantially flat upper surface 109 configured for being contacted by the user's finger. The sides of the pivoting push button 103 may be substantially vertical and the ends of the pivoting push button 103 may be rounded, but other configurations are possible. The lateral or transverse central axis $B_T$ could also be known as the pivoting axis, about which the button 103 substantially pivots, e.g. up to 10 μm. The button 103 extends through the opening 114 in the outer frame 107 (and/or the faceplate 8 and/or the base 111), into a cavity 115 in the outer frame 107 (or the base 111) and into contact with the piezoelectric assembly 104 along the line of contact defined by the bottom surface 108 of the button 103, which is typically about 3 mm wide. The line of contact is about 3 mm in length, i.e. the width of the button 103. The width of the line of contact will depend on the applied force. At zero load, the line of contact is substantially zero micrometers wide (See FIGS. 14A and 14B). As the force increases, the width of the line of contact increases, but minimally, e.g. single digit microns (See FIGS. 14C and 14D). When the force reaches a point where the radius of curvature of the piezoelectric assembly 104 is conformed to the radius of the bottom surface of the button 103, the width of the line of contact reaches a maximum, e.g. 1-5 μm. At this point, precise determination of location of the force becomes impossible.

In some embodiments, the button 103 is loosely held in the opening 114, i.e. able to rotate and reciprocate (up/down or in/out), but prevented from falling out, using flanges 116 extending outwardly from along each side of the button 103. The flanges 116 extend wider than the width of the opening 114 and therefore abut against the inner surface of the outer frame 107 (or the base 111). A resilient member 110, comprised of a resilient material, e.g. a plastic foam is provided between the flanges 116 and the outer frame 107 providing both a seal and a preload spring force for holding the button 103 in contact with the piezoelectric assembly 104 and in contact with outer frame 107 (or base 111).

The piezoelectric assembly 104 may be held at opposite ends thereof to the inner surface of the outer frame 107 (or the base 111) in the cavity 115 between the button 103 and the hard stop 106 using a sliding clamp 119, e.g. any device, such as a spring, that exerts a force to prevent a movement or rattling of the button 103. The inner surface of the outer frame 107 (or the faceplate 8 or the base 111) includes first and second fixed upper jaws 141 and 142, which may be in the form of ridges extending laterally, i.e. perpendicular to the longitudinal axis of the piezoelectric assembly 104 and the button 103 configured for contacting the piezoelectric assembly 104, proximate opposite ends thereof. The first and second fixed upper jaws 141 and 141 are spaced apart from each other, one on each side of the opening 114 and the button 103. Similarly, the sliding clamp 119 includes third and fourth moveable lower jaws 143 and 144, which may be in the form of third and fourth ridges extending upwardly from the sliding clamp 119 parallel to the first and second fixed jaws. The third and fourth lower jaws 143 and 144 are aligned with the first and second upper jaws 141 and 142, respectively, whereby one end of the piezoelectric assembly 104 is held, e.g. clamped, between the first upper jaw 141 and the third lower jaw 143, and the other end of the piezoelectric assembly 104 is held, i.e. clamped, between the second upper jaw 142 and the fourth lower jaw 144. Ideally, the first upper jaw 141 and the third lower jaw 143, and the second upper jaw 142 and the fourth lower jaw 144 each define a narrow line of contact forming a substantially free support as opposed to a fixed support, so that the piezoelectric assembly 104 may undergo maximum vertical deformation.

The sliding clamp 119 is mounted on the outer frame 107 or the base 111 using mechanical fasteners 120, which extend through corresponding holes 131 in the sliding clamp 119 and holes 132 in the outer frame 107 (or the base 111). The holes 131 in the sliding clamp 119 or the holes 132 in the outer frame 107 comprise elongated holes enabling the sliding clamp 119 to be positioned, e.g. slid, into place with the piezoelectric assembly 104 held between the first and second upper jaws 141 and 142, and the third and fourth lower jaws 143 and 144. A thin layer of rubber may be provided on the jaws 141-144 to allow for even more compliance. Accordingly, the goal is to enable the piezoelectric assembly 104 to change length but restrict motion in all the other axes.

The piezoelectric assembly 104 is suspended by each end thereof in the cavity 115 enabling a slight deflection thereof, with a maximum deflection in the middle, as per standard beam deflection equations. The piezoelectric assembly 104 is suspended above the hard stop 106, extending from the sliding clamp 119, with a gap 125 therebetween, e.g. 50 μm to 500 μm, preferably 100 μm to 300 μm, to prevent the piezoelectric assembly 104 from deforming beyond a safe limit, i.e. before damaging the piezoelectric assembly 104. If, for example, a user drops the device 102 and all of the force goes through the button 103, once the piezoelectric assembly 104 bends beyond the distance of the gap 125, the piezoelectric assembly 104 then contacts the hard stop 106, whereby any force increase will not result in a strain increase, thereby protecting the piezoelectric assembly 104 from damage. The gap 125 is determined by how much the piezoelectric assembly 104 can be deformed. The total deformation is the result of the machining tolerances+the gap. Accordingly, the gap 125 is sized and configured to: 1) allow haptics, i.e. too small of a gap 125 will hinder haptics, and 2) prevent damage to the piezoelectric assembly 104, i.e. too big of a gap 125 will allow damage to occur.

To prevent horizontal, i.e. side to side, movement of the piezoelectric assembly 104, during use, which would result in a rattling noise and a de-calibration of the electronic systems, longitudinal abutments 131 and 132 can be provided at opposite ends of the base 111 and/or the outer frame 107 to limit longitudinal movement of the piezoelectric assembly 104, and lateral abutments 133 and 134 can be provided at opposed sides of the base 111 and/or the outer frame 107 to limit lateral movement of the piezoelectric assembly 104. One of the longitudinal abutments 131 or 132 may be removeable, e.g. by a mechanical fastener 135, to facilitate mounting and adjustment of the base 111 in the outer frame 107. The lateral abutments 133 and 134 may extend parallel to and/or at the ends of the jaws 141-144, e.g. the ridges.

With reference to FIGS. 16 to 19, another exemplary embodiment includes an alternative structure for attaching the piezoelectric assembly 104 to the outer frame 107 or the base 111, which utilizes a set of leaf springs 161, e.g. resilient spring contacts, one or more on each end of the piezoelectric assembly 104 as the upper and/or lower jaws. The leaf springs 161 are configured to clamp or squeeze the piezoelectric assembly 104 proximate the ends thereof between resilient arms 162 extending from supports 163. A layer of resilient material, e.g. rubber, may be provided between the leaf springs 161 and the piezoelectric assembly 104, to provide added resilience to the connection. A flange 164 may be provided for mounting the leaf springs 161 on the faceplate 8 or the outer frame 107. Each flange 164 extends outwardly from each leaf spring 161 to the outer wall of the faceplate 8 and/or the outer frame 107. The spring force of each leaf spring 161, i.e. each resilient arm 162, is selected to provide the desired clamping force on the piezoelectric assembly 104, i.e. so as not to prevent the piezoelectric assembly 104 from bending.

Figure 16:
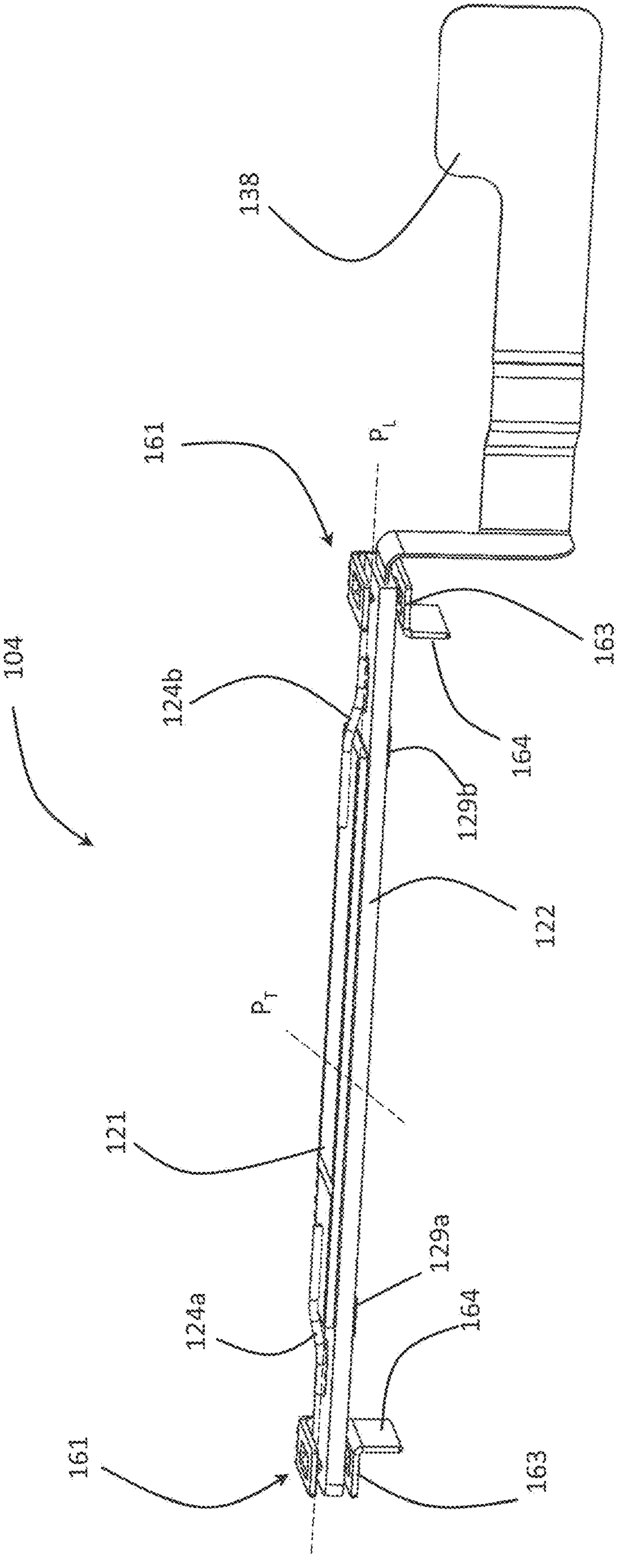
FIG. 16 is an isometric view of the piezoelectric assembly of FIG. 11.
Figure 17:
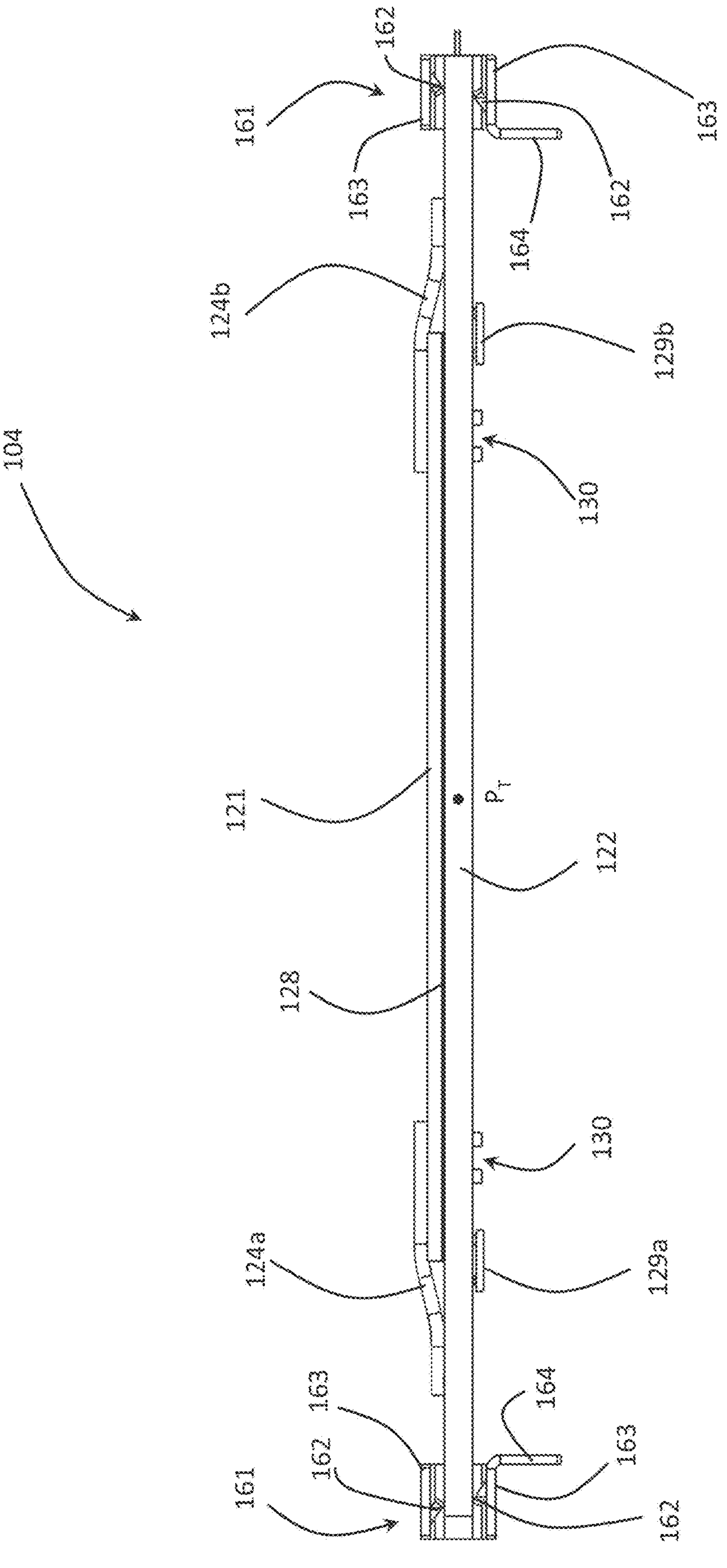
FIG. 17 is a side view of the piezoelectric assembly of FIG. 16.
Figure 18:
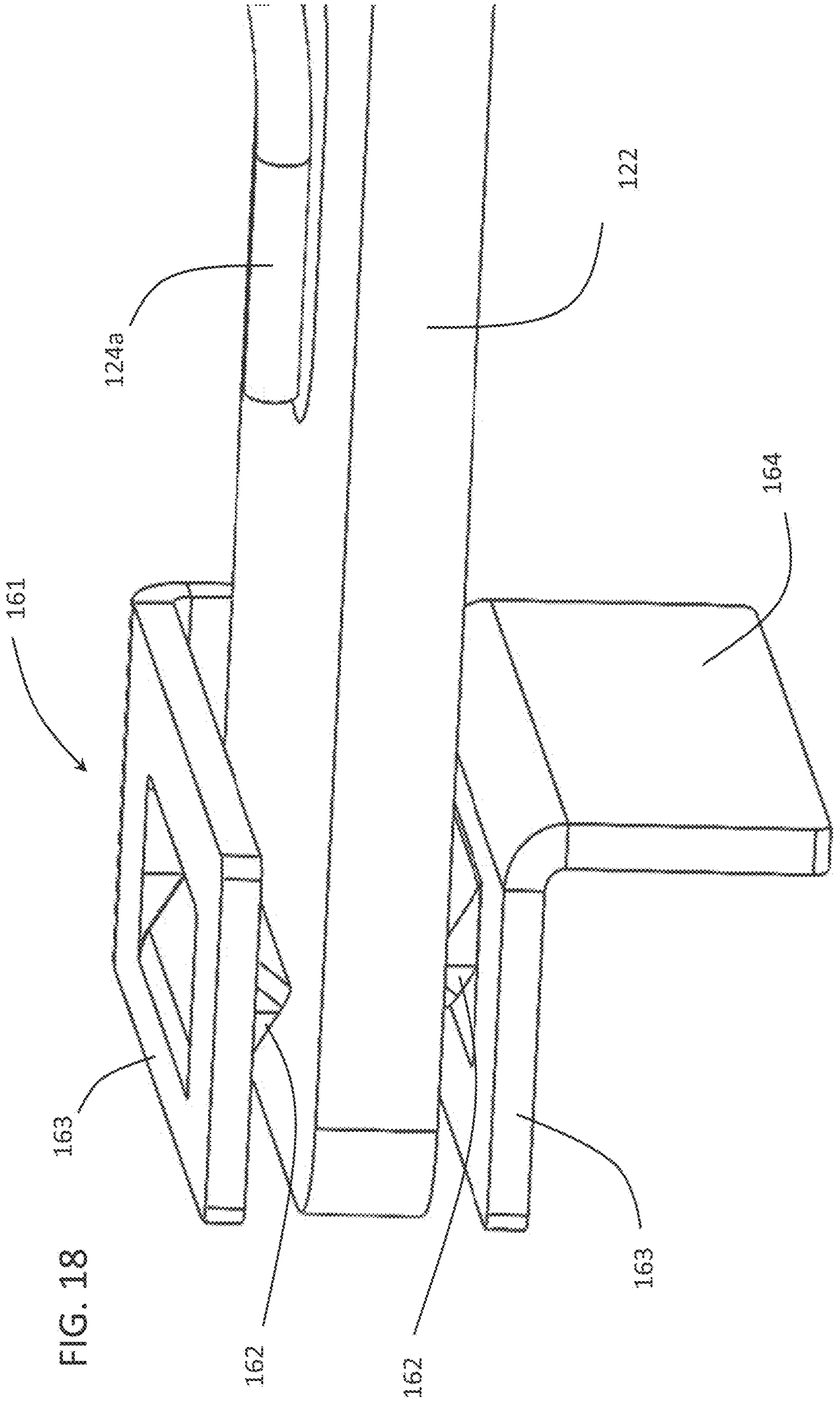
FIG. 18 is an isometric view of one end of the piezoelectric assembly of FIG. 16.
Figure 19:
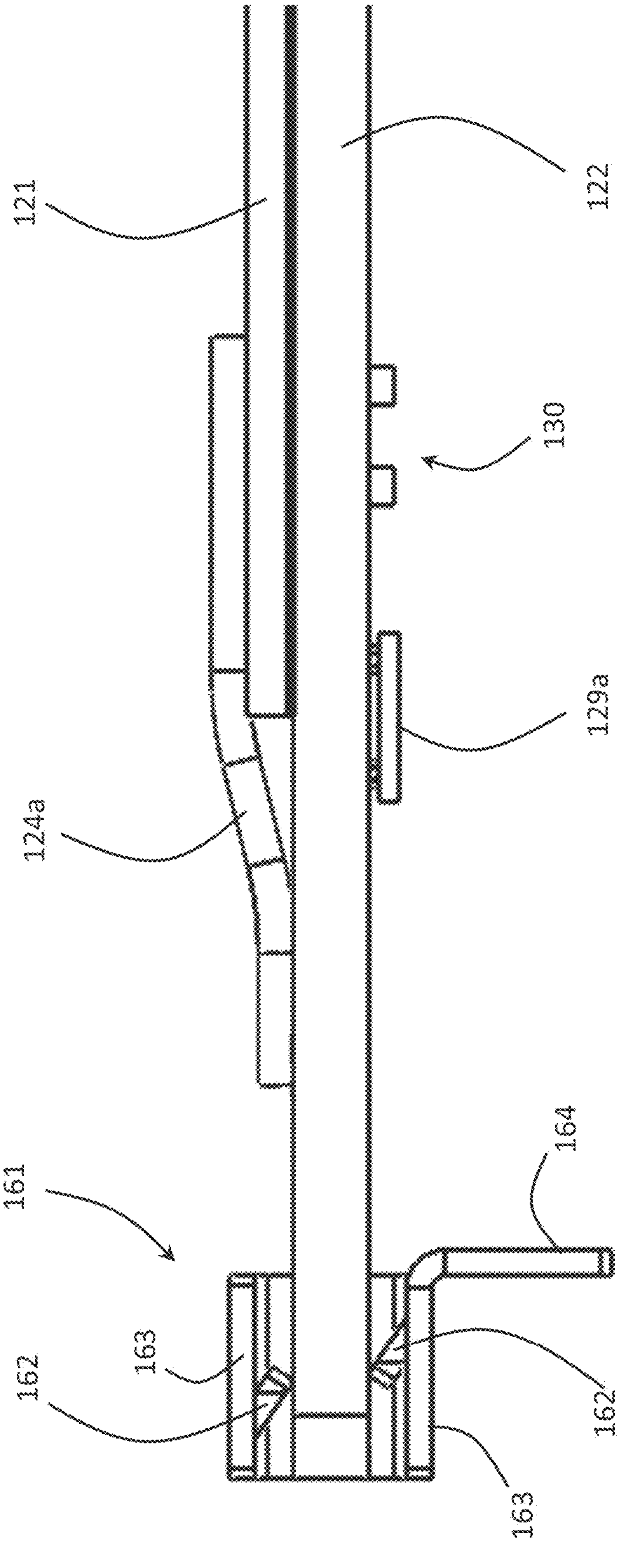
FIG. 19 is a side view of one end of the piezoelectric assembly of FIG. 16.
Figure 20:
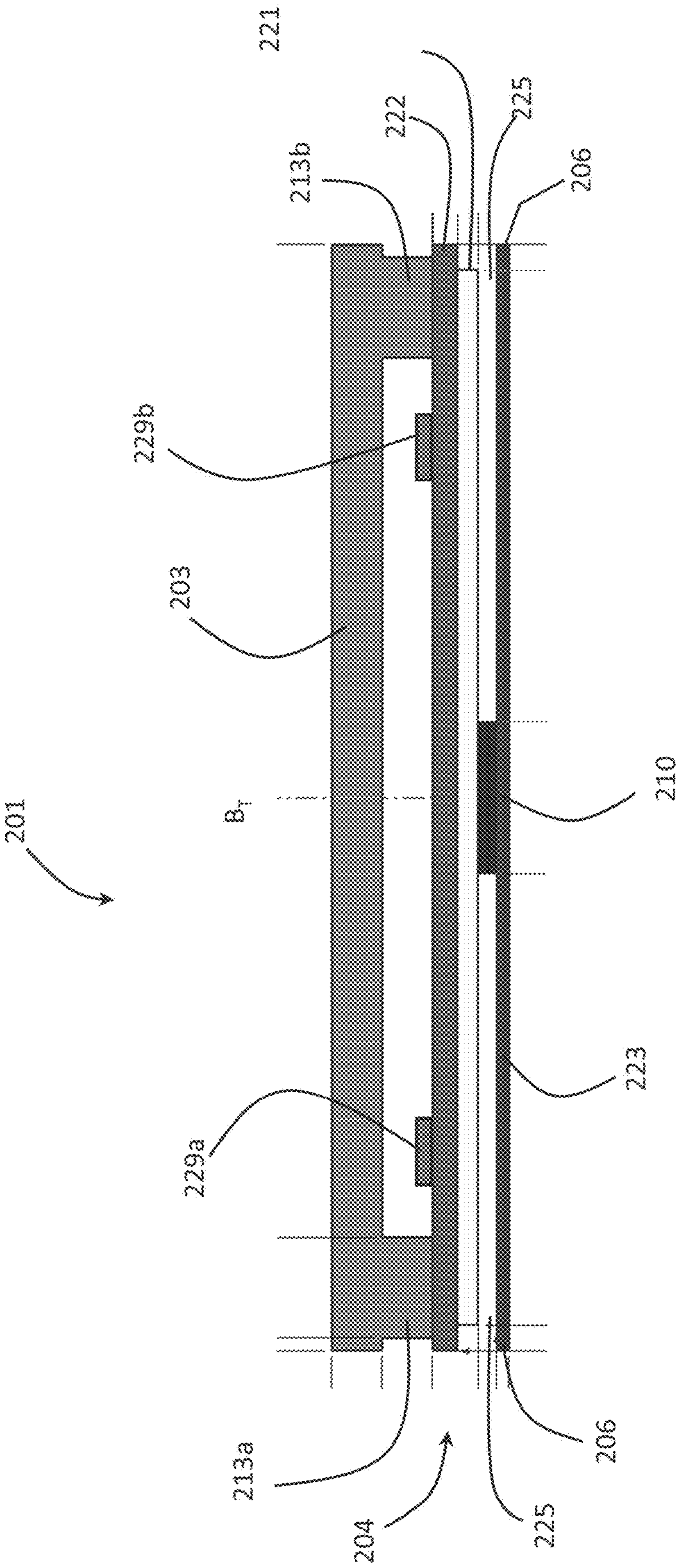
FIG. 20 is a side view of another example of a push button system.

With reference to FIGS. 16 and 17, the piezoelectric assembly 104 includes a piezoelectric element 121, e.g. an elongated piece of piezo-ceramic material, which generates an electrical response signal when force is applied thereto, and produces a haptic response, e.g. vibration, when an electrical haptic activation signal 44 is applied thereto. The piezoelectric assembly 104 also includes a support substrate, which can be a printed circuit board (PCB) 122 or any suitably stiff material with some form of printed circuit mounted therein or thereon, mounted in a superposed arrangement with the piezoelectric element 121. The PCB 122, which is mounted at opposite ends thereof, extends longer, e.g. 1.5×-3× longer, than the piezoelectric element 121 beyond each end thereof for suspending the piezoelectric element 121. In some embodiments, the PCB 122 includes a first conductive connector **124*a* and a second conductive connector 124*b*, which extend from a main section of the PCB 122 and into contact with the piezoelectric element 121. A conductive material, e.g. solder, an adhesive or an anisotropic conductive film (ACF), may be used to connect the first and second conductive connectors 124***a* and 124*b* of the piezoelectric element 121 to the PCB 122. To accommodate large conductive connectors 124*a* and 124*b*, the button 103 may comprise a channel 126 extending into the bottom of the button 103. Alternative embodiments do not include large conductive connectors 124*a* and 124*b*, and use other electrically conductive contact material, such as solder, an adhesive or an anisotropic conductive film (ACF) between the piezoelectric element 121 and the PCB 122 for electrical and mechanical connection. In some embodiments, the piezoelectric element 121 can be installed upside down so that the conductive electrodes are in direct contact with the PCB 122.

The PCB 122 forms a composite beam with the piezoelectric element 121, and is configured to enable the uniaxial movement of the piezoelectric element 121 to be translated to biaxial movement. The PCB 122 reacts against the piezoelectric element 121, i.e. the ceramic, in order to create a beam deflection, i.e. arcuate or curved beam deflection, the "smiley" or "sad" face (hatched line in FIG. 4), therefore creating a movement amplification of the piezoelectric element 121. If it was only for the piezoelectric element 121, the movement would be the ceramic shortening, i.e. in the horizontal axis. By introducing a multi-material support, the difference between the contraction of the piezoelectric element 121 and the deflection of the PCB 122: (1) creates movement amplification of the piezoelectric element 121, and (2) enables the usable movement to be along the vertical axis (vs. the horizontal axis of the piezoelectric element 121 alone).

The PCB 122 also has the responsibility of converting the axial shrinkage of the piezoelectric element 121 to a transverse movement. In the same operation, the PCB 122 also acts as a mechanical movement amplification device. A bare ceramic piezo electric element 121 can shrink about 0.1% when subjected to voltage. When bonded to a suitable PCB 122 or other substrate, the deflection can be multiplied, e.g. to ~50 μm, which is now a usable value for haptics. By changing the properties of the PCB 122, the piezoelectric assembly 104 can accept higher forces or greater displacement or accept more deformation before being damaged. Changing the properties of the PCB 122 or the substrate will also change the haptic response properties, i.e. can give more or less displacement/force.

The parameters of the piezoelectric element 121 and, in particular, the PCB 122 have an impact when making such a composite beam. The difference in Young's moduli will change the position of the neutral fiber of the beam, therefore impacting how much the beam can be deformed before the piezoelectric element 121, e.g. the ceramic, sees detrimental tensile strains. Accordingly, the PCB 122 is configured to ensure that the neutral axis (neutral plane or fiber) is at a location that ensures that the brittle ceramic never sees damaging tensile loads when the button 103 is pressed to its maximal stroke.

The differences in Young's moduli will also impact the amount of displacement of the piezoelectric assembly 104 before something bad happens, e.g. the piezoelectric element 121 breaks, the PCB 122 deforms beyond elastic limit or the first and second sensors 129*a* and 129*b* are damaged. When the PCB 122 has a much smaller Young's modulus than the piezoelectric element 121, a greater deflection of the beam for the same force results, but when the PCB 122 has a much larger Young's modulus, a smaller deflection will result, or a much larger force will be required to generate the same deflection. The thicknesses of both materials will have a similar influence; however, changing the thickness of the piezoelectric element 121, e.g. the ceramic, will also change the electrical parameters, e.g. the threshold force of piezoelectric element 121, i.e. how hard you need to push on the button before the software makes the decision to activate the haptic response. A composite beam with a lower Young's modulus than another will require less force to reach the same displacement. The main change related to electrical parameters is the capacitance. The change will then snowball to many things, one being that the same amount of force will generate a different amount of charge, therefore the software parameters will have to be adjusted to get the same force threshold as before.

A ceramic-to PCB adhesive or ACF 128 is used to connect the piezoelectric element 121 to an upper surface of the PCB 122 to provide both a mechanical and electrical connection. A first sensor 129*a* is mounted, e.g. soldered, on the lower surface of the PCB 122 below the end of the piezoelectric element 121 or below an area between an end of the piezoelectric element 121 and an end of the PCB 122, i.e. remote from the piezoelectric element 121, but still able to measure deflection of the piezoelectric element 121 and the PCB 122. A second sensor 129*b* is mounted, e.g. soldered, on the lower surface of the PCB 122 below an opposite end of the piezoelectric element 121 or below an area between an opposite end of the piezoelectric element 121 and an opposite end of the PCB 122, i.e. remote from the piezoelectric element 121, but still able to measure deflection of the piezoelectric element 121 and the PCB 122. The first sensor 129*a* and the second sensor 129*b* are spaced along the longitudinal central axis $P_L$ of the PCB 122 one on each side of the transverse or lateral central axis $P_T$ thereof, ideally equidistant from the transverse axis $P_T$. In general, the first sensor 129*a* is configured to measure a force application, e.g. strain, on one side the central transverse or lateral axes of the piezoelectric element 121 and the PCB 122, and the second sensor 129*b* is configured to measure a force application, e.g. strain, on the opposite side of the transverse or lateral axes of the piezoelectric element 121 and the PCB 122. In some preferred embodiments, the longitudinal central axis $B_L$ of the button 103 is parallel to the longitudinal central axis $P_L$ of the PCB 122. In some preferred embodiments, the lateral or transverse central axis $B_T$ of the button 103 is parallel to and/or superposed and/or aligned with the lateral or transverse central axis Prof the PCB 122. In the illustrated exemplary embodiment, capacitors 130 are provided to the PCB 122 for proper function of first and second sensors 129*a* and 129*b*, but other examples of the first and second sensors 129*a* and 129*b* may not require them. The first and second sensors 129*a* and 129*b* can be strain sensors, e.g. piezoelectric sensors, or simple strain gauges that would be glued on to or built into the PCB 122. The first and second sensors 129*a* and 129*b* may be any form of sensor enabling the measurement or calculation of a quantity, e.g. force or strain, indicating the application of a force on the button 103.

Electrical communication leads 138, e.g. flex PCB connector, extend from one or both ends of the PCB 122 for transmission of electrical signals between a computer processor controller 41, e.g. a driver chip, (see FIG. 10) in the electronic device 102 and the PCB 122, which in turn transmits electrical signals to and from the piezoelectric element 121.

When a user applies a force above an activation threshold, e.g. 300 mN, somewhere on the button 103, the force is transferred from the button 103 to the piezoelectric element 121 and/or the PCB 122 via the curved bottom surface 108 of the button 103. The first and second sensors 129*a* and 129*b* enable the resultant force to be calculated from the resultant first and second strains, respectively, on the piezoelectric element 121 and/or the PCB 122, at or near the line of contact. Accordingly, the computer processor controller 41, e.g. a driver chip, in the electronic device 102 executing computer software stored on non-transitory memory 42 in the electronic device 102 receives first and second electrical signals 43*a* and 43*b* from the first and second sensors 129*a* and 129*b*, respectively, corresponding to the first and second resultant force or strain, and then determines the location of the original force application on the button 103 by comparing the first resultant strain and the second resultant strain. For example, when the first force or strain, i.e. the first electrical signal 43*a*, is greater than the second force or strain, i.e. the second electrical signal 43*b*, then the location of the original force application was at the end of the button 103 closest to the first sensor 129*a*, but when the first force or strain, i.e. the first electrical signal 43*a*, is less than the second force or strain, i.e. the second electrical signal 43*b*, then the location of the original force application was at the end of the button closest to the second sensor 129*b*, and when the first force or strain, i.e. the first electrical signal 43*a*, is substantially equal to the second force or strain, i.e. the second electrical signal 43*b*, then the location of the original force application was at the middle of the button 103. The computer processor controller 41 is then configured to translate the location of the original force application into a resultant action for the electronic device 102, e.g. pushing on one end or the other on the button 103 results in volume up or down, scroll up or down, etc., and pushing in the middle results in on or off, select etc. Accordingly, the push button system 101 offers precision force sensing leading to accurate position calculation of the finger's position and haptic feedback. In use, the computer processor controller 41 is electrically connected with the device controller 51, e.g. system on chip (soc), of the electronic device 102 for exchanging electrical signals therebetween relating to the specific activation activity of the button 103 and any haptic response.

When desired, the electrical haptic activation signal 44, e.g. voltage, may be sent from the computer processor controller 41 to the piezoelectric element 121, which generates a haptic sensation to the user's finger via the button 103. The force activation threshold can be adjusted to trigger different haptic sensations according to different forces and different force locations applied on the button 103. For example: a localized haptic response can be sent from the computer processor controller 41 to the button 103 via the piezoelectric element 121 even at a minimal force, e.g. substantially zero force, from the user's finger. The "low-force" capability makes the button 103 able to deliver a haptic response to the finger even when the finger is exerting a low force, analog to a swipe on a trackpad. Accordingly, when the first sensor 129*a* measures a first resultant force or strain that decreases over time, while the second sensor 129*a* measures a second resultant force or strain that increase over the same time, the computer processor controller 41 determines that a "swipe" motion has been initiated, and a predetermined response can be initiated, e.g. to a system in the electronic device 102, such as the volume or a scroll feature and/or a haptic response.

A first lighter force threshold for the button 103, e.g. about 300 mN, can be configured for gestures, such as a scroll wheel. A second variable middle force threshold, e.g. between about IN to about 3N, can be used to emulate multi-level clicking, for example to copy the sensation provided by the multi-level clicks of the button of a DSLR camera. A third higher force threshold, e.g. more than 3 N, can be used to emulate a mechanical switch. A variable threshold can be used, for example, to scroll faster/slower depending on the force on the button 103. In another example, a stronger click feedback as the volume is increased, or, in a gaming application, the speed of the car depends on how hard the button 103 is pressed, which can, at the same time, provide a haptic feedback when the wheel goes out of the track.

With reference to FIG. 10 again, the present disclosure also relates to a haptic button operation using computer hardware and software separate from the device controller 51, e.g. system on chip (SOC), provided in the electronic device 102 by utilizing the computer processor controller 41 comprising a main piezoelectric driver chip 50 and a micro-controller unit (MCU) companion 52, along with the button 103.

The button 103 aims to replace the conventional phone buttons by providing the same features with less buttons or by providing additional features with the same number of buttons. Mechanical buttons 103 are electrical switches connected to the device controller 51. The buttons 103 are electrically wired to be operational even when the electronic device 102 is turned off or frozen. Typically, electronic devices 102 have between three and four mechanical buttons, such the power key, the volume up key, the volume down key and customizable key. Over the fundamental functions, some critical key combinations are used for unfreezing the system 101 or setting the system 101 in bootloader mode. These features are critical and are generated by the user when the electronic device 102 is down or frozen for the device health management purpose.

Another requirement that is desirable, is the capability to turn on the electronic device 102 after a long period of time, e.g. in a box between the manufacturing line and the end customer purchase. The battery 53 should remain in an acceptable range of charge to operate the electronic device 102, and provide the user with an immediate start up, which means the MCU 52 should spend a very small amount of energy and stay operational.

An object of the present disclosure is to provide the system architecture necessary for supporting the device health management using a haptic button solution with a MCU 52. The system architecture covers the software stored on non-transitory memory and the MCU 52 for use with the button 103.

The MCU 52 emulates the state of the button 103 via a general purpose input/output (GPIO) 54 between the device controller 51 and the main piezoelectric driver chip 50. When the voltage of the GPIO 54 corresponds to the input voltage VDDIO from the voltage regulator 55, the button 103 is released and when the voltage corresponds to the ground, the button 103 is pressed. The MCU 52 adapts the sensing strategy according to the state of the electronic device 102. The MCU 52 sleeps when the electronic device 102 is off, and is awakened when the electronic device 102 is on. The electronic device 102 can be powered on or unfrozen because the MCU 52 is configured to send a voltage on the GPIO 54.

The push button system 101 may include a pivoting button 103 and a conventional power button. The sensing solution for the pivoting button 103 comprises the first and second independent sensors 129*a* and 129*b* beneath the button 1013 and one piezoelectric element 121. On the other hand, the conventional power button may have only one piezoelectric element and no other force sensor.

When the electronic device 102 is powered up, the sensing for the pivoting button 103 is provided by the first and second sensors 129*a* and 129*b*, e.g. the first and second electrical signals 43*a* and 43*b* from the first and second sensors 129*a* and 129*b*, respectively, are polled or fetched by the MCU 52. The haptic click feedback is generated by the piezoelectric element 121 coupled to the pivoting button 103. The power button is emulated by the sensing from the computer processor controller 41 directly contrary to the pivoting button architecture.

When the electronic device 102 is powered down, the first and second sensors 129*a* and 129*b* are deactivated until a small amount of pressure, e.g. 100 mN to 500 mN, preferably 200 mN to 400 mN, is detected on the piezoelectric element 121. The small amount of pressure reading may be performed by a zero-power sensing (ZPS) feature of the main piezoelectric driver chip 50. The main piezoelectric driver chip 50 detects the small amount of pressure and grounds the GPIO 54 between the MCU 52 and main piezoelectric driver chip 50. The GPIO 54 is grounded after the MCU 52 decides to generate a press. The MCU 52 first needs to wake up on this initial pressure signal and wait for the right amount of force for a full press to be detected. This signal wakes up the MCU 52, which wakes up the sensing function of the first and second sensors 129*a* and 129*b*. The MCU 52 can then discriminate which key of the pivoting button 103 is pressed between the volume up and down. For the specific case of the power button, the sensing remains performed by the main piezoelectric driver chip 50 entirely. Accordingly, the light force pressure detection is performed by main piezoelectric driver chip 50; however, the decision to fire the haptic in case of an actual force application detection is performed by the MCU 52.

Figure 21:
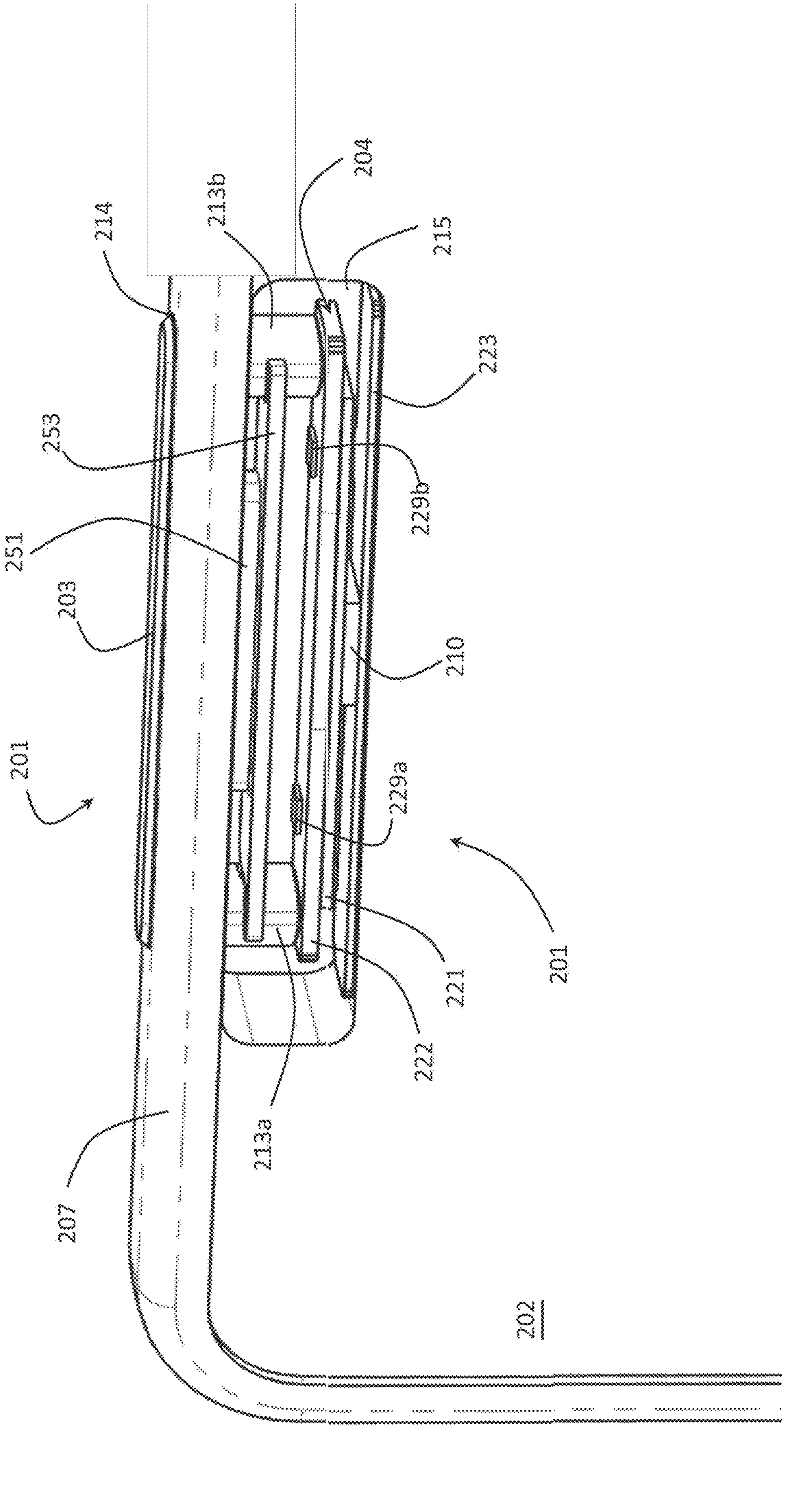
FIG. 21 is an isometric view of the push button system of FIG. 20 mounted in an electronic device.
Figure 22:
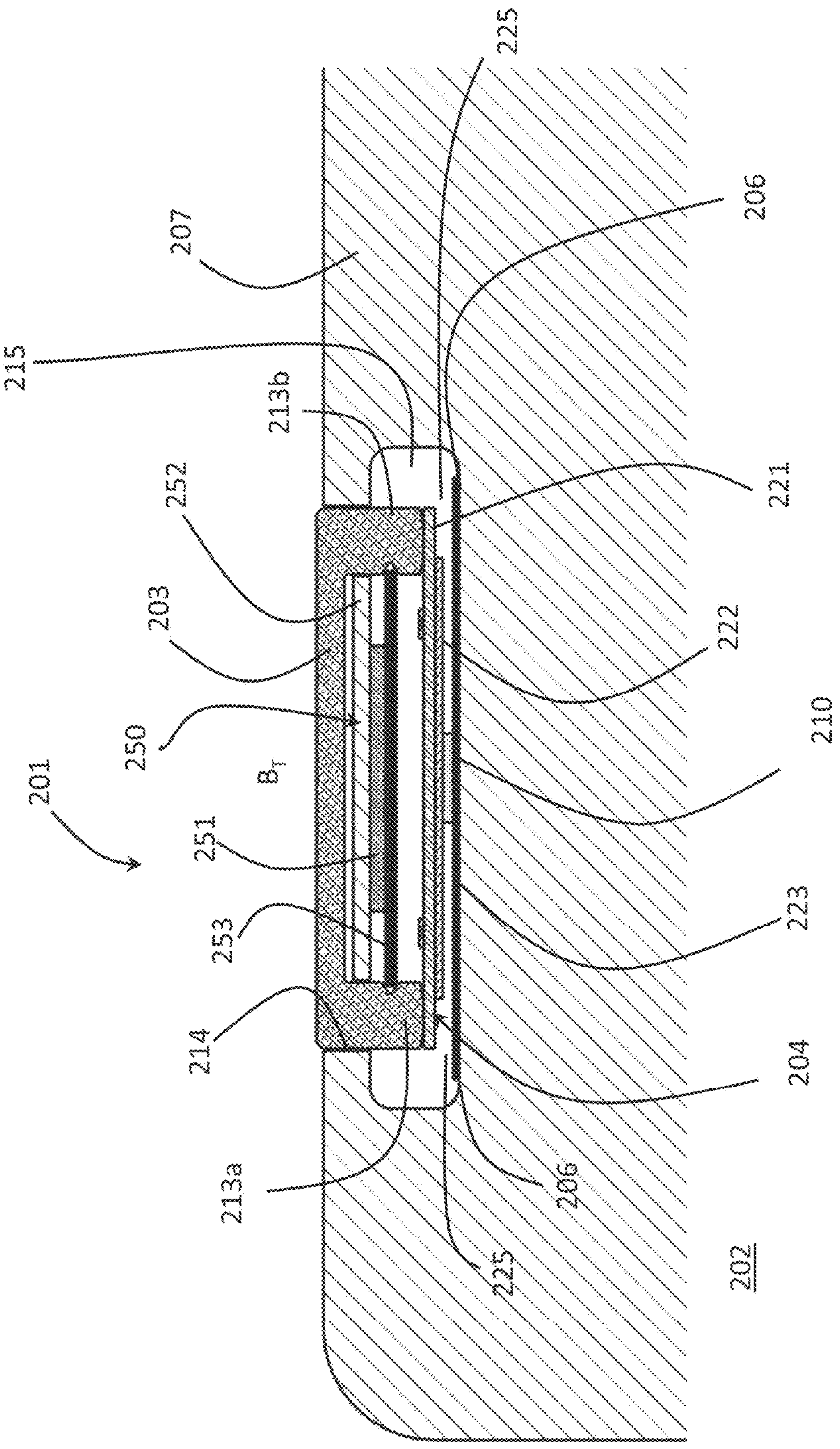
FIG. 22 is a cross-sectional view of the push button system of FIG. 20 mounted in an electronic device.
Figure 23D:
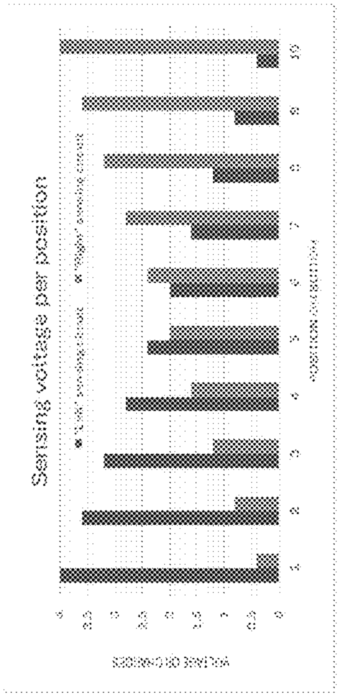
FIG. 23D is a plot of voltage generated by the strain sensors vs position on the button.
Figure 23A:
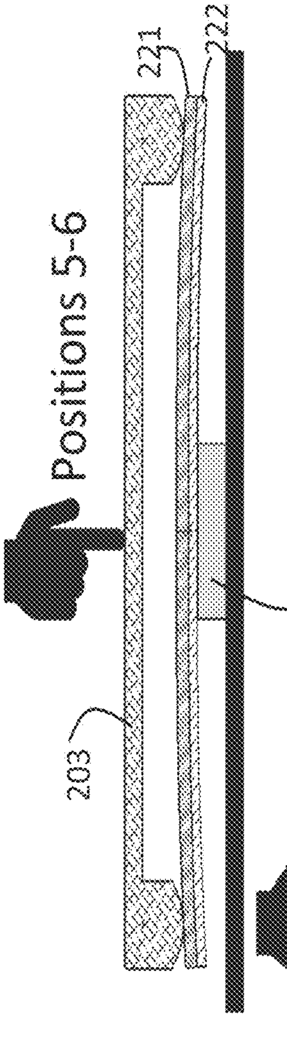
FIGS. 23A to 23C illustrate the push button system of FIG. 20 during use.
Figure 23B:
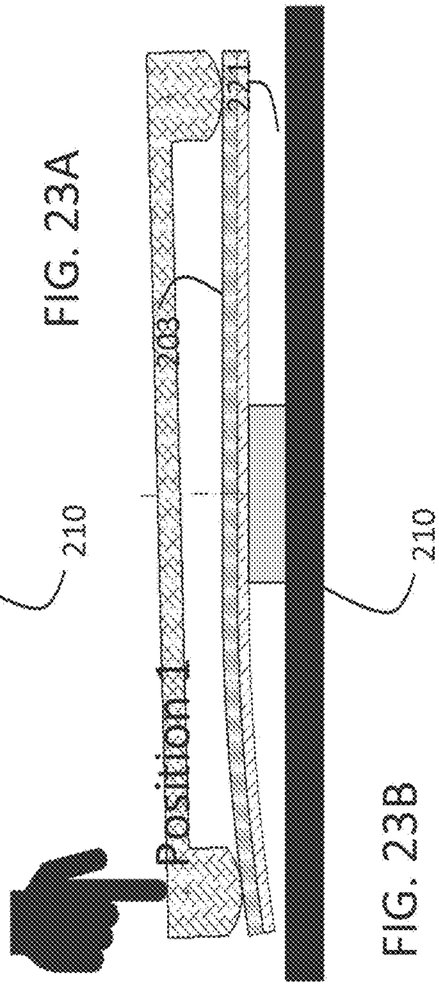
Figure 23C:
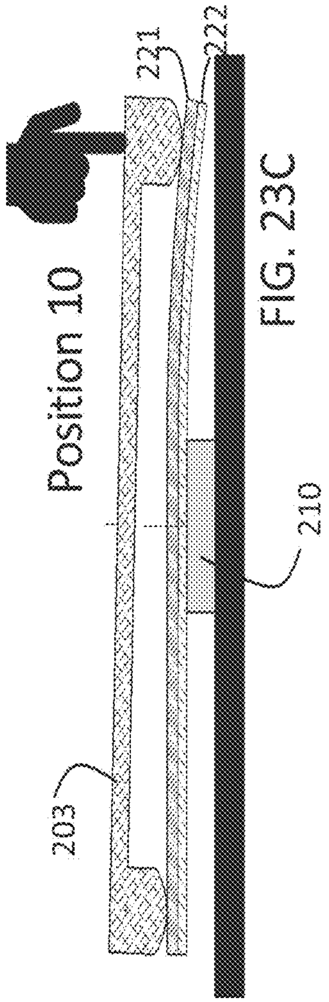

With reference to FIGS. 20 to 30, a push button system 201 for an electronic device 202, such as a smart phone, tablet, laptop computer or steering wheel, includes a pivoting button 203 configured to tilt clockwise (FIG. 23C when a user applies a force, e.g. with a finger, to one end thereof, tilt counterclockwise (FIG. 23B) when a user applies force to an opposite end thereof, as well as reciprocate (FIG. 23A) when a user's applies force in the middle thereof. The push button system 201 also includes a piezoelectric assembly 204, as hereinbefore described with reference to piezoelectric assemblies 4 and 104.

In some exemplary embodiments, the button 203 is pivotally mounted in the outer frame 207 of the electronic device 202 using a faceplate 8, as described hereinbefore. The faceplate 8 can be connected to the outer frame 207 using mechanical fasteners 9, e.g. threaded fastener, or some other attachment means, such as adhesive. Alternatively, the faceplate 8 may be mounted on a base 11 (FIG. 2), which is mounted in a recess 12 in the outer frame 7. Alternatively, the button 203 can be mounted within the outer frame 207 of the electronic device 202, thereby eliminating the need for the faceplate 8 and/or the base 11.

The button 203 includes a first pedestal 213*a* and a second pedestal 213*b* extending outwardly from a bottom surface thereof spaced apart along a longitudinal central axis BI, thereof, and preferably space equidistant on either side of a lateral or transverse central axis $B_T$, configured for contacting the piezoelectric assembly 204. The lateral or transverse central axis $B_T$ could also be known as the pivoting axis, about which the button 203 substantially pivots, e.g. up to 10 μm. The button 203 extends through an opening 214 in the outer frame 207 (or the faceplate 8), into a cavity 215 in the outer frame 207 and into contact with the piezoelectric assembly 204 at two contact points defined by the first and second pedestals 213*a* and 213*b*. In some embodiments, the button 203 is loosely held in the opening 214, i.e. able to rotate and reciprocate, e.g. up and down or in and out of the faceplate 8 and/or outer frame 207.

The piezoelectric assembly 204 is mounted, proximate the middle thereof, to the bottom of the cavity 215, which can be part of the outer frame 207 or the electronic device 202, using some suitable structural mount 210, e.g. metal, plastic or just an adhesive. The opposite ends of the piezoelectric assembly 204 are suspended above the bottom of the cavity 215 enabling a slight deflection thereof, with a maximum deflection at the ends, as per standard composite beam deflection equations. The ends of the piezoelectric assembly 204 are suspended above a hard stop 206 with a gap 225 therebetween, e.g. 50 μm to 500 μm, preferably 100 μm to 300 μm, to prevent the piezoelectric assembly 204 from deforming beyond a safe limit, i.e. before damaging the piezoelectric assembly 204. If, for example, a user drops the device 202 and all of the force goes through the button 203, once the piezoelectric assembly 204 bends beyond the distance of the gap, the ends of the piezoelectric assembly 204 then contacts the hard stop 206, whereby any force increase will not result in a strain increase, thereby protecting the piezoelectric assembly 204 from damage. The gap 225 is determined by how much the piezoelectric element can be deformed. The maximum deformation is the result of the machining tolerances+the gap. Accordingly, the gap 225 is sized and configured to: 1) allow haptics, i.e. too small of a gap 225 will hinder haptics, and 2) prevent damage to the piezoelectric assembly 204, i.e. too big of a gap 225 will allow damage to occur.

The piezoelectric assembly 204 (similar or identical to piezoelectric assemblies 4 and 104) includes a piezoelectric element 221, e.g. an elongated piece of piezo-ceramic material, which generates an electrical response signal when force is applied thereto, and produces a haptic response, e.g. vibration, when the electrical haptic activation signal 44 is applied thereto. The piezoelectric assembly 204 also includes a support substrate, which can be a printed circuit board (PCB) 222 or any suitably stiff material with some form of printed circuit mounted therein or thereon, mounted in a superposed arrangement with the piezoelectric element 221. The PCB 222, which is mounted on the mount 210, extends longer, e.g. 1.1×-3× longer, than the piezoelectric element 221 beyond each end thereof for supporting the piezoelectric element 221. The PCB 222 is electrically connected to power and control electronics in the electronic device 202 via any suitable connectors. In the illustrated example embodiment of FIG. 24, a flexible printed circuit board (FPCB) 223 includes one or more tabs 224, which extend upwardly in a curved shape from a main section of the FPCB 223, into contact with the piezoelectric element 221 and/or the PCB 222, i.e. parallel with the main section FPCB 223. A conductive material, e.g. adhesive or anisotropic conductive film (ACF), may be used to connect the one or more tabs 224 and 224 to the PCB 222 and/or the piezoelectric element 221.

The support substrate or PCB 222 forms a composite beam with the piezoelectric element 221, and is configured to enable the uniaxial movement of the piezoelectric element 221 to be translated to biaxial movement. The PCB 222 can comprise a single material or also comprise a composite beam, such as a bi-metallic material, e.g. 0.2/0.3 mm of brass/stainless, configured to provide the desired structural characteristics, e.g. strength, flexibility, Young's modulus, etc.

The purpose of the support substrate or PCB 222 is to react against the piezoelectric element 221, i.e. the ceramic, in order to create a beam deflection, i.e. cantilevered beam deflection (see FIGS. 23A-23C), therefore creating a movement amplification of the piezoelectric element 221. If it was only for the piezoelectric element 221, the movement would be the ceramic shortening, i.e. in the horizontal axis. By introducing a multi-material support substrate or PCB 222, the difference between the contraction of the piezoelectric element 221 and the deflection of the support substrate or PCB 222: (1) creates movement amplification of the piezoelectric element 221, and (2) enables the usable movement to be along the vertical axis (vs the horizontal axis of the piezoelectric element 221 alone).

The support substrate or PCB 222 has the responsibility of converting the axial shrinkage of the piezoelectric element 221 to a transverse movement. In the same operation, the support substrate or PCB 222 also acts as a mechanical movement amplification device. A bare ceramic piezo electric element 221 can shrink about 0.1% when subjected to voltage. When bonded to a suitable support substrate or PCB 222, the deflection can be multiplied, e.g. to ~50 μm, which is now a usable value for haptics. By changing the properties of the support substrate or PCB 222, the piezoelectric assembly 204 can accept higher forces or greater displacement or accept more deformation before being damaged.

The parameters of the piezoelectric element 221 and, in particular, the support substrate or PCB 222 have an impact when making such a composite beam. The difference in Young's moduli will change the position of the neutral fiber of the beam, therefore impacting how much the beam can be deformed before the piezoelectric element 221, e.g. the ceramic, sees detrimental tensile strains. Accordingly, the support substrate or PCB 222 is configured to ensure that the neutral axis (neutral plane or fiber) is at a location that ensures that the brittle ceramic never sees damaging tensile loads when the button 203 is pressed to its maximal stroke.

The differences in Young's moduli will also impact the amount of displacement of the piezoelectric assembly 204 before something bad happens, e.g. the piezoelectric element 221 breaks, the support substrate or PCB 222 deforms beyond elastic limit, some adhesive gives up, any sensors 29*a* and 29*b* break because of overload. When the support substrate or PCB 222 has a much smaller Young's modulus than the piezoelectric element 221, a greater deflection of the beam for the same force results, but when the support substrate or PCB 222 has a much larger Young's modulus, a smaller deflection will result, or a much larger force will be required to generate the same deflection. The thicknesses of both materials will have a similar influence; however, changing the thickness of the piezoelectric element 221, e.g. the ceramic, will also change the electrical parameters, e.g. the threshold force of piezoelectric element 21, i.e. how hard you need to push on the button before the software makes the decision to activate the haptic response. A composite beam with a lower Young's modulus than another will require less force to reach the same displacement.

A ceramic-to metal adhesive may be used to connect the piezoelectric element 221 to an upper or lower surface of the support substrate or PCB 222, while a metal to FBCB adhesive may be used to connect the PCB 222 to a lower surface of the support substrate (if required). A first sensor 229*a* (similar to sensors 29*a* and 129*a*) is mounted, e.g. soldered, on the upper or lower surface of the PCB 222 between an end of the piezoelectric element 221 and the mount 210, configured to measure deflection of one end of the piezoelectric element 221 and the support substrate or PCB 222. A second sensor 229*b* (similar to sensors 29*b* and 129*b*) is mounted, e.g. soldered, on the upper or lower surface of the PCB 222 between an opposite end of the piezoelectric element 221 and the mount 210 configured to measure deflection of the opposite end of the piezoelectric element 221 and the support substrate or PCB 222. The first sensor 229*a* and the second sensor 229*b* are spaced along the longitudinal central axis $P_L$ of the PCB 222 one on each side of the transverse axis $P_T$ thereof, ideally equidistant from the transverse axis Pr. In general, the first sensor 229*a* is configured to measure a force application, e.g. strain, on one side the central transverse $P_T$ of the piezoelectric element 221 and the PCB 222 caused by forces on the first pedestal 213*a*, and the second sensor 229*b* is configured to measure a force application, e.g. strain, on the opposite side of the transverse axes $P_T$ of the piezoelectric element 221 and the PCB 222 caused by the second pedestal 213*b*. In some preferred embodiments, the longitudinal central axis $B_L$ of the button 203 is parallel to the longitudinal central axis $P_L$ of the PCB 222. In some preferred embodiments, the lateral or transvers central axis $B_T$ of the button 203 is parallel to and/or superposed and/or aligned with the lateral or transverse central axis Prof the PCB 222. In the illustrated exemplary embodiment, capacitors 230 are provided to the PCB 222 for proper function of first and second sensors 229*a* and 229*b*, but other examples of the first and second sensors 229*a* and 2229*b* may not require them. The first and second sensors 229*a* and 229*b* can be strain sensors, e.g. piezoelectric sensors, or simple strain gauges that would be glued on to the support substrate or PCB 222. In some embodiments, the first and second sensors 229*a* and 229*b* can be the piezoelectric element 221 itself by capturing the electrical signals generated by the piezoelectric element 221 corresponding to the force or strain generated at opposite ends thereof. The first and second sensors 229*a* and 229*b* may be any form of sensor enabling the measurement or calculation of a quantity, e.g. force or strain, indicating the application of a force on the button 203. By calibrating each of the first and second strain sensors 229*a* and 229*b* individually, the measured strain can be correlated by the computer processor controller 41 (FIG. 10) with a known force applied at a known location. FIG. 23D illustrates a graph of voltage or charges for the first strain sensor 229*a* and the second strain sensor 229*b* vs the corresponding position on button 203 an example of how the computer processor controller 41 interprets the force (or strain) readings of the first and second strain sensors 229*a* and 229*b* for a corresponding position on the button 203, which enables the computer processor controller 41 to execute the action corresponding to the position, e.g. volume up, volume down, on, off, enter etc.

Electrical communication leads extend from each end of the FPCB 223 for transmission of electrical signals between a computer processor controller 41, e.g. a driver chip, in the electronic device 202 and the PCB 222, which in turn transmits electrical signals to and from the piezoelectric element 221.

When a user applies a force above an activation threshold, e.g. 300 mN, somewhere on the button 203, the force is transferred from the button 203 to the piezoelectric element 221 and/or the support substrate or PCB 222 via the first and second pedestals 213*a* and 223*b*. The first and second sensors 229*a* and 229*b* enable the resultant first and second forces, respectively, to be calculated from the resultant first and second strains, respectively, on the piezoelectric element 221 and/or the support substrate or PCB 222, at or near the two points of contact. Accordingly, the computer processor controller 41, e.g. a driver chip, in the electronic device 202 executing computer software stored on non-transitory memory 42 in the electronic device 202 receives first and second electrical signals 43a and 43b from the first and second sensors 229a and 229b, respectively, corresponding to the first and second resultant force or strain, and then determines the location of the original force application on the button 203 by comparing the first resultant force or strain and the second resultant force or strain. For example, when the first force or strain, i.e. the first electrical signal 43a, is greater than the second force or strain, i.e. the second electrical signal 43b, then the location of the original force application was at the end of the button 203 closest to the first sensor 229a, but when the first force or strain, i.e. the first electrical signal 43a, is less than the second force or strain, i.e. the second electrical signal 43b, then the location of the original force application was at the end of the button closest to the second sensor 229b, and when the first force or strain, i.e. the first electrical signal 43a, is substantially equal to the second force or strain, i.e. the second electrical signal 43b, then the location of the original force application was at the middle of the button 203. The computer processor controller 41 is then configured to translate the location of the original force application into a resultant action for the electronic device 202, e.g. pushing on one end or the other on the button 203 results in volume up or down, scroll up or down, etc., and pushing in the middle results in on or off, select etc. Accordingly, the push button system 201 offers precision force sensing leading to accurate position calculation of the finger's position and haptic feedback. In use, the computer processor controller 41 is electrically connected with the device controller 51, e.g. system on chip (soc), of the electronic device 202 for exchanging electrical signals therebetween relating to the specific activation activity of the button 203 and any haptic response.

When desired, the electrical haptic activation signal 44, e.g. voltage, may be sent from the computer processor controller 41 to the piezoelectric element 221, which generates a haptic sensation to the user's finger via the button 203. The force activation threshold can be adjusted to trigger different haptic sensations according to different forces and different force locations applied on the button 203. For example: a localized haptic response can be sent from the computer processor controller 41 to the button 203 via the piezoelectric element 221 even at a minimal force, e.g. substantially zero force, from the user's finger. The "zero-force" capability makes the button 203 able to deliver a haptic response to the finger even when the finger is exerting a low force, analog to a swipe on a trackpad. Accordingly, when the first sensor 229a measures a first resultant force or strain that decreases over time, while the second sensor 229a measures a second resultant force or strain that increase over the same time, the computer processor controller 41 determines that a "swipe" motion has been initiated, and a predetermined response can be initiated, e.g. to a system in the electronic device 202, such as the volume or a scroll feature and/or a haptic response.

A first lighter force threshold for the button 203, e.g. about 300 mN, can be configured for gestures, such as a scroll wheel. A second variable middle force threshold, e.g. between about IN to about 3N, can be used to emulate multi-level clicking, for example to copy the sensation provided by the multi-level clicks of the button of a DSLR camera. A third higher force threshold, e.g. more than 3 N, can be used to emulate a mechanical switch. A variable threshold can be used, for example, to scroll faster/slower depending on the force on the button 203.

The use of various geometries of the button 203, 203' and 203", e.g. different locations of the first and second pedestals 213a and 213b, (see FIGS. 6-9 for examples) enables a tradeoff between the size of the haptic response and the sensitivity of the sensing of the first and second sensors 229a and 229b. For example: the further the first and second pedestals 213a and 213b are from the central lateral axis $B_T$ of the button 203, the better the sensitivity, because the first and second pedestals 213a and 213b are closer to the first and second sensors 229a and 229b, and undergo less deflection from the piezoelectric element 221 and the support substrate or PCB 222; however, the closer the first and second pedestals 213a and 213b are to the central lateral axis $B_T$, the stronger the haptic response because of a greater deflection of the piezoelectric element 221 and support substrate or PCB 222.

Accordingly, a substitution for different buttons with different distances between the first and second pedestals 213a and 213b enables a wide range of sensitivities and haptic responses. Alternatively, a button 203 with adjustable or repositionable first and second pedestals 213a and 213b enables the manufacturer or the user to adjust the haptic response and sensitivity, as they wish. The tabs 224 are configured in length to make sure that the strain from the fold gets dissipated in the material to minimize the influence of the fold on the first and second sensors 229a and 229b.

Figure 24:
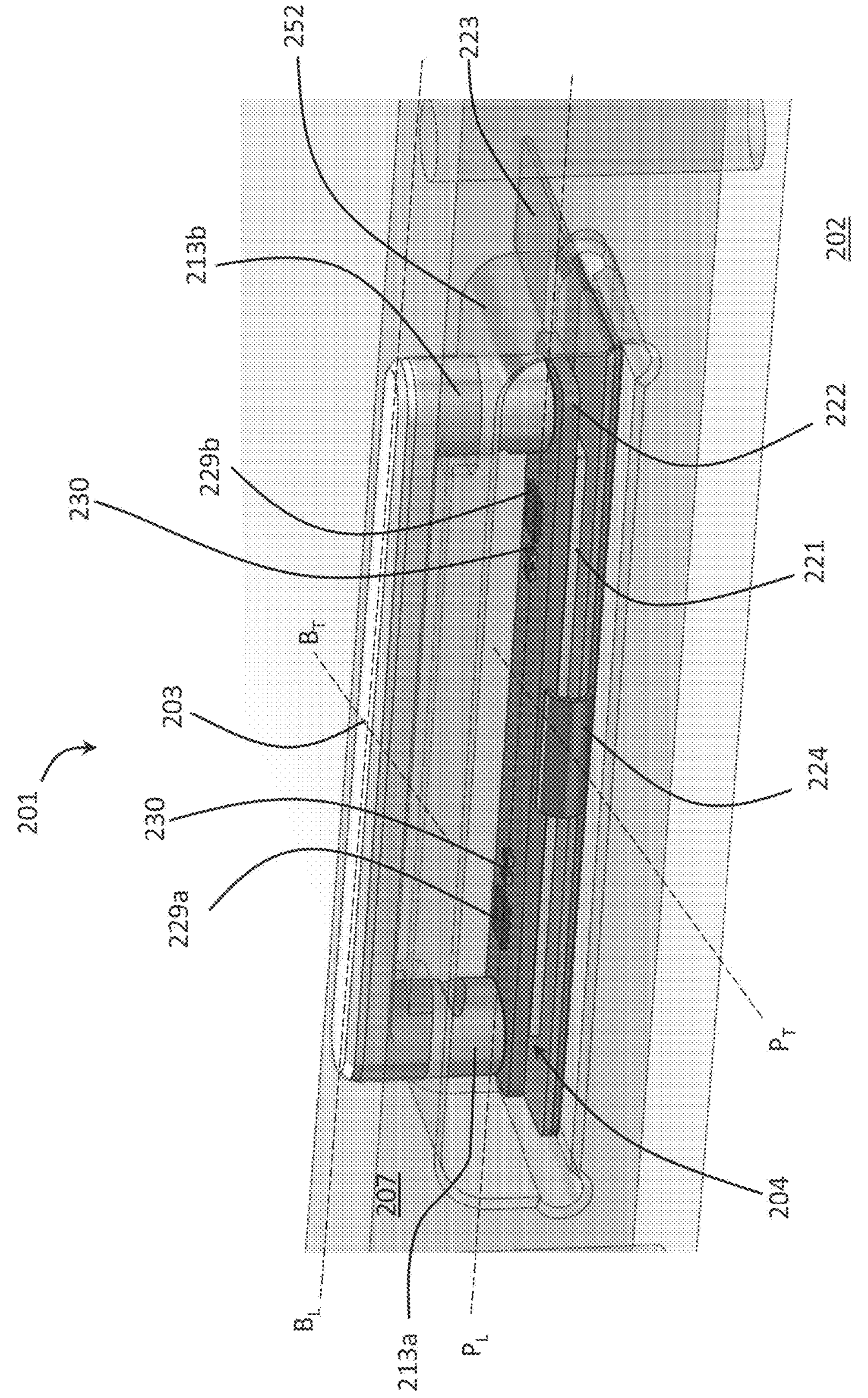
FIG. 24 is an isometric view of another example of a push button system.
Figure 25:
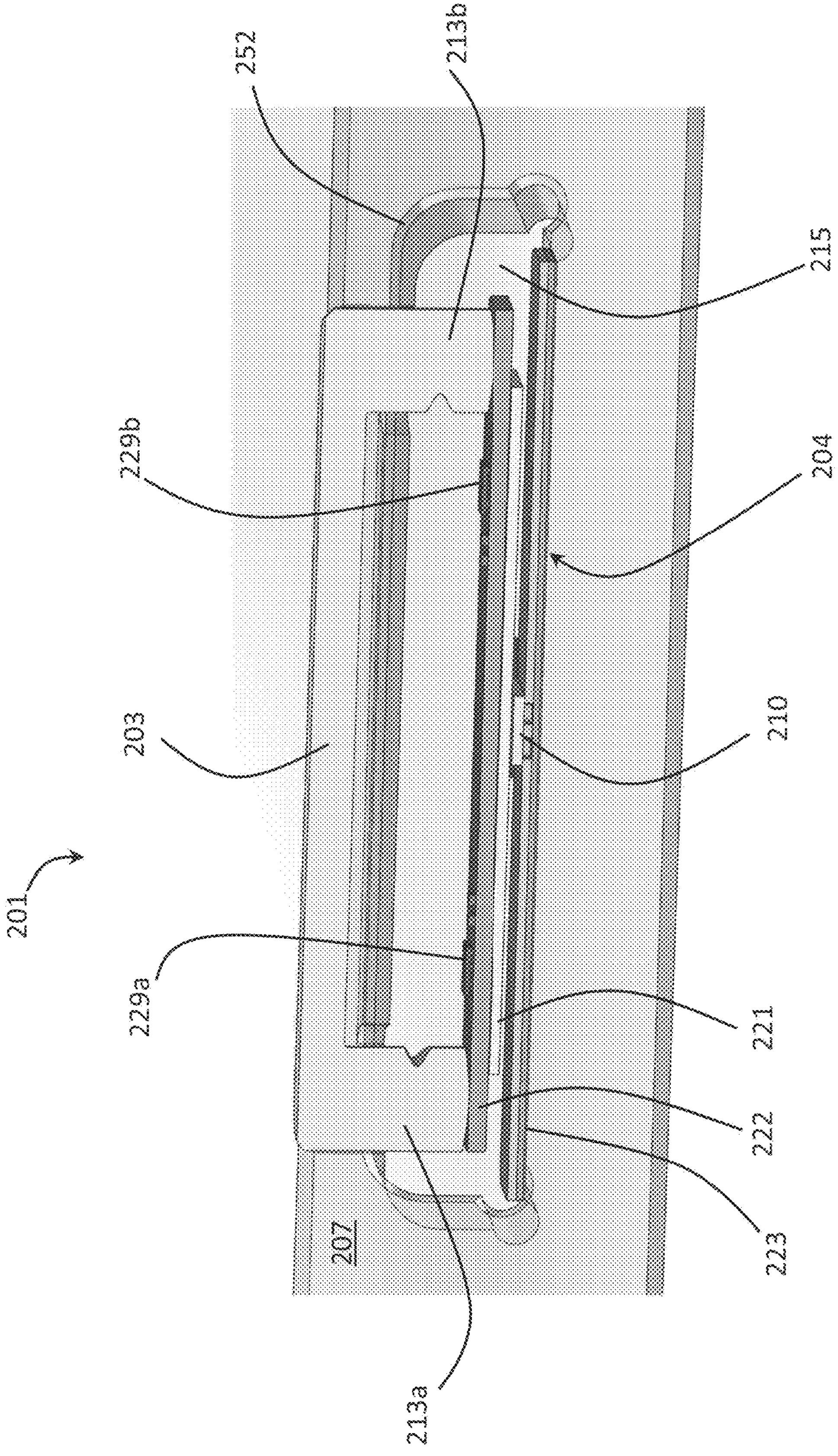
FIG. 25 is a cross-sectional view of the push button system of FIG. 24.

With reference to FIGS. 21, 22 and 24, some embodiments include a preload force applicator 250 configured for applying a preload force on the piezoelectric assembly 204, to ensure the button 203 i.e. the first and second pedestals 213a and 213b, is in contact with and applies a minimal force on the piezoelectric assembly 204 at all times. In the example embodiment illustrated in FIGS. 21 and 22, the preload force applicator 250 includes an elastic or resilient material 251, e.g. sponge or foam, extending between a first support 252 on the housing of the electronic device 202, e.g. the outer frame 207, and a second support 253 on the button 203, e.g. a plate extending between the first and second pedestals 213a and 213b. The opening 214 comprises two holes extending through the outer frame 207 into the cavity 215 for receiving the first and second pedestals 213a and 213b, respectively, and a recessed section for receiving the body of the button 203. The bottom of the recessed section, e.g. a section of the outer frame 207, is spaced apart from the lower surface of the button 203 enabling the button 203 to move up and down, as well as rotate. The bottom of the recessed section may also define the first support 252, whereby an outer surface of the first support 252 is the bottom of the recessed section and an inner surface of the first support is in contact with the resilient material 251. The lower surface of the recessed section, e.g. the outer surface of the first support 252, can also act as a hard stop preventing the button from being pushed too far and damaging the piezoelectric assembly 204, e.g. during a fall. In the example embodiment illustrated in FIGS. 24 and 25, the first support 252 is a separate element, e.g. a metal or plastic insert, mounted in the cavity 215. The resilient material 251 and the second support 253 can be the same or similar to the resilient material 251 and the second support 253 in the previous embodiment, i.e. the plate extending between the first and second pedestals 213a and 213b supporting the resilient material 251 against the first support 252 biasing the button 203 into contact with the piezoelectric assembly 204

Figure 26:
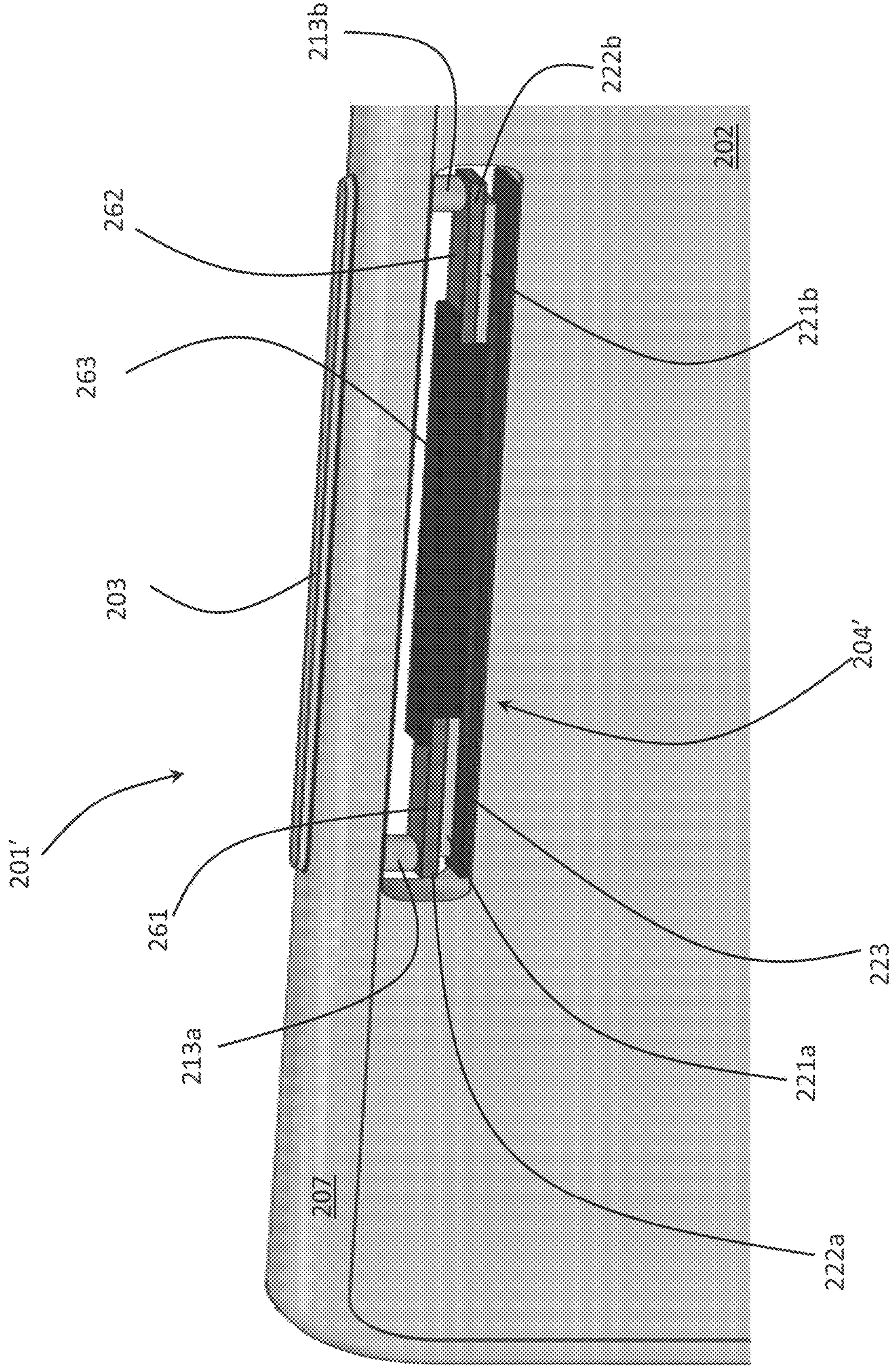
FIG. 26 is an isometric view of another example of a push button system.
Figure 27:
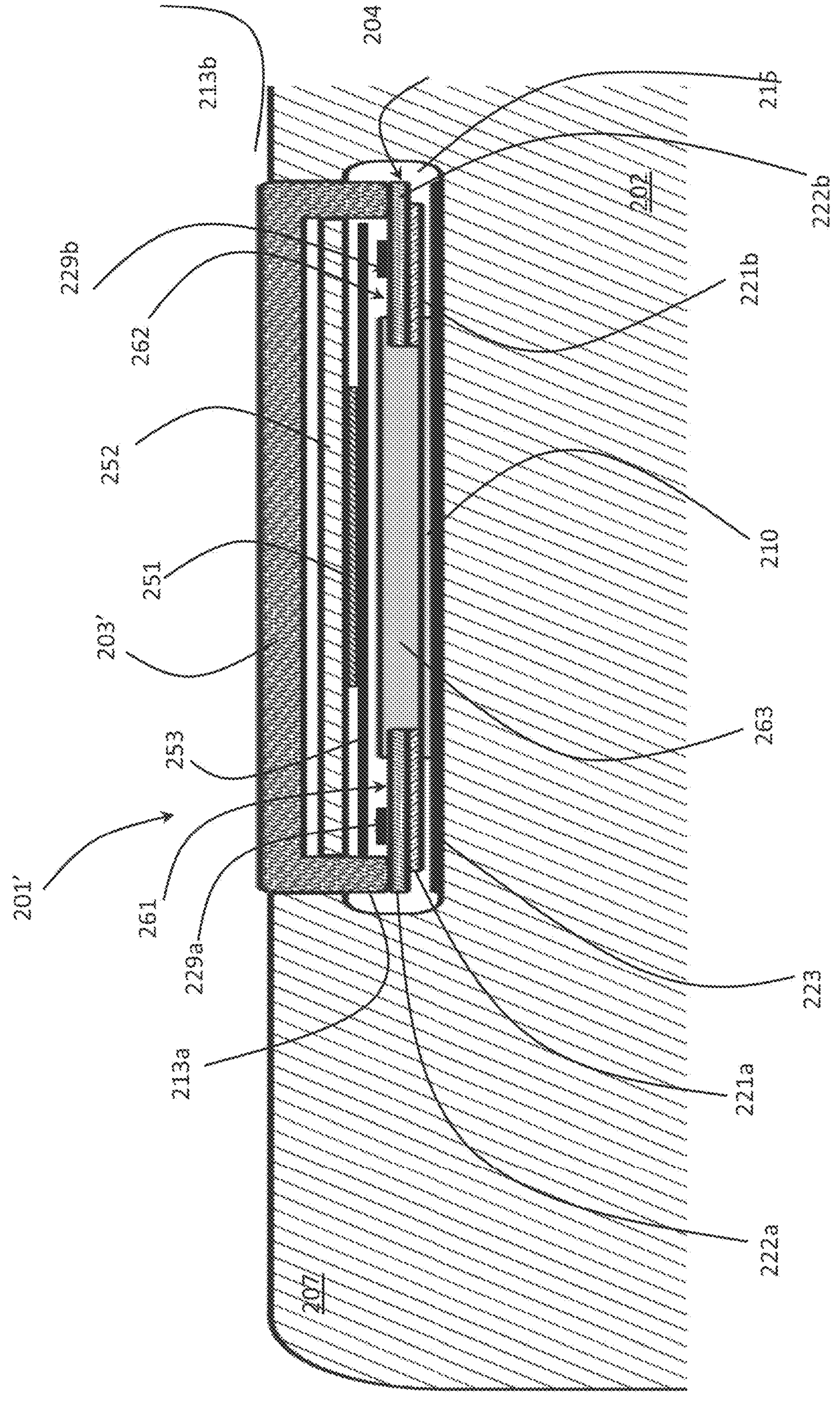
FIG. 27 is a side view of the push button system of FIG. 26.
Figure 28:
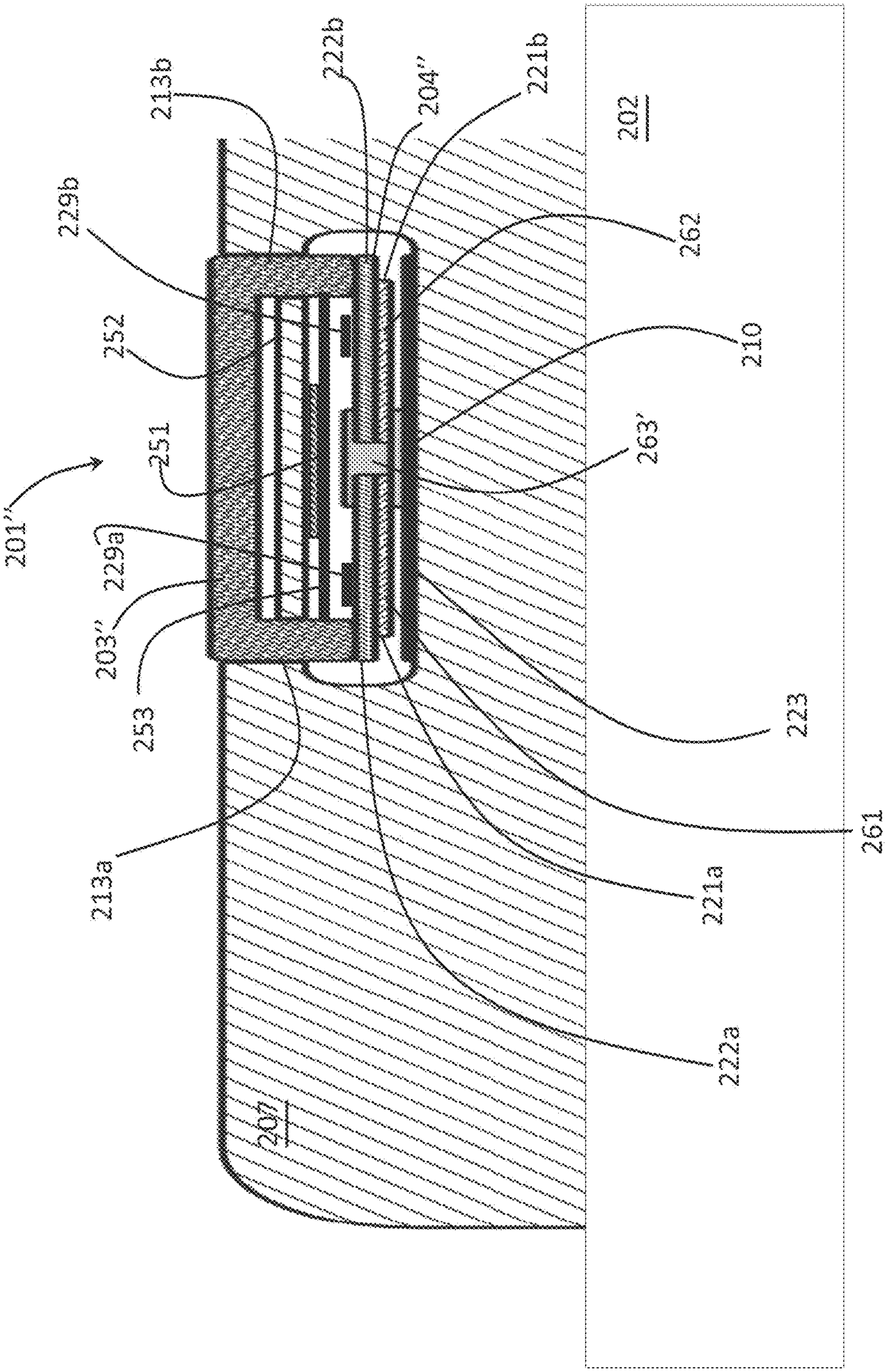
FIG. 28 is an isometric view of another example of a push button system.

With reference to FIGS. 26-28, a push button system 201' or 201" includes piezoelectric assemblies 204' or 204" for push buttons 203' and 203", respectively, which are separated into a first (left) section 261 with the first sensors 229a mounted thereon, and a second (right) section 262 with the second sensors 229b mounted thereon. The first section 261 includes a first piezoelectric element section 221a and a first PCB section 222*a*, and the second section 262 includes a second piezoelectric element section 221*b* and a second PCB section 222*b*. Both the first section 261 and the second section 262 form cantilevered beams extending from a central bracket 263 (FIG. 26-27) or 263' (FIG. 28) mounted on the mount 210. The central bracket 263 or 263' (FIG. 28) is preferably between 25 mm and 50 mm long. In the example embodiment illustrated in FIGS. 26 and 27, the button 203' is longer than the button 203 (FIG. 20-25) or 203" (FIG. 28), whereby the central bracket 263 is longer, i.e. in longitudinal direction, than the central bracket 263' providing similar sensitivity readings on the first and second sensors 229*a* and 229*b*, and a similar vibrational response when the first or second piezoelectric element sections 221*a* or 221*b* are activated. In the example embodiment illustrated in FIG. 28, the central bracket 263' is shorter than the central bracket 263 enabling the first section 261 and the second section 262 to bend and behave relatively the same as the other versions of the piezoelectric assembly 204, thereby providing the same vibrational response when the first and/or second piezoelectric element sections 221*a* or 221*b* are activated, and the same sensitivity in the first and second sensors 229*a* and 229*b*. Accordingly, the push button system 201 can be adapted for various sizes of buttons 203 using the same first and second sensors 229*a* and 229*b*, along with the same response parameters used by the software.

In a conventional piezoelectric element a plurality of layers of piezoelectric material act as one when they are connected. Accordingly, during a haptic response, the layers of piezoelectric material are electrically activated together, and in a sensing mode under pressure from a user, the layers of piezoelectric material generate charges, based on strain, which are all accumulated in the same circuit. However, there are some limitations and issues with this typical configuration. First, it is not possible to discern where the user input is located on the actuator, in particular when the actuator is of consequent form factor in length VS width. Secondly, when the same circuit is used for sensing and driving, the latter event dramatically disrupts the charge state of the piezoelectric elements. Typically, the actuation voltage is much higher than the voltage generated by the charges during user input. The consequence is that if a haptic event is triggered while tracking the sensing status, the reference is lost momentarily and is very difficult to retrack due to hysteresis, residual stresses (thus more charges), the fact the sensing event kept evolving, and other non-linearities. Separating the two actions (haptic and sensing) on distinct electrical circuit solves most of these concerns while eliminating the need for outside sensors and additional electronics.

Figure 29:
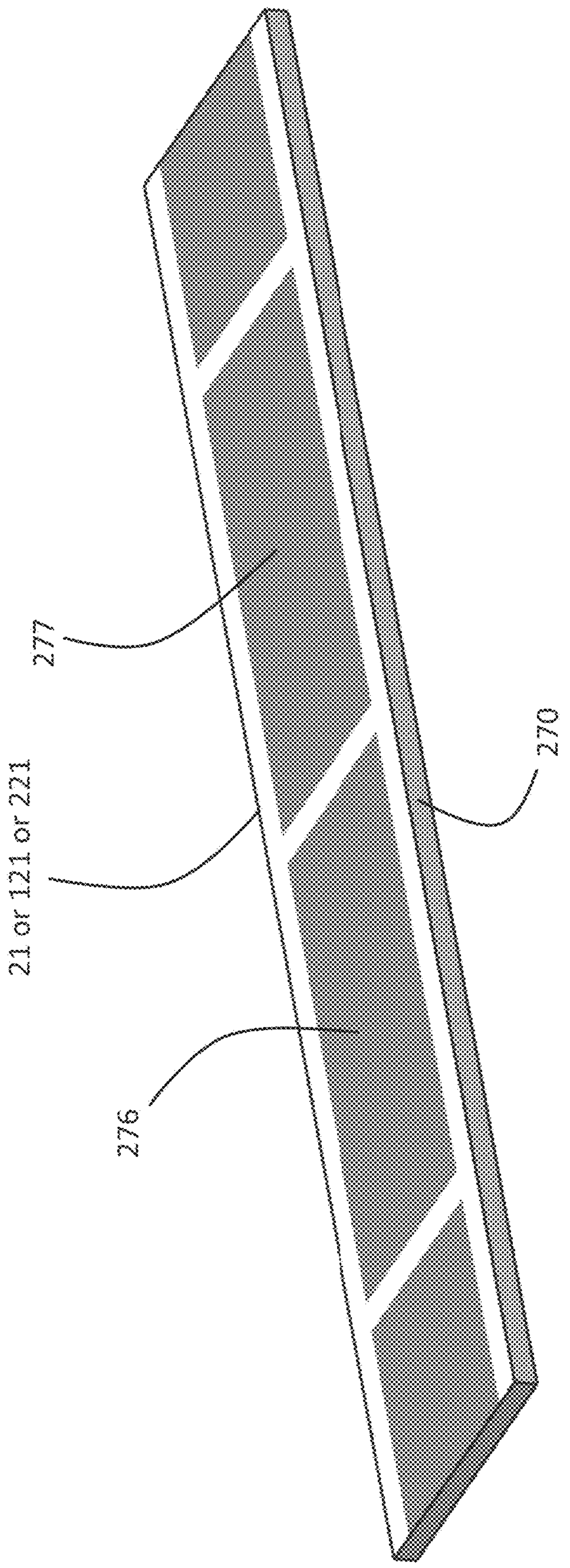
FIG. 29 is an isometric view of a piezoelectric element of any of the aforementioned push button systems.
Figure 30:
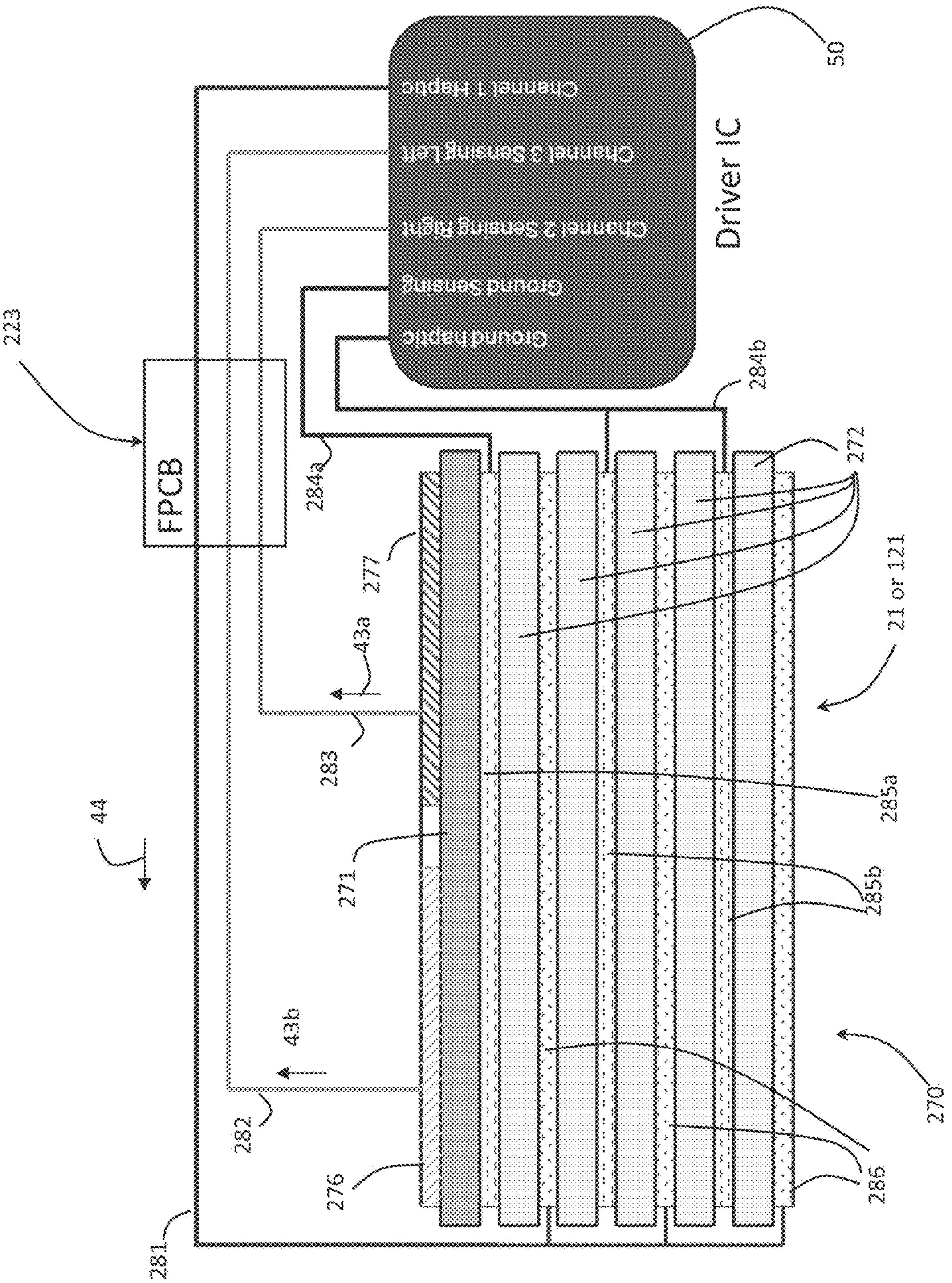
FIG. 30 is a cross-sectional view of the piezoelectric element of FIG. 29.

With reference to FIGS. 29 and 30, in some embodiments, the piezoelectric element 21 or 121 or 221 comprises a multi-layer piezoelectric stack 270 including one or more sensing piezoelectric material layers 271, and one or more, preferably a plurality of haptic piezoelectric-material layers 272. The multi-layer piezoelectric stack 270 is configured to provide a plurality of electrical channels, e.g. a first channel 281 for haptic response signal, a second channel 282 for the first (right) sensor 229*a*, and a third channel 283 for the second (left) sensor 229*b*. Accordingly, the first sensor 229*a* and the second sensor 229*b* are comprised of the sensing piezoelectric material layer 271 without the need of strain gauges. A first electrical contact 276 is mounted on one side the sensing piezoelectric material layer 271 in the second channel 282, and a second electrical contact 277 is mounted on the opposite side the sensing piezoelectric material layer 271 in the third channel 283. A first ground connection 284*a* is connected to a first one or more negative electrode layers 285*a* provided on a grounded (negative) side of the sensing piezoelectric-material layer 271 forming the second (sensing) channel. A second ground connection 284*b* is connected to a second one or more negative electrode layers 285*b*, which are provided on grounded (negative) sides of the haptic piezoelectric-material layers 272. In some embodiments, the first ground connection 284*a* and the second ground connection 284*b* are connected together to a single ground, whereby all the negative electrode layers 285*a* and 285*b* are connected to the same ground connection. A plurality of positive electrode layers 286 are provided on positive sides of the haptic piezoelectric-material layers 272. The first one or more negative electrode layers 285*b* are all connected to the ground connection 284*b*, and the first one or more positive electrode layers 286 are connected to the haptic piezoelectric-material layers 272 forming the first (haptic) channel 281. Each haptic piezoelectric-material layer 272 has a negative electrode layer, e.g. the first or second one or more negative electrode layers 285*a* or 285*b*, above or below, and a positive electrode layer 286 above or below. The first one or more negative electrode layers 285*a* separates the sensing piezoelectric material layer 271 from the plurality of haptic piezoelectric-material layers 272.

The negative electrode layers 285*a* and 285*b* and the positive electrode layers 286 are typically very thin, e.g. less than 10 μm, layers of conductive material, e.g. conductive metals, such as one or more of silver, copper or other suitable metal, but can be any suitable thickness depending on manufacturing and application requirements. When mechanical strain occurs in the piezoelectric element 21, 121 or 221, electrical charges are generated, i.e. the piezoelectric effect, therein, creating an electric field in an essentially non-conductive material. When the sensing piezoelectric-material layer 271 or the haptic piezoelectric-material layers 272 are connected to an electrical circuit, charges will accumulate at the positive electrode layers 286 when a force is applied to the piezoelectric element 21 or 121, and leave the stack 270 as the electric signals 43*a* and 43*b* via the first electrical contact 276 and the second electrical contact 277, respectively. Any electrical signals leaving via the first channel 281 can be ignored or suppressed. For the haptic response, an electrical field is generated in the stack 270 by creating a voltage differential at the poles of the ceramic, i.e. on the positive electrode layers 286 and the negative electrode layers 285 with the electrical haptic activation signal 44.

When there are many sensing piezoelectric-material layers 271 or haptic piezoelectric-material layers 272, or more than one electrical contact in one piezoelectric-material layer, different behavior will be achieved depending on how the piezoelectric-material layers 271 and 272 are connected together. Connections between piezoelectric-material layers 271 and 272 can be parallel, in series, made inside the stack 270 or outside. They can all be connected to the same IC channel or different channels.

The individual channels 281-283 are electrically connected to the main piezoelectric driver chip 50 by the FPCB 223 for transmitting the first and second electrical signals 43*a* and 43*b* from the first and second sensors 229*a* and 229*b*, and for receiving the electrical haptic activation signal 44.

In the case of an electronic device, such as a smart phone or tablet, directly detecting the user's input position on a button 3, 103 or 203 would be an interesting simplifying edge for integration and manufacturing. As shown in FIG. 30, the multi-layer piezoelectric stack 270 includes one or more sensing layers 271, superposed with one or more, preferably a plurality of haptic layers 272. Preferably, the sensing layers 271 are comprised of the same material as the haptic layers 272, but they could be different. Moreover, there could be a plurality of sensing channels, which is a matter of generating more or less charges based on strain and electrical requirements for proper sensor design.

In a sensing mode, the strain would be read by only the sensing channels 282 and 283, while disregarding the charges that are also existing on the haptic channel 281. Ideally, the sensing layer 271 is placed in the stack 270 to maximize the number of charges in relation to a unit of force. In the case of a piezoelectric element 21, 121 or 221 used as a beam in bending, this ideally would be one of the outermost layers as dictated by the strength of material behavior of beams.

Having two separate electrical circuits or channels on the same ceramic layer, i.e. sensing layer 271, enables position detection when used in anyone of the aforementioned embodiments. Unless the user is pressing exactly in the center of the piezoelectric stack 270, the strain between the second channel 282 and the third channel 283 will be different, resulting in different charge generations. As with the external sensors 29*a* and 29*b* described earlier, an algorithm executed by the computer processor controller 41 can compute the resulting position of the force application based on the differentiation of charges between the second and third channels 282 and 283.

When the haptic layers 272 are activated, the sensing layer 271 will also deform and generate strain, thus electrical charges, which are considered parasitic noise in relation to tracking position and sensing force. However, the remaining noise can be treated specifically on the first channel 281 via the algorithm and the computer processor controller 41.

FIG. 29 shows a possible layout of the first and second electrodes 276 and 277 on the surface of the piezoelectric stack 270. Other layouts or means of electrical connections could be used.

With reference to FIG. 10, the present disclosure also relates to a haptic button operation using computer hardware and software separate from the device controller 51, e.g. system on chip (SOC), provided in the electronic device 202 by utilizing the computer processor controller 41 comprising a main piezoelectric driver chip 50 and a micro-controller unit (MCU) companion 52, along with the button 203.

The button 203, 203' aims to replace the conventional phone buttons by providing the same features with less buttons or by providing additional features with the same number of buttons. Mechanical buttons 203 are electrical switches connected to the device controller 51. The buttons 203 are electrically wired to be operational even when the electronic device 202 is turned off or frozen. Typically, electronic devices 202 have between three and four mechanical buttons, such the power key, the volume up key, the volume down key and customizable key. Over the fundamental functions, some critical key combinations are used for unfreezing the system 201 or setting the system 201 in bootloader mode. These features are critical and are generated by the user when the electronic device 202 is down or frozen for the device health management purpose.

Another requirement that is desirable, is the capability to turn on the electronic device 202 after a long period of time, e.g. in a box between the manufacturing line and the end customer purchase. The battery 53 should remain in an acceptable range of charge to operate the electronic device 202, and provide the user with an immediate start up, which means the MCU 52 should spend a very small amount of energy and stay operational.

An object of the present disclosure is to provide the system architecture necessary for supporting the device health management using a haptic button solution with a MCU 52. The system architecture covers the software stored on non-transitory memory and the MCU 52 for use with the button 203.

The MCU 52 emulates the state of the button 203 via a general purpose input/output (GPIO) 54 between the device controller 51 and the main piezoelectric driver chip 50. When the voltage of the GPIO 54 corresponds to the input voltage VDDIO from the voltage regulator 55, the button 203 is released and when the voltage corresponds to the ground, the button 203 is pressed. The MCU 52 adapts the sensing strategy according to the state of the electronic device 202. The MCU 52 sleeps when the electronic device 202 is off, and is awakened when the electronic device 202 is on. The electronic device 202 can be powered on or unfrozen because the MCU 52 is configured to send a voltage on the GPIO 54.

The push button system 201 may include a pivoting button 203 and a conventional power button. The sensing solution for the pivoting button 203 comprises the first and second independent sensors 229*a* and 229*b* beneath the button 203 and one piezoelectric element 221. On the other hand, the conventional power button may have only one piezoelectric element and no other force sensor.

When the electronic device 202 is powered up, the sensing for the pivoting button 203 is provided by the first and second sensors 229*a* and 229*b*, e.g. the first and second electrical signals 43*a* and 43*b* from the first and second sensors 229*a* and 229*b*, respectively, are polled or fetched by the MCU 52. The haptic click feedback is generated by the piezoelectric element 221 coupled to the pivoting button 203. The power button is emulated by the sensing from the computer processor controller 41 directly contrary to the pivoting button architecture.

When the electronic device 202 is powered down, the first and second sensors 229*a* and 229*b* are deactivated until a small amount of pressure, e.g. 100 mN to 500 mN, preferably 200 mN to 400 mN, is detected on the piezoelectric element 221. The small amount of pressure reading may be performed by a zero-power sensing (ZPS) feature of the main piezoelectric driver chip 50. The main piezoelectric driver chip 50 detects the small amount of pressure and grounds the GPIO 54 between the MCU 52 and main piezoelectric driver chip 50. The GPIO 54 is grounded after the MCU 52 decides to generate a press. The MCU 52 first needs to wake up on this initial pressure signal and wait for the right amount of force for a full press to be detected. This signal wakes up the MCU 52, which wakes up the sensing function of the first and second sensors 229*a* and 229*b*. The MCU 52 can then discriminate which key of the pivoting button 203 is pressed between the volume up and down. For the specific case of the power button, the sensing remains performed by the main piezoelectric driver chip 50 entirely. Accordingly, the light force pressure detection is performed by main piezoelectric driver chip 50; however, the decision to fire the haptic in case of an actual force application detection is performed by the MCU 52.

The foregoing description of one or more example embodiments has been presented for the purposes of illustration and description. It is not intended to be exhaustive or to limit the invention to the precise form disclosed. Many modifications and variations are possible in light of the above teaching. It is intended that the scope of the disclosure be limited not by this detailed description.

We claim:

1. A push button system for an electronic device comprising:

a piezoelectric assembly comprising:

a piezoelectric element configured to produce a haptic response when an electric haptic activation signal is applied thereto;

a support substrate configured for supporting the piezoelectric element, the support substrate and the piezoelectric element forming a composite beam, including a transverse central axis, the composite beam mounted in a cavity in an outer frame of the electronic device;

a first sensor configured for measuring a first force or strain on one side of the transverse central axis in response to a force application by a user, and for generating a first electrical response signal in response thereto; and a second sensor for measuring a second force or strain on an opposite side of the transverse central axis in response to the force application, and for generating a second electrical response signal in response thereto;

a button configured to pivot and reciprocate in the outer frame of the electronic device, the button including:

a lateral central axis:

a first pedestal extending from a lower surface on one side of the lateral central lateral axis for contacting the piezoelectric assembly; and a second pedestal extending from the lower surface on an opposite side of the lateral central lateral axis for contacting the piezoelectric assembly;

a controller; and memory for storing computer software, which when executed by the controller utilizes the first electrical response signal and the second electrical response signal to determine a location of the force application by the user on the button.

2. The push button system according to claim 1, wherein the piezoelectric assembly further comprises a flexible printed circuit board mounted on the support substrate, the flexible printed circuit board configured for transmitting electrical signals between the controller and the first and second sensors.

3. The push button system according to claim 1, wherein the support substrate comprises a printed circuit board further configured for transmitting electrical signals between the controller and the first sensor and the second sensor.

4. The push button system according to claim 1, further comprising a hard stop mounted in the cavity and below the piezoelectric assembly with a gap therebetween, the hard stop configured for contacting the piezoelectric assembly when the piezoelectric assembly bends beyond the gap.

5. The push button system according to claim 1, wherein when the first force or strain is greater than the second force or strain, the controller is configured to determine that the location of the force application is at an end of the button which is closest to the first sensor.

6. The push button system according to claim 1, when the first force or strain is substantially equal to the second force or strain, the controller is configured to determine that the location of the force application was at a middle of the button.

7. The push button system according to claim 1, wherein when the first sensor measures a first force or strain that decreases over time, while the second sensor measures a second force or strain that increases over a same time, the controller is configured to determine that a swipe motion has been initiated.

8. The push button system according to claim 7, wherein in response to the swipe motion the controller is configured to generate a predetermined response selected from the haptic response, an up or down, and a scrolling.

9. The push button system according to claim 1, wherein when the electronic device is powered down, the controller is configured to deactivate the first sensor and the second sensor, and wherein when a small force is detected on the piezoelectric assembly the controller is configured to activate the first sensor and the second sensor.

10. The push button system according to claim 1, wherein the first pedestal is positioned at an opposite end of the piezoelectric assembly than the second pedestal.

11. The push button system according to claim 10, further comprising a mount for supporting the piezoelectric assembly in the electronic device, the mount is positioned proximate a middle of the piezoelectric assembly configured for cantilevering the piezoelectric assembly at the opposite ends thereof.

12. The push button system according to claim 11, wherein the piezoelectric element comprises a first piezoelectric section on one side of the mount; a second piezoelectric section on an opposite side of the mount separate from the first piezoelectric section; and a central bracket supported over the mount with the first piezoelectric section and the second piezoelectric section extending therefrom.

13. The push button system according to claim 1, further comprising a preload force applicator comprising a resilient element extending between a first support on the electronic device, and a second support on the button, the preload force applicator configured to bias the button into contact with the piezoelectric assembly.

14. The push button system according to claim 1, wherein the piezoelectric element comprises a multi-layer stack, comprising:

a sensing piezoelectric-material layer configured as the first sensor for generating the first electric response signal and as the second sensor for generating the second electrical response signal;

one or more haptic piezoelectric-material layers configured for receiving the electric haptic activation signal;

a first contact mounted on one side of the sensing piezoelectric-material layer configured for transmitting the first electrical response signal; and a second contact mounted on an opposite side of the sensing piezoelectric-material layer configured for transmitting the second electrical response signal.

15. The push button system according to claim 14, wherein the multi-layer stack further comprises a plurality of ground electrode layers, and a plurality of positive electrode layers; wherein one of the plurality of ground electrode layers and one of the plurality of positive electrode layers are positioned on opposite sides of the one or more haptic piezoelectric-material layers.

16. The push button system according to claim 1, wherein the first pedestal is positioned beyond an end of the piezoelectric element between the end of the piezoelectric element and the first sensor.

17. The push button system according to claim 1, wherein the first pedestal is positioned substantially a halfway between the central lateral axis and a first end of the piezoelectric element; and wherein the second pedestal is positioned substantially a halfway between the central lateral axis and a second end of the piezoelectric element.

18. The push button system according to claim 1, further comprising clamps for clamping ends of the piezoelectric assembly configured to frictionally fit into recesses formed in the outer frame of the electronic device.

19. A push button system for an electronic device comprising:

a piezoelectric assembly comprising:

a piezoelectric element configured to produce a haptic response when an electric haptic activation signal is applied thereto;

a support substrate configured for supporting the piezoelectric element the support substrate and the piezoelectric element forming a composite beam, the composite beam including a transverse central axis and mounted in a cavity in an outer frame of the electronic device;

a first sensor configured for measuring a first force or strain on one side of the transverse central axis in response to a force application by a user, and for generating a first electrical response signal in response thereto; and a second sensor for measuring a second force or strain on an opposite side of the transverse central axis in response to the force application, and for generating a second electrical response signal in response thereto;

a button configured to pivot and reciprocate in the outer frame of the electronic device, wherein a lower surface of the button is arcuate for contacting the piezoelectric element along a line of contact;

a controller; and memory for storing computer software, which when executed by the controller utilizes the first electrical response signal and the second electrical response signal to determine a location of the force application by the user on the button.

20. The push button system according to claim 19, wherein the lower surface of the button has a radius of curvature of between 200 mm and 500 mm.

* * * * *